(12) United States Patent
Mirkin et al.

(10) Patent No.: US 7,291,284 B2
(45) Date of Patent: *Nov. 6, 2007

(54) FABRICATION OF SUB-50 NM SOLID-STATE NANOSTRUCTURES BASED ON NANOLITHOGRAPHY

(75) Inventors: Chad A. Mirkin, Wilmette, IL (US); Hua Zhang, Evanston, IL (US); Dana Weinberger, San Diego, CA (US); Seunghun Hong, Seoul (KR)

(73) Assignee: Northwestern University, Evanston, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/725,939

(22) Filed: Dec. 3, 2003

(65) Prior Publication Data

US 2006/0014001 A1    Jan. 19, 2006

Related U.S. Application Data

(63) Continuation-in-part of application No. 09/866,533, filed on May 24, 2001, now Pat. No. 6,827,979.

(60) Provisional application No. 60/430,349, filed on Dec. 3, 2002, provisional application No. 60/207,713, filed on May 26, 2000.

(51) Int. Cl.
*B44C 1/22* (2006.01)
*C03C 15/00* (2006.01)
*C03C 25/68* (2006.01)
*C23F 1/00* (2006.01)

(52) U.S. Cl. .................................................. 216/41

(58) Field of Classification Search .................. 216/41; 427/256
See application file for complete search history.

(56) References Cited

U.S. PATENT DOCUMENTS 5,618,760 A * 4/1997 Soh et al. ................... 438/703

5,772,905 A * 6/1998 Chou .......................... 216/44

OTHER PUBLICATIONS

IBM technical Disclosure Bulletin, IBM TDB NN9612235 "Fabrication of Gold Nanostructures by Lithography with Self-Assembled Monolayers." vol. 39, No. 12, pp. 235-238, Dec. 1, 1996.*
Agarwal, G., et al, "Dip Pen Nanolithography in Tapping Mode", J. Am. Chem. Soc. vol. 125, pp. 7408-7412 (2003).

(Continued)

*Primary Examiner*—Roberts Culbert
(74) *Attorney, Agent, or Firm*—Foley & Lardner LLP

(57) ABSTRACT

Combination of nanolithography and wet chemical etching including the fabrication of nanoarrays of sub-50 nm gold dots and line structures with deliberately designed approximately 12-100 nm gaps. These structures were made by initially using direct write nanolithography to pattern the etch resist, 16-mercaptohexadecanoic acid (MHA), on Au/Ti/SiO$_x$/Si substrates and then wet chemical etching to remove the exposed gold. These are the smallest Au structures prepared by a wet chemical etching strategy. Also, Dip-Pen Nanolithography (DPN) has been used to generate resist layers on Au, Ag, and Pd that when combined with wet chemical etching can lead to nanostructures with deliberately designed shapes and sizes. Monolayers of mercaptohexadecanoic acid (MHA) or octadecanethiol (ODT), patterned by DPN, were explored as etch resists. They work comparably well on Au and Ag, but ODT is the superior material for Pd. MHA seems to attract the FeCl$_3$ etchant and results in nonuniform etching of the underlying Pd substrate. Dots, lines, triangles and circles, ranging in size from sub-100 to several hundred nm have been fabricated on these substrates. These results show how one can use DPN as an alternative to more complex and costly procedures like electron beam lithography to generate nanostructures from inorganic materials.

66 Claims, 26 Drawing Sheets

OTHER PUBLICATIONS

Agarwal, G., et al, "Immobilization of Histidine-Tagged Proteins on Nickel by Electrochemical Dip Pen Nanolithography", J. Am. Chem. Soc. vol. 125, pp. 580-583 (2003).

Albrecht, M., et al., "Recording performance of high-density patterned perpendicular magnetic media", Appl. Phys. Lett., vol. 18, No. 15, p. 2875 (2002).

Ali, M. B., et al., "Atomic Force Microscope Tip Nanoprinting of Gold Nanoclusters", Langmuir, vol. 18 pp. 872-876 (2002).

Behl, M., et al., "Towards Plastic Electronics: Patterning Semiconducting Polymers by Nanoimprint Lithography", Adv. Mater, vol. 14, No. 8, p. 588 (2002).

Bogozi, A., et al., "Molecular Adsorption onto Metallic Quantum Wires", J. Am. Chem. Soc., vol. 123, pp. 4585-4590 (2001).

Bogunia-Kubik, K., "From molecular biology to nanotechnology and nanomedicine", BioSystems, vol. 65, pp. 123-138 (2002).

Braun, E., et al., "DNA-templated assembly and electrode attachment of a conducting silver wire", NATURE, vol. 391, p. 775 (1998).

Cao, Y., et al., "DNA-Modified Core-Shell Ag/Au Nanoparticles, J. Am. Chem. Soc.", vol. 123, pp. 7961-7962 (2001).

Cao, Y., et al., "Nanoparticles with Raman Spectroscopic Fingerprints for DNA and RNA Detection", Science, vol. 297, pp. 1536 (2002).

Carvalho, A., et al., "Self-Assembled Monolayers of Eicosanethiol on Palladium and Their Use in Microcontact Printing", Langmuir, vol. 18, pp. 2406-2412 (2002).

Chen, J., et al., "Large On-Off Ratios and Negative Differential Resistance in a Molecular Electronic Device", Science, vol. 286, p. 1550 (1999).

Cheung, C., et al., "Fabrication of Assembled Virus Nanostructures on Templates of Chemoselective Linkers Formed by Scanning Probe Nanolithography", J. Am. Chem. Soc., vol. 125, pp. 6848-6849 (2003).

Demers, L. M., et al., "Direct Patterning of Modified Oligonucleotides on Metals and Insulators by Dip-Pen Nanolithography", Science, vol. 296, pp. 1836-1838, (2002).

Demers, L. M., et al., Orthogonal Assembly of Nanoparticles Building Blocks on Dip-Pen Nanolithographically Generated Templates of DNA, Angew. Chem. Int. Ed., vol. 40, p. 3071 (2001).

Dominguez-Quintero, O., et al., "Silica-supported palladium nanoparticles show remarkable hydrogenation catalytic activity", J. Molecular Catalysis A: Chemical, vol. 197, pp. 185-191 (2003).

Donhauser., Z. J., et al., "Conductance Switching in Single Molecules Through Conformational Changes", Science, vol. 292, p. 2303 (2001).

Elghanian, R., et al., "Selective Colorimetric Detection of Polynucleotides Based on the Distance-Dependent Optical Properties of Gold Nanoparticles", Science, vol. 277, p. 1078 (1997).

Félidj, N., et al., "Controlling the optical response of regular arrays of gold particles for surface-enhanced Raman scattering", Phys. Rev. B, vol. 65, p. 075419-1 (2002).

Gearheart, L. A., et al., "Oligonucleotide Adsorption to Gold Nanoparticles: A Surface-Enhanced Raman Spectroscopy Study of Intrinsically Bent DNA", J. Phys. Chem. B, vol. 105, pp. 12609-12615 (2001).

Geissler, M., et al., "Defect-Tolerant and Directional Wet-Etch Systems for Using Monolayers as Resists", Langmuir, vol. 18, pp. 2374-2377 (2002).

Gillen, G., et al., "Molecular Imaging Secondary Ion Mass Spectrometry for the Characterization of Patterned Self-Assembled Monolayers on Silver and Gold", Anal. Chem., vol. 66, pp. 2170-2174 (1994).

Haes, A. J., et al., "ANanoscale Optical Biosensor: Sensitivity and Selectivity of an Approach Based on the Localized Surface Plasmon Resonance Spectroscopy of Triangular Silver Nanoparticles", J. Am. Chem. Soc., vol. 124, pp. 10596-10604 (2002).

Haynes, C. L., et al., "Nanosphere Lithography: A Versatile Nanofabrication Tool for Studies of Size-Dependent Nanoparticle Optics", J. Phys. Chem. B, vol. 105, pp. 5599-5611 (2001).

He., H. X., et al., "Electrochemical Fabrication of atomically thin metallic wire and electrodes separated with molecular-scale gaps", J. of Elec. Chem., vol. 522 p. 167-172 (2002).

He., H. X., et al., "Fabrication of Designed Architectures of Au Nanoparticles on Solid Substrate with Printed Self-Assembled Monolayers as Templates", Langmuir, vol. 16, pp. 3846-3851 (2000).

He, H. et al., "A Conducting Polymer Nanojunction Switch", J. Am. Chem. Soc., vol. 123, pp. 7730-7731 (2001).

Herne, T. M. et al., "Characterization of DNA Probes Immobilized on Gold Surfaces", J. Am. Chem. Soc., vol. 119, pp. 8916-8920 (1997).

Hong, S. et al., "A Nanoplotter with Both Parallel and Serial Writing Capabilities", Science, vol. 288, p. 1808 (2000).

Hong, S. et al., "Multiple Ink Nanolithography Toward a Multiple-Pen Nano-Plotter", Science, vol. 286, p. 523 (1999).

Hong, S. et al., "A New Tool for Studying the in Situ Growth Processes for Self-Assembled Monolayers under Ambient Conditions", Langmuir, vol. 15, p. 7897-7900 (1999).

Huang., J., et al., "Photopatterning of Self-Assembled Alkanethiolate Monolayers on Gold: A Simple Monolayer Photoresist Utilizing Aqueous Chemistry", Langmuir, vol. 10, pp. 626-628 (1994).

Huang., J., et al., "Photooxidation of Thiols in Self-Assembled Monolayers on Gold", J. Am. Chem. Soc., vol. 115, pp. 3342-3343 (1993).

Hutt, D. A., "Influence of Adsorbate Ordering on Rates of UV Photooxidation of Self-Assembled Monolayers", J. Phys. Chem., vol. 100, pp. 6657-6662 (1996).

Ivanisevic, A. et al., "Site-Directed Exchange Studies with Combinatorial Libraries of Nanostructures", J. Am. Chem. Soc., vol. 124, p. 11997-12001 (2002).

Janes, D. B., et al., "Self-Assembled Metal/Molecule/Semiconductor Nanostructures for Electronic Device and Contact Applications", Journal of Electronic Materials, vol. 29, No. 5, p. 565 (2000).

Jin, R., et al., "Photoinduced Conversion of Silver Nanospheres to Nanoprisms", Science, vol. 294, p. 1901 (2001).

Jung, H., et al., "Dip-Pen Nanolithography of Reactive Alkoxysilanes on Glass", J. Am. Chem., vol. 125, pp. 12096-12097 (2003).

Krenn, J. R., et al., "Squeezing the Optical Near-Field Zone by Plasmon Coupling of Metallic Nanoparticles", Phys. Rev. Lett., vol. 82, No. 12, p. 2590 (1999).

Kumar, A.,. et al, Patterning Self-Assembled Monolayers: Applications in Materials Science, Langmuir, vol. 10, pp. 1498-1511 (1994).

Laibinis, P., et al., "ω-Terminated Alkanethiolate Monolayers on Surfaces of Cooper, Silver, and Gold Have Similar Wettabilities", J. Am. Chem. Soc., vol. 116, pp. 1990-1995 (1992).

Laibinis, P., et al., "Comparison of the Structures and Wetting Properties of Self-Assembled Monolayers of n-Alkanethiols on the Coinage Metal Surfaces, Cu, Ag, Au", J. Am. Chem. Soc., vol. 113, pp. 7152-7167 (1991).

Lee, K., et al., "Protein Nanostructures Formed via Direct-Write Dip-Pen Nanolithography", J. Am. Chem. Soc., vol. 125, pp. 5588-5589 (2003).

Lee, K., et al., "Protein Nanoarrays Generated by Dip-Pen Nanolithography", Science, vol. 295, p. 1702 (2002).

Li, X., et al., "Sulfonic Acid-Functionalized Gold Nanoparticles: A Colloid-Bound Catalyst for Soft Lithographic Application on Self-Assembled Monolayers", J. Am. Chem. Soc., vol. 125, p. 4279-4284 (2003).

Li, Y., et al., "Electrochemical AFM 'Dip-Pen' Nanolithography", J. Am. Chem. Soc., vol. 123, p. 2105-2106 (2001).

Li, Z., et al., "Multiple thiol-anchor capped DNA-gold nanoparticles conjugates", Nucleic Acids Research, vol. 30, No. 7, pp. 1558-1562 (2002).

Lim and Mirkin, "Electrostatically Driven Dip-Pen nanolithography of Conducting Polymers", Adv. Mater. vol. 4, No. 20, pp. 1474-1477 (Oct. 16, 2002).

Lim, J., et al., "Direct-Write Dip-Pen Nanolithography of Proteins on Modified Silicon Oxide Surfaces", Angew. Chem. Int. Ed., vol. 42, pp. 2309-2312 (2003).

Liu, G., et al., "Nanofabrication of Self-Assembled Monolayers Using Scanning Probe Lithography", Acc. Chem. Res. vol. 33, pp. 457-468 (2000).

Love, J. C., et al., "Self-Assembled Monolayers of Alkanethiolates on Palladium Are Good Etch Resists", J. Am. Chem. Soc., vol. 124, No. 8, p. 1576 (2002).

Love, J. C., et al., "Formation and Structure of Self-Assembled Monolayers of Alkanethiolates of Palladium", J. Am. Chem. Soc., vol. 125, pp. 2597-2609 (2003).

Malinsky, M. D., et al., "Chain Length Dependence and Sensing Capabilities of the Localized Surface Plasmon Resonance of Silver Nanoparticles Chemically Modified with Alkanethiol Self-Assembled Monolayers", J. Am. Chem. Soc., vol. 123, pp. 1471-1482 (2001).

Maynor, B. W., et al., "Direct-Writing of Polymer Nanostructures: Poly(thiophene) Nanowires on Semiconducting and Insulating Surfaces", J. Am. Chem. Soc., vol. 124, No. 4, p. 522 (2002).

Maynor, B. W., et al., "Au 'Ink' for AFM 'Dip-Pen' Nanolithography", *Langmuir*, vol. 17, pp. 2575-2578 (2001).

McKendry, R., et al., "Creating Nanoscale Pattersons of Dendrimers on Silicon Surfaces with Dip-Pen Nanolithography", Nano Lett., vol. 2, No. 7, pp. 713-716 (2002).

Mirkin, C. A., et al., "A DNA-based method for rationally assembling nanoparticles into macroscopic materials", *Nature*, vol. 382, p. 607 (1996).

Morpurgo, A. F., et al., "Controlled fabrication of metallic electrodes with atomic separation", Appl. Phys. Lett., vol. 74, No. 14, p. 2084 (1999).

Müller, W. T., et al., "A Strategy for the Chemical Synthesis of Nanostructures", *Science*, vol. 268, p. 272 (1995).

Nam, J., et al., "Bio-Barcodes Based on Oligonuleotide-Modified Nanoparticles", J. Am. Chem. Soc., vol. 124, pp. 3820-3821 (2002).

Noy, A. et al., "Fabrication of Luminescent Nanostructures and Polymer Nanowires Using Dip-Pen Naolithography", *Nano Lett.*, vol. 2, p. 109-112 (2002).

Park, S., et al., "Array-Based Electrical Detection of DNA with Nanoparticle Probes", *Science*, vol. 295, p. 1503 (2002).

Pena, D. J., et al., "'Dip-Pen' Nanolithography in Registry with Photolithography for Biosensor Development", *Langmuir*, vol. 19, pp. 9028-9032 (2003).

Piner, R. D., et al., "'Dip-Pen' Nanolithography", *Science*, vol. 283, p. 661 (1999).

Porter, L. A., et al., "Electroless Nanoparticle Film Deposition Compatible with Photolithography, Microcontact Printing, and Dip-Pen Nanolithography Patterning Technologies", Nano Lett., vol. 2, No. 12, p. 1369-1372 (2002).

Sárkány, A., et al., "Some Feasures of acetylene and 1,3-butadiene hydrogenation on Ag/SiO$_2$ and Ag/TiO$_2$ catalysts", Applied Catalysis A: General, vol. 243, pp. 347-355 (2003).

Service, R. F., "Biology Offers Nanotechs A Helping Hand", *Science*, vol. 298, pp. 2322 (2002).

Storhoff, J. J., et al., "One-Pot Colorimetric Differentation of Polynucleotides with Single Base Imperfections Using Gold Nanoparticles Probes", J. Am. Chem. Soc., vol. 120, pp. 1959-1964 (1998).

Su, M., et al., "Moving beyond Molecules: Patterning Solid-State Features via Dip-Pen Nanolithography with Sol-Based Inks", J. Am. Chem. Soc., vol. 124, No. p. 1560 (2002).

Tarlow, M. J., et al., "UV Photopatterning o fAlkanethiolate Monolayers Self-Assembled on Gold and Silver", J. Am. Chem. Soc., vol. 115, p. 5305 (1993).

Taton, T. A., et al., "Scanometric DNA Array Detection with Nanoparticle Probes", *Science*, vol. 289, p. 1757 (2000).

Vezenov, D. V., et al., "Force Titrations and Ionization State Sensitive Imaging of Functional Groups in Aqueous Solutions by Chemical Force Microscopy", J. Am. Chem. Soc., vol. 119, pp. 2006-2015 (1997).

Wadu-Mesthrige, K., et al., "Immobilization of Proteins on Self-Assembled Monolayers", Scanning, vol. 22, pp. 38-388 (2000).

Wadu-Mesthrige, K., et al., "Fabrication of Nanometer-Sized Protein Patterns Using Atomic Force Microscopy and Selective Immobilization", Biophysical Journal, vol. 80, pp. 1891-1899 (2001).

Wallraff, G. M., et al., "Lithographic Imaging Techniques for the Formation of Nanoscopic Features", Chem. Rev. vol. 99, pp. 1801-1821 (1999).

Wang, X., et al., "Scanning Probe Contact Printing", *Langmuir*, vol. 19, pp. 8951-8955 (2003).

Weinberger, D. A. et al., "Combinatorial Generation and Analysis of Nanometer- and Micrometer-Scale Silicon Features via 'Dip-Pen' Nanolithography and Wet Chemical Etching", *Adv. Mater.*, vol. 12, p. 1600 (2000).

Wilson, D. L., et al., "Surface organization and nanopatterning of collagen by dip-pen nanolithography", PNAS, vol. 98, No. 24, pp. 13660-13664 (2001).

Wolfe, D. B., et al., "Fabrication of palladium-based microelectronic devices by microcontact printing", Appl. Phys. Lett., vol. 80, No. 12, p. 2222 (2002).

Xia, Y., et al., "Unconventional Methods for Fabricating and Patterning Nanostructures", Chem. Rev., vol. 99, pp. 1823-1848 (1999).

Xia, Y., et al., "Soft Lithography", Agnew. Chem. Int. Ed., vol. 37, pp. 550-575 (1998).

Xia, Y., et al., "One-Dimensional Nanostructures: Synthesis, Characterization, and Applications", Adv. Mater., vol. 15, No. 5, p. 353 (2003).

Xia, Y., et al., "A Selective Etching Solution for Use with Patterned Self-Assembled Monolayers of Alkanethiolates on Gold", Chem. Mater., vol. 7, pp. 2332-2337 (1995).

Yeung, L. K., et al., "Heck Heterocoupling within a Dendritic Nanoreactor", Nano. Lett., vol. 1, No. 1, pp. 14-17 (2001).

Zhang, H., et al., "Fabrication of Sub-50-nm Solid-State Nanostructures on the Basis of Dip-Pen Nanolithography", Nano Lett., vol. 3, No. 1, pp. 43-45 (2003).

Zhang, H., et al., "Dip-Pen Nanolithography-Based Methodology for Preparing Arrays of Nanostructures Functionalized with Oligonucleotides", Adv. Mater., vol. 14, No. 20, p. 1472 (2002).

Zhang, Y., et al., "Electrochemical Whittling of Organic Nanostructures", Nano Lett., vol. 2, No. 12, pp. 1389-1392 (2002).

* cited by examiner

[Supporting Information]

Fabrication of sub-50 nm Solid-State Nanostructures Based on Dip-Pen Nanolithography a = 3'-HO-C$_3$H$_6$-S-S-C$_3$H$_6$-A$_{20}$CTCCCTAATAACAAT-5'
a'b' = 5'-GAGGGATTATTGTTAAATATTGATAAGGAT-3'
b = 3'-TTATAACTATTCCTAA$_{20}$-C$_6$H$_{12}$SH-5'

(A)

SEQUENCE LISTING

<160> NUMBER OF SEQ ID NOS: 4

<210> SEQ ID NO 1
<211> LENGTH: 35
<212> TYPE: DNA
<213> ORGANISM: Artificial Sequence
<220> FEATURE:
<223> OTHER INFORMATION: Description of Artificial Sequence: Synthetic
      oligonucleotide -continued

```
<400> SEQUENCE: 1
taacaataat ccctcaaaaa aaaaaaaaaa aaaaa                              35

<210> SEQ ID NO 2
<211> LENGTH: 30
<212> TYPE: DNA
<213> ORGANISM: Artificial Sequence
<220> FEATURE:
<223> OTHER INFORMATION: Description of Artificial Sequence: Synthetic
      oligonucleotide

<400> SEQUENCE: 2
gagggattat tgttaaatat tgataaggat                                    30

<210> SEQ ID NO 3
<211> LENGTH: 35
<212> TYPE: DNA
<213> ORGANISM: Artificial Sequence
<220> FEATURE:
<223> OTHER INFORMATION: Description of Artificial Sequence: Synthetic
      oligonucleotide

<400> SEQUENCE: 3
aaaaaaaaaa aaaaaaaaaa atccttatca atatt                              35

<210> SEQ ID NO 4
<211> LENGTH: 15
<212> TYPE: DNA
<213> ORGANISM: Artificial Sequence
<220> FEATURE:
<223> OTHER INFORMATION: Description of Artificial Sequence: Synthetic
      oligonucleotide

<400> SEQUENCE: 4
aatattgata aggat                                                    15
```

FABRICATION OF SUB-50 NM SOLID-STATE NANOSTRUCTURES BASED ON NANOLITHOGRAPHY

DESCRIPTION OF RELATED APPLICATIONS

This application claims benefit of provisional application 60/430,349 to Zhang et al. filed Dec. 3, 2002 ("Fabrication of Sub-50 nm Solid State Nanostructures Based on Nanolithography"), which is hereby incorporated by reference in its entirety. This application also is a continuation-in-part of U.S. application Ser. No. 09/866,533 filed May 24, 2001 now U.S. Pat. No. 6,827,979 to Mirkin et al, which is hereby incorporated by reference in its entirety, and which claims priority to provisional application No. 60/207,713 filed May 26, 2000, all of which are incorporated by reference in their entirety.

STATEMENT OF GOVERNMENT SUPPORT

This work was supported by the Federal Government under Grant No. F49620-00-1-0283/PO1 from the Air Force Office of Scientific Research; DAAD 19-00-1-0414 from DARPA; and EEC-0118025 from the National Science Foundation. The government may have certain rights in the invention.

INTRODUCTION

Nanolithography continues to grow in commercial importance including nanolithography of the direct-write type wherein a pattern can be generated from non-patterned materials and is not merely replicated from a preexisting pattern. A need exists, moreover, to combine the advantageous, commercial features of direct-write nanolithography with chemical etch methods, another important fabrication method. The resulting combination can result in powerful new fabrication methods for use in molecular manufacturing, including integrated circuits, molecular electronics, sensors, and biotechnology applications.

Moreover, it is important for the nanolithography to be simple to use and avoid cumbersome process procedures such as vacuum, resists, stamps, and expensive equipment. For example, nanoimprint lithography provides for use of a vacuum to reduce air bubbles (see, for example, "Nanoimprint Lithography" by S. Y. Chou et al., *J. Vac. Sci. Technol. B*, 14(6), November/December 1996, pages 4129-4133). See also U.S. Pat. Nos. 5,772,905 and 6,309,580 to Chou et al. for further description of nanoimprint lithography. Moreover, nanoimprint lithography relies on use of a preformed mold with a pattern which is then used to replicate a pattern. Electron beam lithography is done with expensive equipment as well.

U.S. Pat. No. 5,948,470 to Harrison et al. purports to describe nanoscale patterning but describes block copolymer microphase separation systems which are not generally applicable to a wide variety of patterns.

SUMMARY

The invention, comprising a variety of embodiments, is summarized with use of this non-limiting summary section. This invention provides an excellent combination of different fabrication methods including the direct-write fabrication and the chemical etching fabrication. Novel combinations of hard inorganic materials and soft organic materials are enabled by this route with excellent versatility and high resolution. A variety of embodiments are provided including lower resolution and higher resolution embodiments, and embodiments with use of different materials and pattern design.

For example, in one embodiment, the invention provides a method of nanolithography comprising: providing a substrate and a tip; using the tip to apply a patterning compound to the substrate so as to produce a desired pattern which is a chemical etching resist, and chemically etching the substrate.

The present invention provides a method of nanolithography comprising: providing a substrate and a tip; using the tip to apply a patterning compound to the substrate so as to produce a desired pattern which is a chemical etching resist, chemically etching the substrate, wherein the pattern after etching is characterized by features of about 50 nm or less.

The present invention also provides a method of nanolithography comprising: providing a substrate and a tip; using the tip to apply a patterning compound to the substrate so as to produce a desired pattern which is a chemical etching resist, chemically etching the substrate, wherein the pattern after etching is characterized by interfeature gaps of about 100 nm or less.

The present invention also provides a method for direct write nanolithography consisting essentially of: providing a substrate and a computer controlled scanning probe microscope tip; using the tip under computer control to apply a patterning compound to the substrate so as to produce a desired pattern, wherein the patterning compound is a chemical etching resist, chemically etching the substrate, etching away substrate not patterned by the resist, wherein the pattern after etching is characterized by interfeature gaps of about 100 nm or less, or by features of about 50 nm or less.

The present invention also provides for nanostructures, patterned substrates, and other articles produced by the methods described herein. For example, the present invention also provides a nanoarray comprising semiconductor line or pillar features of about 5 nm to about 50 nm and interfeature distances of about 5 nm to about 50 mm. The invention also provides an article comprising a substrate and features with one or more nanogaps of about 20 nm or less.

The present invention, and articles made with use of the methods described herein, can be used in a variety of applications, further described below, including micro and molecular electronics, sensors, biosensors, electrochemical devices, diagnostics, transistors, integrated circuits, microfluidic devices, and the like.

Combinations of additive and subtractive methods as described herein are not commonly employed in the nanolithographic arts, particularly at the ultrahigh resolutions described herein. Moreover, it is unusual to have such a wide array of hard inorganic and soft inorganic materials in one system, particularly at such high resolution.

BRIEF DESCRIPTION OF THE DRAWINGS

FIGS. 2A AFM topography image after treatment of wafer patterned with 4 dots with 2 s deposition time. Pillar height is 55 nm. The identification letter and top diameter (nm) are the following: A, 65; B, 110; C, 75; D, 105. Recorded at a scan rate of 2 Hz. FIG. 2B: The AFM topography image of a pillar on the same chip. Pillar height is 55 nm. Recorded at a scan rate of 1 Hz. FIG. 2C: The cross-sectional trace of the AFM topography image through the pillar diameter.

FIG. 3A: AFM topography image after treatment of wafer patterned with 3 lines of ODT at a rate of 0.4 microns/s. Line height is 55 nm. Recorded at a rate of 0.5 Hz. FIG. 3B: AFM topography image of a line on the same chip. Line height is 55 nm. Recorded at a rate of 0.5 Hz. FIG. 3C: Cross-sectional topography trace of the line.

FIG. 4A: An ODT-coated AFM tip was held in contact with the surface for various times to generate ODT dots of increasing size. Three-dimensional features with a height of 80 nm were yielded after etching. The identification letter, time of ODT deposition (s), estimated diameter of ODT dot (nm), top diameter after etching (nm), and base diameter after etching (nm) are the following: A, 0.02, 90, 147, 514; B, 0.125, 140, 176, 535; C, 0.25, 195, 253, 491; D, 0.5, 275, 314, 780; E, 1, 390, 403, 892; F, 2, 555, 517, 982; G, 4, 780, 770, 1120; H, 8, 1110, 1010, 1430; I, 16, 1565, 1470, 1910. FIG. 4B: SEM of same pillars. FIG. 4C: Top diameter plotted as a function of ODT deposition time.

FIG. 5A: The AFM topography image of lines on the same chip as FIG. 15. An ODT-coated AFM tip was used to generate lines on the surface with various speeds to generate various sized ODT lines. The shown three-dimensional features with a height of 80 nm were yielded after etching. The identification letter, speed of ODT deposition (microns/s), top line width after etching (nm), and base width are the following: A, 2.8, 45, 45, 213; B, 50, 2.4, 70, 402; C, 60, 2.0, 75, 420; D, 1.6, 75, 90, 430; E, 1.2, 100, 120, 454; F, 150, 0.8, 150, 488; G, 0.4, 300, 255, 628, H, 0.2, 600, 505, 942. FIG. 5B: SEM of the same lines.

DETAILED DESCRIPTION

Part I

Figure 1:
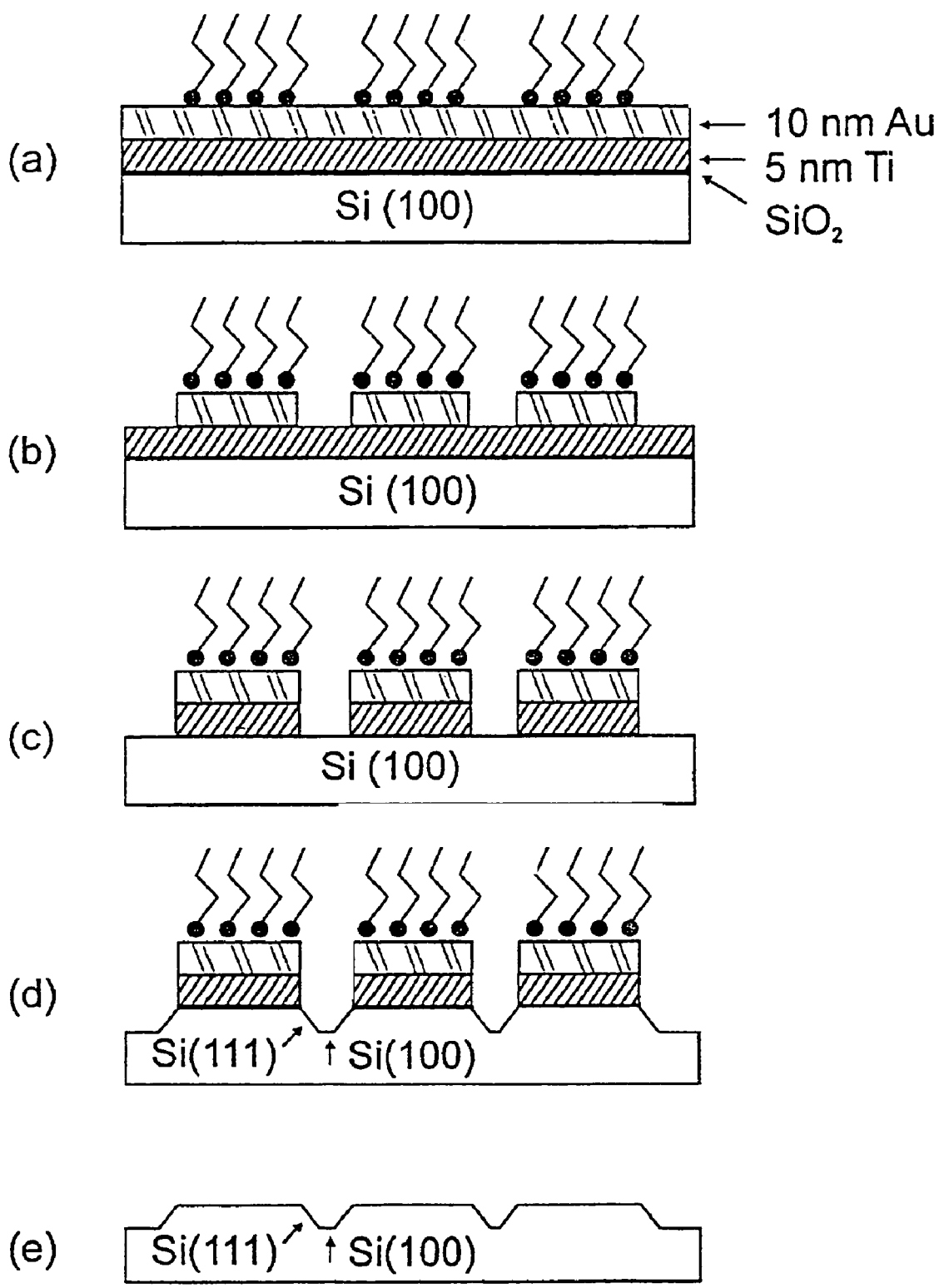
FIG. 1. A schematic representation of the deposition and multi-stage etching procedure used to prepare three-dimensional architectures in Au/Ti/Si substrates. Panel (a): Deposition of ODT onto an Au surface of a multilayer substrate using DPN; Panel (b): selective Au/Ti etching with ferri/ferrocyanide-based etchant; Panel (c): selective Ti/$SiO_2$ etching and Si passivation with HF; Panel (d): selective Si etching with basic etchant and passivation of Si surface with HF; Panel (e): removal of residual Au and metal oxides with aqua regia and passivation of Si surface with HF.

The present invention generally relates to nanolithography and etching, and more particularly, to systems capable of DIP PEN NANOLITHOGRAPHY™ printing (DPN™ printing) and deposition, coupled with etching. DIP PEN NANOLITHOGRAPHY™ and DPN™ are trademarks for NanoInk, Inc., Chicago, Ill.). Part I of this specification describes supporting information for embodiments for wet chemical etching. Part II describes additional embodiments for nanolithography coupled with wet chemical etching. Parts III and IV provide additional embodiments showing powerful resolution and versatilities for the wet chemical methods coupled with direct-write nanolithography. Parts V and VI provide additional embodiments showing further processing steps including use of biomolecules such a proteins, DNA, and oligonucleotide, as well as nanoparticles.

DPN™ printing and deposition methods are extensively described in the following patent applications and patent publications, which are hereby incorporated by reference in their entirety and support the disclosure for the present inventions, particularly with respect to the experimental parameters for carrying out the deposition:

1. U.S. Provisional application 60/115,133 filed Jan. 7, 1999 ("Dip Pen Nanolithography").

2. U.S. Provisional application 60/157,633 filed Oct. 4, 1999 ("Methods Utilizing Scanning Probe Microscope Tips and Products Therefor or Produced Thereby").

3. U.S. Regular patent application Ser. No. 09/477,997 filed Jan. 5, 2000 ("Methods Utilizing Scanning Probe Microscope Tips and Products Therefor or Produced Thereby"), now U.S. Pat. No. 6,635,311 to Mirkin et al. issued Oct. 21, 2003.

4. U.S. Provisional application 60/207,713 filed May 26, 2000 ("Methods Utilizing Scanning Probe Microscope Tips and Products Therefor or Produced Thereby"). This application, for example, describes wet chemical etching, working examples, references, and figures, which are all incorporated by reference in their entirety.

5. U.S. Provisional application 60/207,711 filed May 26, 2000 ("Methods Utilizing Scanning Probe Microscope Tips and Products Therefor or Produced Thereby").

6. U.S. Regular application Ser. No. 09/866,533 filed May 24, 2001 ("Methods Utilizing Scanning Probe Microscope Tips and Products Therefor or Produced Thereby"). This application, for example, describes wet chemical etching, working examples (e.g., example 5), references, and figures, which are all incorporated by reference in their entirety.

7. U.S. patent publication No. 2002/0063212 A1 published May 30, 2002 ("Methods Utilizing Scanning Probe Microscope Tips and Products Therefor or Produced Thereby").

8. U.S. patent publication No. 2002/0122873 A1 published Sep. 5, 2002 ("Nanolithography Methods and Products Produced Therefor and Produced Thereby").

9. PCT publication number WO 00/41213 A1 published Jul. 13, 2000 based on PCT application no. PCT/US00/00319 filed Jan. 7, 2000 ("Methods Utilizing Scanning Probe Microscope Tips and Products Therefor or Produced Thereby").

10. PCT publication number WO 01/91855 A1 published Dec. 6, 2001 based on PCT application no. PCT/US01/17067 filed May 25, 2001 ("Methods Utilizing Scanning Probe Microscope Tips and Products Therefor or Produced Thereby").

11. U.S. Provisional application 60/326,767 filed Oct. 2, 2001, ("Protein Arrays with Nanoscopic Features Generated by Dip-Pen Nanolithography"), now published 2003/0068446 on Apr. 10, 2003 to Mirkin et al.

12. U.S. Provisional application 60/337,598 filed Nov. 30, 2001, ("Patterning of Nucleic Acids by Dip-Pen Nanolithography") and U.S. regular application Ser. No. 10/307,515 filed Dec. 2, 2002 to Mirkin et al.

13. U.S. Provisional application 60/341,614 filed Dec. 17, 2001, ("Patterning of Solid State Features by Dip-Pen Nanolithography"), now published 2003/0162004 Aug. 28, 2003 to Mirkin et al.

14. U.S. Provisional application 60/367,514 filed Mar. 27, 2002, ("Method and Apparatus for Aligning Patterns on a Substrate") and publication No. 2003/0185967 on Oct. 2, 2003 to Eby et al.

15. U.S. Provisional application 60/379,755 filed May 14, 2002, ("Nanolithographic Calibration Methods") and U.S. regular application Ser. No. 10/375,060 filed Feb. 28, 2003 to Cruchon-Dupeyrat et al.

In general, state of the art DPN™ printing and deposition-related products, including hardware, software, and instrumentation are also available from NanoInk, Inc. (Chicago, Ill.), and these can be used to carry out the present invention.

Parallel methods of the DPN printing process can be carried out as described in, for example, U.S. Pat. No. 6,642,129 to Liu et al. issued Nov. 4, 2003.

In addition, the following papers describes wet chemical etching procedures used in conjunction with direct-write nanolithography, and is hereby incorporated by reference in its entirety including figures, references, and working examples: Zhang et al., "Dip-Pen Nanolithography-Based Methodology for Preparing Arrays of Nanostructures Functionalized with Oligonucleotides"; *Adv. Mat.*, 2002, 14, No. 20, October 16, pages 1472-1474; Zhang et al., "Biofunctionalized Nanoarrays of Inorganic Structures Prepared by Dip-Pen Nanolithography"; *Nanotechnology*, 2003, 14, 1113-1117 (see further parts V and VI below).

The text *Fundamentals of Microfabrication, The Science of Minitaturization*, $2^{nd}$ Ed., Marc J. Madou, describes micro and nanotechnologies including additive and substractive methods, for example, lithography (Chapter 1), pattern transfer with dry etching methods (Chapter 2), pattern transfer with additive methods (Chapter 3), and wet bulk micromachining (Chapter 4).

Also, the text *Direct-Write Technologies for Rapid Prototyping Applications: Sensors, Electronics, and Integrated Power Sources* (Eds. A. Pique and D. B. Chrisey), describes micro and nanotechnologies including additive and substractive methods. For example, bulk micromachining and etching are described on pages 617-619. DPN printing on the Sub-100 nanometer length scale is described in Chapter 10.

Self-assembled monolayers, etching, and microfabrication are further described in, for example, U.S. Pat. No. 5,618,760 to Soh et al; U.S. Pat. No. 5,620,850 to Bamdad et al.; and U.S. Pat. No. 5,512,131 to Kumar et al.

Additional references are described throughout the rest of the specification for use in practicing the present invention. No admission is made that any of these references are prior art.

Part II

The combination of direct-write nanolithography and chemical etching, including wet chemical etching, is further described in U.S. patent publication 2002/0063212 to Mirkin et al. (published May 30, 2002) and provisional application Ser. No. 60/207,713 to Mirkin et al, which are each hereby incorporated by reference in their entirety. In particular, the '212 publication describes wet chemical etching methods at paragraphs 95, FIGS. 12-16, Example 5 (paragraphs 173-184), and claims including claim 16. In addition, the following reference further describes the combination of direct-write nanolithography and wet chemical etching and is hereby incorporated by reference in its entirety: Weinberger et al., "Combinatorial Generation and Analysis of Nanometer- and Micrometer-Scale Silicon Features . . . ", *Adv. Mat.*, 2000, 12, No. 21, November 2 (1600-1603).

In the present invention, DPN printing can be used in conjunction with etching, whether wet or dry. In general, wet (chemical) etching techniques are preferred. In particular, a tip such as a nanoscopic tip or an SPM tip can be used to deliver a patterning compound to a substrate of interest in a pattern of interest, all as described above, and the patterning compound functions as an etching resist in one or more subsequent etching procedures. The invention is not limited to wet chemical etching; other types of etching can be used. The patterning compounds can be used to pattern the substrate prior to any etching or after one or more etching steps have been performed to protect areas exposed by the etching step(s). The wet etching procedures and materials used in them are standard and well known in the art. See, e.g., Xia et al., *Angew. Chem. Int. Ed.*, 37 550 (1998); Xia et al., *Chem. Mater.*, 7, 2332 (1995); Kumar et al., *J. Am. Chem. Soc.*, 114, 9188-9189 (1992); Seidel et al., *J. Electrochem. Soc.*, 137, 3612 (1990). Wet etching procedures are used for, e.g., the preparation of three-dimensional architectures on or in substrates (e.g., Si wafers) of interest. See, e.g., Xia et al., *Angew. Chem. Int. Ed.*, 37, 550 (1998); Xia et al., *Chem. Mater.*, 7, 2332 (1995). After etching, the patterning compound may be retained on the substrate or removed from it. Methods of removing the patterning compounds from the substrates are well known in the art (see, e.g., below working examples).

Hence, more particularly, this invention provides a method of nanolithography comprising: providing a substrate, providing a tip such as, for example, a scanning probe microscope tip; coating the tip with a patterning compound; and using the coated tip to apply the compound to the substrate so as to produce a desired pattern, wherein the patterning compound acts as an etching resist, and the method further comprises chemically etching the substrate. Examples of tips, coating methods, patterning compounds, patterns, and experimental conditions can be found, for example, in the references and description of part I as well as additional description in parts III-VI below. Additional treatment can be carried out from the structures prepared by nanolithography and etching. For example, additional layers can be built onto the surfaces including nanoparticulate and biomolecular layers including peptides, proteins, nucleic acids, DNA, RNA, and the like (parts V and VI). For example, these layers can be physically or chemically adsorbed onto the surface in additional process steps.

FIGS. 1-5 are described further below in the working example and illustrate useful embodiments of the invention. For example, as shown in FIG. 1, the chemical etch can comprise a series of chemical etch steps. The substrate can comprise multiple layers. Early steps can remove the top layers of the substrate, and later steps can remove lower layers of the substrate. The layers can be conductive, semiconductive, or insulating layers. The layers can be hard inorganic materials or soft organic materials, or combinations thereof. In preferred embodiments, the layers comprise conductive layer over a semiconductive layer. The semiconductor can be in an undoped or doped form. A variety of semiconductor materials can be used including, for example, II-VI and III-V types. A preferred example is silicon.

The structures shown in FIG. 1 can form a variety of patterns which are not particularly limited. The pillars and lines shown in FIGS. 2-5 are illustrative. Lines can be straight lines or curved lines and can be characterized by a line width.

Figure 2:
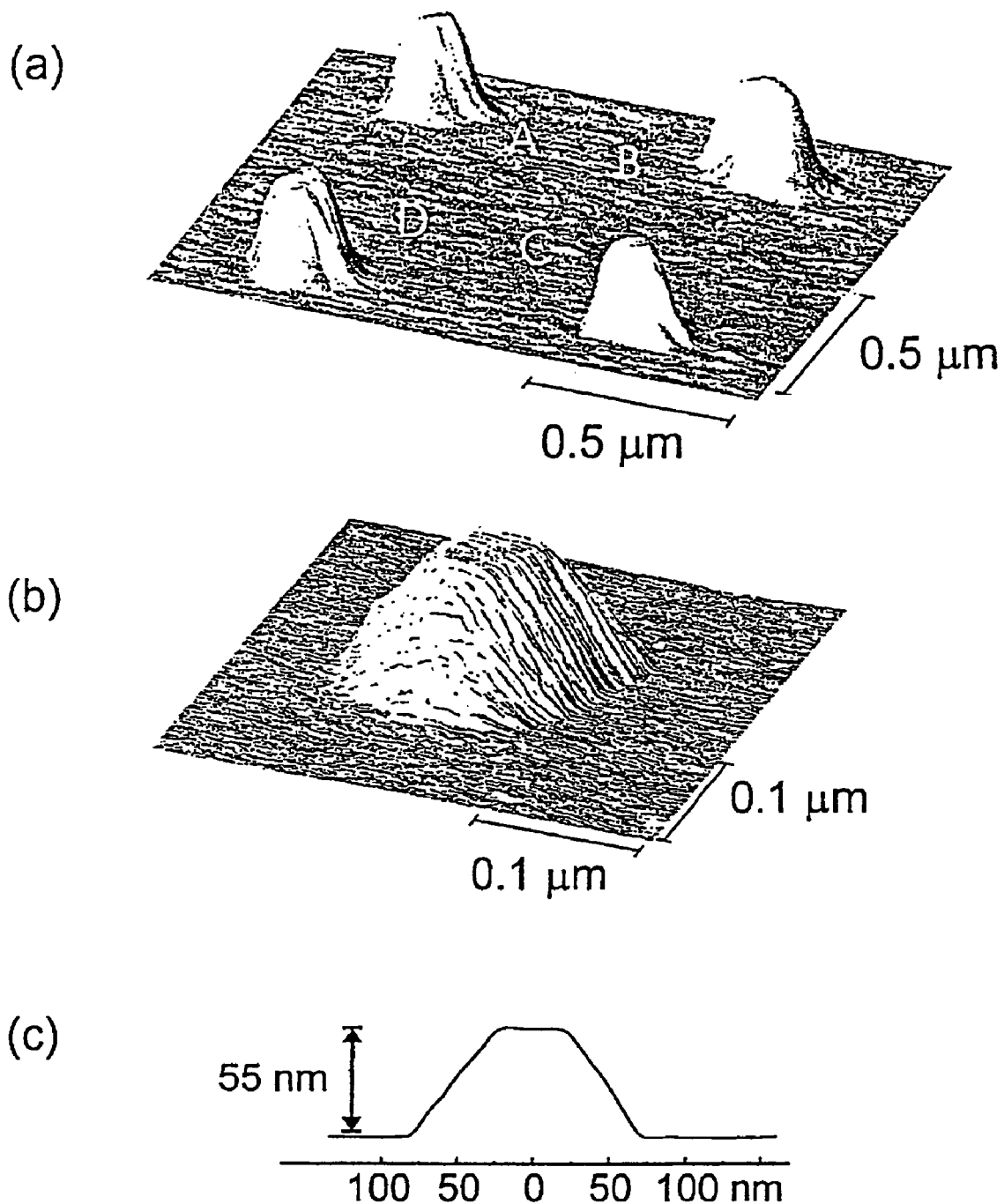
FIG. 2. Nanometer scale pillars prepared according to FIG. 1, Panels a-d.

FIG. 2 illustrates pillars. These pillars can be prepared with use of resists patterned in the form of dots. The pillar height is not particularly limited but can be, for example, about 10 nm to about 100 nm. The top pillar diameter is not particularly limited but can be, for example, about 25 nm to about 5 microns, and more particularly, about 25 nm to about one micron, and more particularly, about 25 nm to about 250 nm, and more particularly, about 50 nm to about 150 nm. The base pillar diameter is also not particularly limited but can be, for example, about 50 nm to about 500 nm, and more particularly, about 100 nm to about 350 nm.

Figure 3:
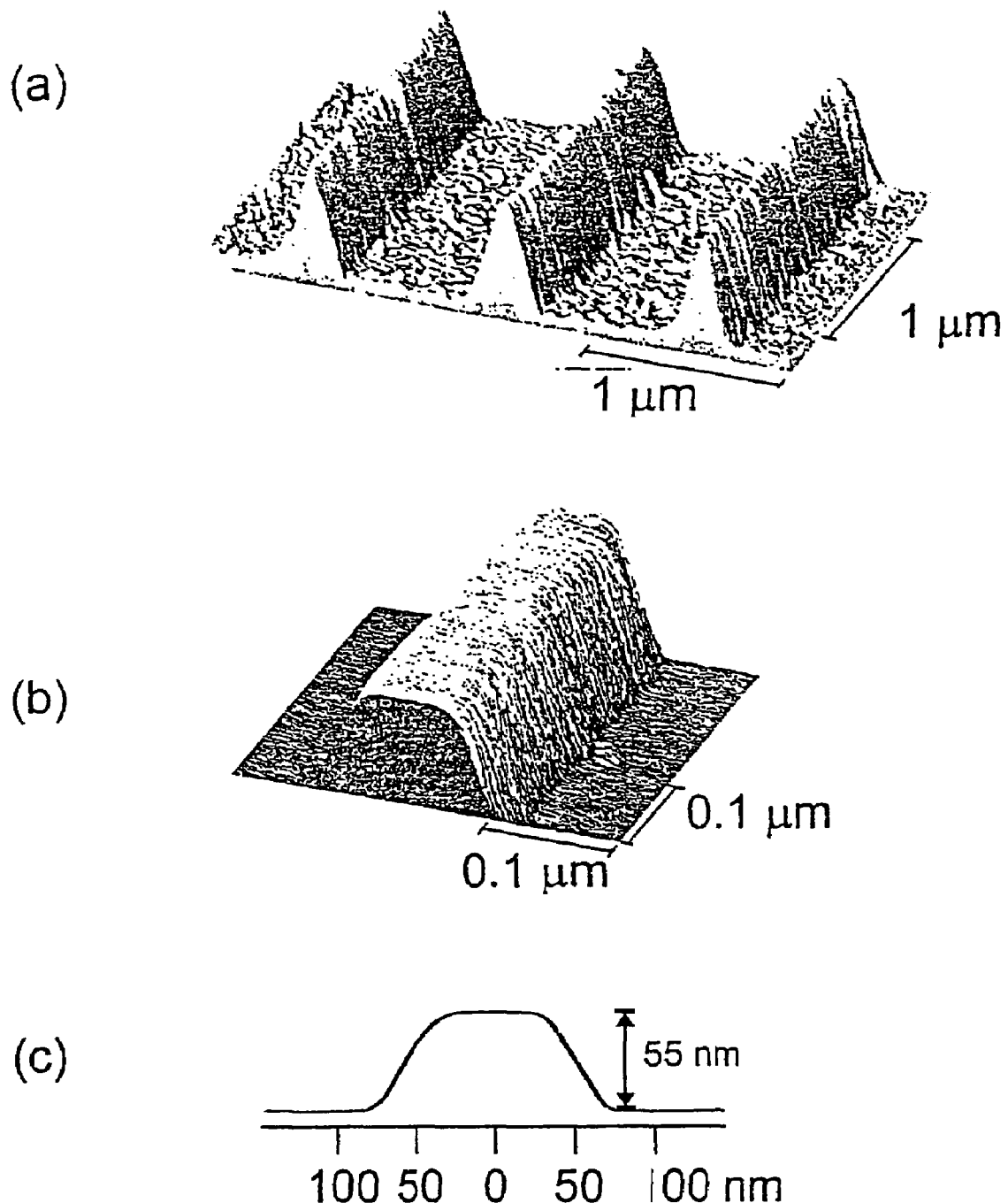
FIG. 3. Nanometer scale lines prepared according to FIG. 1, Panels a-d.

FIGS. 3 illustrates lines. These lines can be prepared with use of resists patterned in the form of lines. The line height is not particularly limited but can be, for example, about 10 nm to about 100 nm. The top width is not particularly limited but can be, for example, about 10 nm to about 2 microns, and more particularly, about 10 nm to about one micron, and more particularly, about 10 nm to about 500 nm, and more particularly, about 10 mu to about 100 nm. The base width is not particularly limited but can be, for example, about 100 nm to about 750 m, and more particularly, about 250 nm to about 500 nm.

Figure 4:
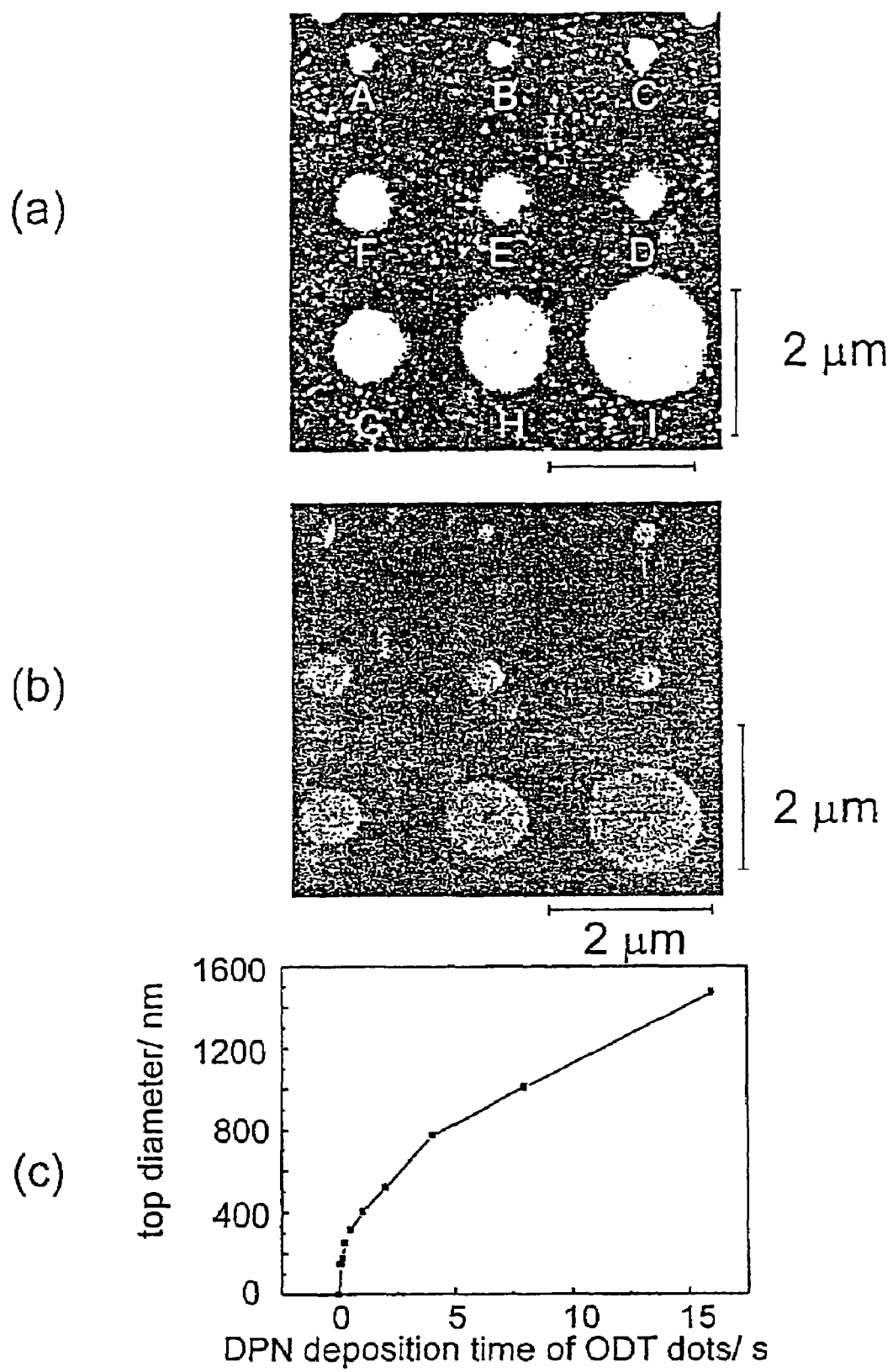
FIG. 4. Pillars prepared according to FIG. 1, Panels a-d.
Figure 5:
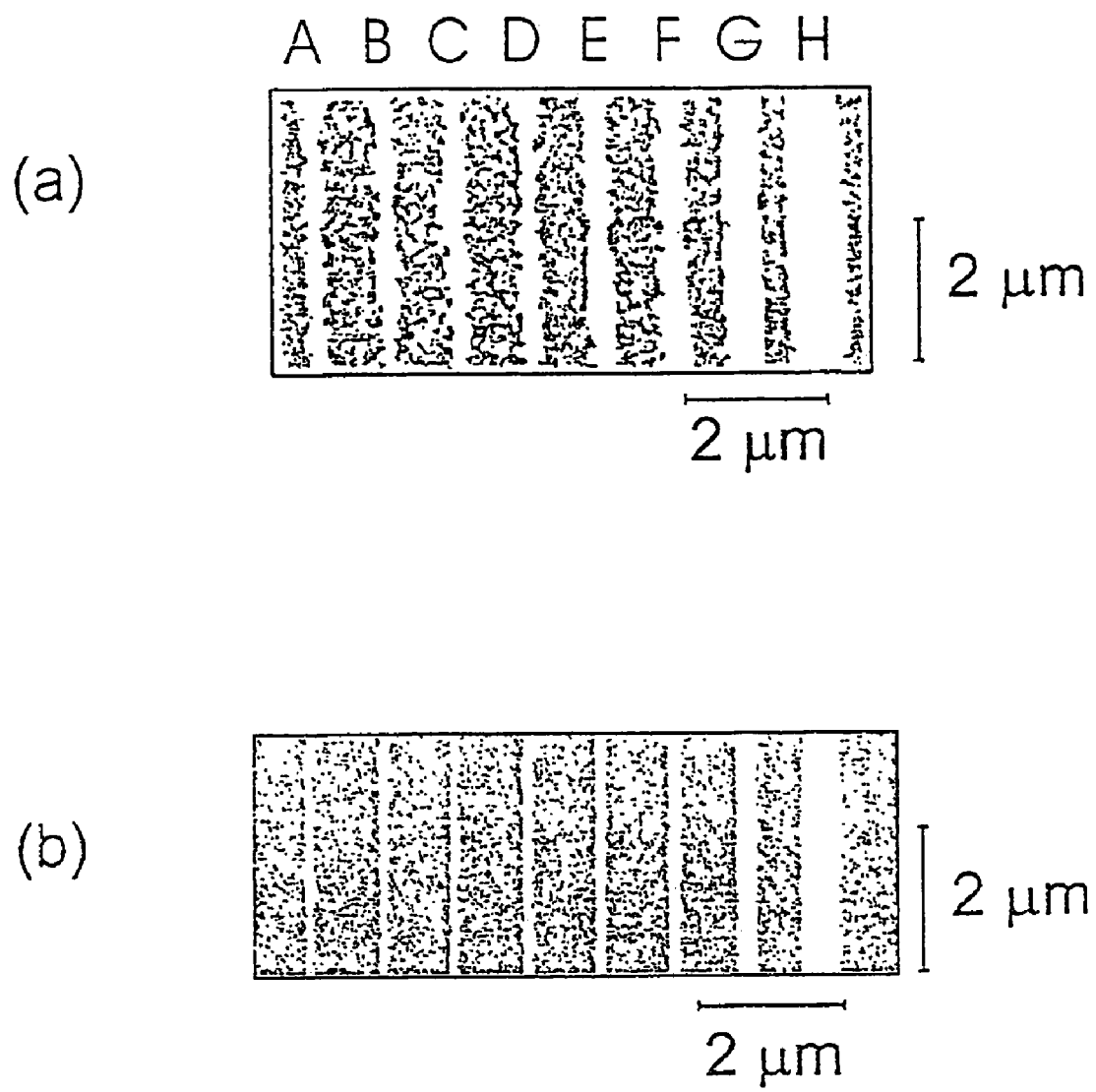
FIG. 5. Lines prepared according to FIG. 1, Panels a-d.

FIGS. 4 and 5 illustrate additional non-limiting examples of the size range and feature densities which can be achieved for pillars and lines. The following working example further illustrates the invention:

WORKING EXAMPLE 1

Introductory description for the working example is provided, supplementing the above introductory description. Lithographic techniques such as photolithography (Wallraff and Hinsberg, *Chem. Rev.*, 99:1801 (1999)), electron beam lithography (Wallraff and Hinsberg, *Chem. Rev.*, 99:1801 (1999); Xia et al., *Chem. Rev.*, 99:1823 (1999)), and microcontact printing (Xia et al., *Chem. Rev.*, 99:1823 (1999)) can be used with varying degrees of ease, resolution, and cost to generate three-dimensional features on silicon wafers. DPN is complementary to other aforementioned nanolithographic techniques, but can be used with conventional laboratory instrumentation (an AFM), in routine fashion, to generate patterns of alkylthiols on polycrystalline gold substrates under ambient conditions. Moreover, DPN offers 15 nm linewidth and 5 nm spatial resolution with conventional AFM cantilevers. (see prior examples, Piner et al., *Science*, 283:661 (1999); Piner et al., *Langmuir*, 15:5457 (1999); Hong et al., *Langmuir*, 15:7897 (1999); Hong et al., *Science*, 286:523 (1999))

Three-dimensional architectures on and in silicon are vital to the microelectronics industry and, increasingly, are being applied to other uses in microfabrication. (Xia and Whitesides, *Angew, Chem. Int. Ed. Engl.*, 37:550 (1998)). For example, the anisotropic etching of silicon commonly yields narrow grooves, cantilevers, and thin membranes (Seidel et al., *J. Electrochem. Soc.*, 137:3612 (1990)), which have been used for sensors of pressure, actuators, micro-optical components, and masks for submicron lithography techniques. (Seidel et al., *J. Electrochem. Soc.*, 137:3612 (1990)) For both the microelectronics applications and other microfabricated devices, significant advantages are expected from being able to make smaller feature sizes. (Xia and Whitesides, *Angew, Chem. Int. Ed. Engl.*, 37:550 (1998)) Additionally, the ability to fabricate smaller scale structures can lead to the discovery or realization of physical and chemical properties fundamentally different from those typically associated with larger structures. Examples include Coulomb blockades, single-electron tunneling, quantum size effects, catalytic response, and surface plasmon effects. (Xia and Whitesides, *Angew, Chem. Int. Ed. Engl.*, 37:550 (1998)) Therefore, a range of applications can be achieved for the custom-generated solid-state features attainable through DPN printing and wet chemical etching.

Consequently, the suitability of DPN-generated nanostructures as resists for generating three-dimensional multi-layered solid-state structures by standard wet etching techniques was evaluated in a systematic study, the results of which are reported in this example. In this study, DPN was used to deposit alkylthiol monolayer resists on Au/Ti/Si substrates. Subsequent wet chemical etching yielded the targeted three-dimensional structures. Many spatially separated patterns of the monolayer resists can be deposited by DPN on a single Au/Ti/Si chip and, thus, the effects of etching conditions can be examined on multiple features in combinatorial fashion.

As diagrammed in FIG. 1, in a typical experiment, DPN is used to deposit, for example, alkylthiols onto an Au/Ti/Si substrate. It has been well established that alkylthiols form well-ordered monolayers on Au thin films that protect the underlying Au from dissolution during certain wet chemical etching procedures (Xia et al., *Chem. Mater.*, 7:2332 (1995); Kumar et al., *J. Am. Chem. Soc.*, 114:9188 (1992)), this appears to also hold true for DPN-generated resists (see below). Thus, the Au, Ti, and $SiO_2$ which are not protected by the monolayer can be removed by chemical etchants in a staged procedure (FIG. 1, panels b-e). This procedure yields "first-stage" three dimensional features: multi-layer, Au-topped features on the Si substrate (FIG. 1, panel b). Furthermore, "second-stage" features can be prepared by using the remaining Au as an etching resist to allow for selective etching of the exposed Si substrate (FIG. 1, panels c and d). Finally, the residual Au can be removed to yield final stage all-Si features, FIG. 1, panel e. Thus, DPN can be combined with wet chemical etching to yield three-dimensional features on Si(100) wafers with at least one dimension on the sub-100 nm length scale.

Specifically, FIG. 1 diagrams the procedure used to prepare the nanoscale features on Si wafers. Polished single-crystalline Si(100) wafers were coated with 5 nm of Ti, followed by 10 nm of Au by thermal evaporation. After Au evaporation, the following procedure is performed on the substrates: a) DPN is used to deposit patterns of ODT, b) Au and Ti are etched from the regions not protected by the ODT monolayers using a previously reported ferri/ferrocyanide based etchant (Xia et al., *Chem. Mater.*, 7:2332 (1995)), c) residual Ti and $SiO_2$ are removed by immersing the sample into a 1% HF solution (note: this procedure also passivates the exposed Si surfaces with respect to native oxide growth) (Ohmi, *J. Electrochem. Soc.*, 143:2957 (1996)), and d) the remaining Si is etched anisotropically by minor modifications of a previously reported basic etchant (Seidel et al., *J. Electrochem. Soc.*, 137:3612 (1990)).

FIG. 2A shows the AFM topography images of an Au/Ti/Si chip patterned according to the procedure outlined in FIG. 1, panels a-d. This image shows four pillars with a height of 55 nm formed by etching an Au/Ti/Si chip patterned with four equal-sized dots of ODT with center-to-center distances of 0.8 microns. Each ODT dot was deposited by holding the AFM tip in contact with the Au surface for 2 seconds. Although the size of the ODT dots are not measured prior to etching, their estimated diameters are approximately 100 nm. This estimate is based upon the measured sizes of ODT "test" patterns deposited with the same tip on the same surface immediately prior to deposition of the ODT dots corresponding to the shown pillars. The average diameter of the shown pillar tops is 90 nm with average base diameter of 240 nm. FIG. 2B shows a pillar (55 nm height, 45 nm top diameter, and 155 nm base diameter) from a similarly patterned and etched region on the same Au/Ti/Si substrate. The cross-sectional topography trace across the pillar diameter shows a flat top and symmetric sidewalls, FIG. 2C. The shape of the structure may be convoluted by the shape of the AFM tip (approximately 10 nm radius of curvature), resulting in side widths as measured by AFM which may be larger than the actual widths. Additionally, an Au/Ti/Si substrate was patterned with three ODT lines drawn by DPN (0.4 microns/s, estimated width of each ODT line is 100 nm) with 1 micron center-to-center distances. FIGS. 3A-D shows the AFM topography image after etching this substrate according to FIG. 1, panels a-d. The top and base widths are 65 nm and 415 nm, respectively, and line heights are 55 nm. FIG. 3B shows a line from a similarly patterned and etched region on the same Au/Ti/Si wafer, with a 50 nm top width, 155 nm base width, and 55 nm height. The cross-sectional topography trace across the line diameter shows a flat top and symmetric sidewalls (FIG. 3C). FIGS. 4 and 5 show the feature-size variation possible with this technique. In FIG. 4A, the ODT-coated AFM tip was held in contact with the surface for (16-0.062 s) to generate various sized dots with 2 micron center-to-center distances which subsequently yielded etched three-dimensional structures with top diameters ranging from 1.47 microns to 147 nm and heights of 80 nm. The top diameters as measured by SEM differ by less than 15% from the diameters measured from the AFM images, compare FIGS. 4A and 4B. Additionally, energy dispersive spectroscopy (EDS) shows the presence of Au on the pillar tops whereas Au is not observed in the areas surrounding the elevated micro- and nanostructures. As expected, the diameters of the micro- and nano-trilayer structures correlate with the size of the DPN generated resist features, which is directly related to tip-substrate contact time, FIG. 4C. Line structures were also fabricated in combinatorial fashion, FIG. 5. ODT lines were drawn at a scan rate varying from 0.2-2.8 microns/s with 1 micron center-to-center distances; after etching these resists afforded trilayer structures, all with a height of 80 nm and top line widths ranging from 505 to 50 nm, FIG. 5. The field emission scanning electron micrograph of the patterned area looks comparable to the AFM image of the same area with the top widths as determined by the two techniques being within 15% of one another, compare FIGS. 5A and 5B.

In conclusion, it has been demonstrated in this working example that DPN printing can be used to deposit monolayer-based resists with micron to sub-100 nm dimensions on the surfaces of Au/Ti/Si trilayer substrates. These resists can be used with wet chemical etchants to remove the unprotected substrate layers, resulting in three-dimensional solid-state feature with comparable dimensions. It is important to note that this example does not show a limit to the ultimate resolution of solid-state nanostructure fabrication by means of DPN. Indeed, it is believed that the feature size will decrease through the use of new "inks" and sharper "pens." Finally, this work demonstrates using DPN to replace the complicated and more expensive hard lithography techniques (e.g. e-beam lithography) for a variety of solid-state nanolithography applications.

Experimental a) Substrate Preparation: Si(100) wafers (4" diameter (1-O-0) wafers; 3-4.9 ohm/cm resistivity; 500-550 microns thickness) were purchased from Silicon Quest International, Inc. (Santa Clara, Calif.). Thermal evaporation of 5 nm of Ti (99.99%; Alfa Aesar; Ward Hill, Mass.) followed by 10 nm of Au (99.99%; D. F. Goldsmith; Evanston, Ill.) was accomplished using an Edwards Auto306 Turbo Evaporator equipped with a turbopump (Model EXT510) and an Edwards FTM6 quartz crystal microbalance to determine film thickness. Au and Ti depositions were conducted at room temperature at a rate of 1 nm/s and a base pressure of $<9 \times 10^{-7}$ mb.

b) DPN Procedure and AFM imaging: All DPN and imaging experiments were carried out with a Thermomicroscopes CP AFM and conventional cantilevers (Thermomicroscopes sharpened Microlever A, force constant=0.05 N/m, $Si_3N_4$). A contact force of 0.5 nN was typically used for DPN patterning. To minimize piezo tube drift problems, a 100-micron scanner with closed loop scan control was used for all of the experiments. The tips were treated with ODT in the following fashion: 1) tips were soaked in 30% $H_2O_2$; $H_2SO_4$ (3:7) (caution: this mixture reacts violently with organic material) for 30 min, 2) rinsed with water, 3) heated in an enclosed canister (approximately 15 cm$^3$ internal volume) with 200 mg ODT at 60° C. for 30 min, 4) blown dry with compressed difluoroethan prior to use. Typical ambient imaging conditions are 30% humidity and 23° C. unless reported otherwise.

c) Wet Chemical Etchants: a standard ferri/ferrocyanide etchant was prepared as previously reported (Xia et al., *Chem. Mater.*, 7:2332 (1995)) with minor modification: 0.1 M $Na_2S_2O_3$, 1.0 M KOH, 0.01 M $K_3Fe(CN)_6$, 0.001 M $K_4Fe(CN)_6$ in nanopure water. Au etching was accomplished by immersing the wafer in this solution for 2-5 min while stirring. The HF etchant (1% (v:v) solution in nanopure water) was prepared from 49% HF and substrates were agitated in this solution for 10 s. Silicon etching was accomplished by immersing the desired wafer in 4 M KOH in 15% (v:v) isopropanol in nanopure water at 55° C. for 10 s while stirring (Seidel et al., *J. Electrochem. Soc.*, 137:3612 (1990)). Final passivation of the Si substrate with respect to $SiO_2$ growth was achieved by immersing the samples in 1% HF for 10 s with mild agitation. Substrates were rinsed with nanopure water after each etching procedure. To remove residual Au, the substrates were cleaned in $O_2$ plasma for 3 min and soaked in aqua regia (3:1 HCl:$HNO_3$) for 1 min, followed by immersing the samples in 1% HF for 10 s with mild agitation.

d) Scanning Electron Microscope: Hitachi SEM equipped with EDS detector.

Part III

Additional preliminary description is provided for one skilled in the art to practice the invention under the embodiments and working examples of part III. Briefly, few nanolithographic methods offer the ability to routinely work in the sub-50 nm regime with control over feature size and interfeature distance, especially when such features are made of both hard and soft materials. Herein, an experimental method is used, which combines the high-resolution, direct-write lithographic technique, DPN™ printing, with wet chemical etching, for fabricating nanoarrays, including dot arrays, of gold-coated, Ti-coated silicon oxide with features in the 25 to 50 nm range. In addition, this protocol can be used to routinely make nanogaps between the features ranging from 12 to 100 nm. The invention disclosed herein provides general chemical procedures for using self-assembled monolayers (SAMs) as wet chemical etch resists, which are used to make the smallest Au structures prepared by a wet chemical etching strategy.

In particular, and without limiting the scope of the invention, the invention provides in one embodiment a method of nanolithography comprising: providing a substrate and a scanning probe microscope tip; using the tip to apply a patterning compound to the substrate so as to produce a desired pattern which is a chemical etching resist, chemically etching the substrate, wherein the pattern after etching is characterized by interfeature gaps of about 50 nm or less.

Briefly, the invention also provides nanoarrays comprising features of about 5 nm to about 50 nm and interfeature distances of about 5 nm to about 50 nm. The nanoarrray can comprise, for example, at least about 10,000 features, and at least about 40,000 features, and more particularly, at least about 100,000 features.

In particular, reference 4 above (Part I), U.S. Provisional application 60/207,713 filed May 26, 2000 ("Methods Utilizing Scanning Probe Microscope Tips and Products Therefor or Produced Thereby"), and reference 6 above (Part I), U.S. Regular application Ser. No. 09/866,533 filed May 24, 2001 ("Methods Utilizing Scanning Probe Microscope Tips and Products Therefor or Produced Thereby"), disclose etching processes coupled with direct write lithographic processes, the disclosures of which are hereby incorporated by reference in their entirety.

The direct-write deposition conditions can be adapted to provide the excellent interfeature distances and small feature sizes in short periods of time, which are basic and novel features of the present invention. These conditions include, for example, appropriate relative humidity, use of inks and patterning compounds which are adapted to chemisorb or covalently bond to the substrate, short holding times and fast scan rates, and use of computer software.

Part of the inventive aspects of this disclosure is the elimination of the cumbersome methods associated with electron beam lithography, including expensive masks and instrumentation. Also, use of cumbersome stamps is not needed as used in common stamping techniques.

For direct write lithography steps, the tips can be hollow or non-hollow as described above in parts I and II. The ink can be supplied in a continuous or a non-continuous manner as described above, for example, in parts I and II.

After direct write lithography is carried out, etching methods known in the semiconductor arts can be used as described above, for example, in parts I and II.

The invention is further illustrated by but not limited to the following working examples. References cite to Reference List A in part III.

WORKING EXAMPLE 2

In a typical experiment, gold-coated (10 nm), Ti-coated (1 nm) silicon oxide (Au/Ti/SiO$_x$/Si) (references 6a,b) was patterned via DPN™ printing with 16-mercaptohexadecanoic acid (MHA) using a Park Scientific CP AFM (Thermomicroscopes, Sunnyvale, Calif.) and commercial lithography software (DPNWrite™, DPN System-1, NanoInk Inc., Chicago, Ill.) (references 5, 6a,b). All patterning experiments were carried out under ambient conditions (set point=0.5 Nn, 24-26° C., 44-49% relative humidity) with a MHA-coated tip, which was prepared by immersing a $Si_3N_4$ tip (spring constant=0.05 N/m, Thermomicroscopes, Sunnyvale, Calif.) in an acetonitrile solution saturated with MHA for ~5 s with subsequent drying with compressed difluoroethane (Dust-off, Ted Pella, Inc., Redding, Calif.). Each DPN dot feature was generated by holding a MHA-coated tip in contact with an Au surface for 0.01 s (i.e., a holding time), and each line was generated by moving a MHA-coated tip on an Au surface at a constant rate (given below).

Figure 6:
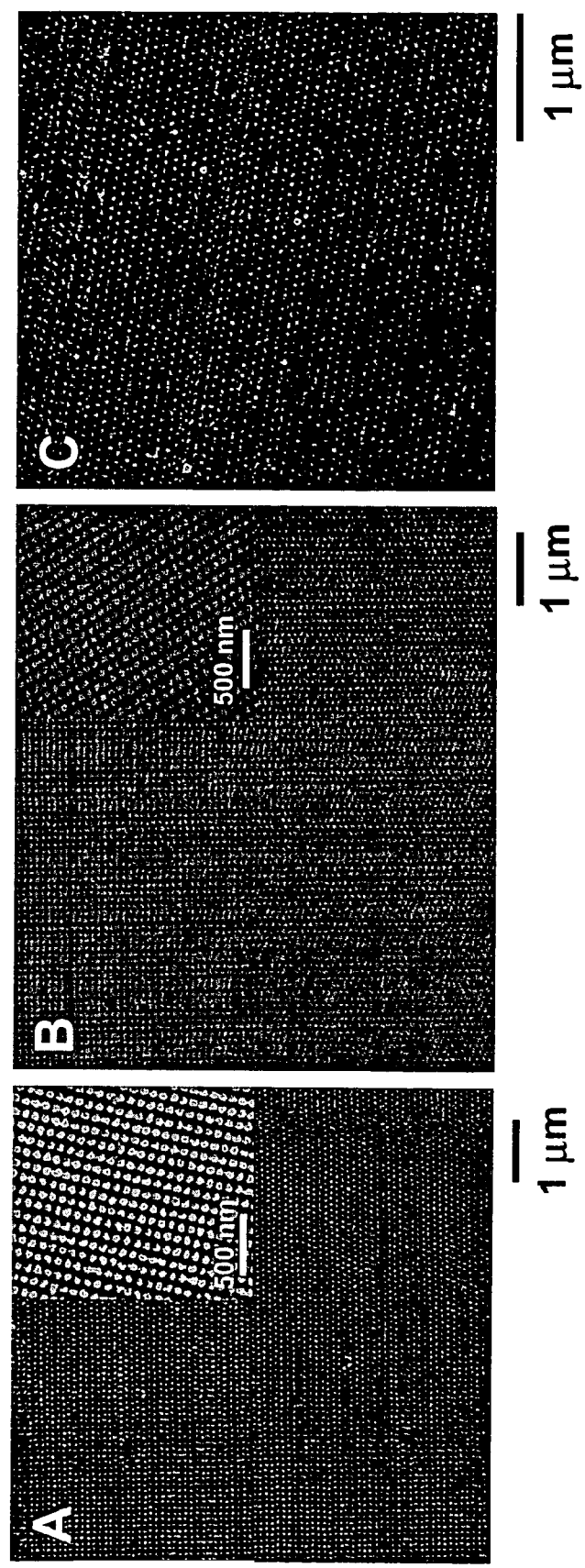
FIG. 6. TMAFM topographic image (A, C) and SEM image (B) of an etched Si/SiO$_x$/Ti/Au/MHA dot nanoarray. The inserts are high-resolution images.
Figure 8:
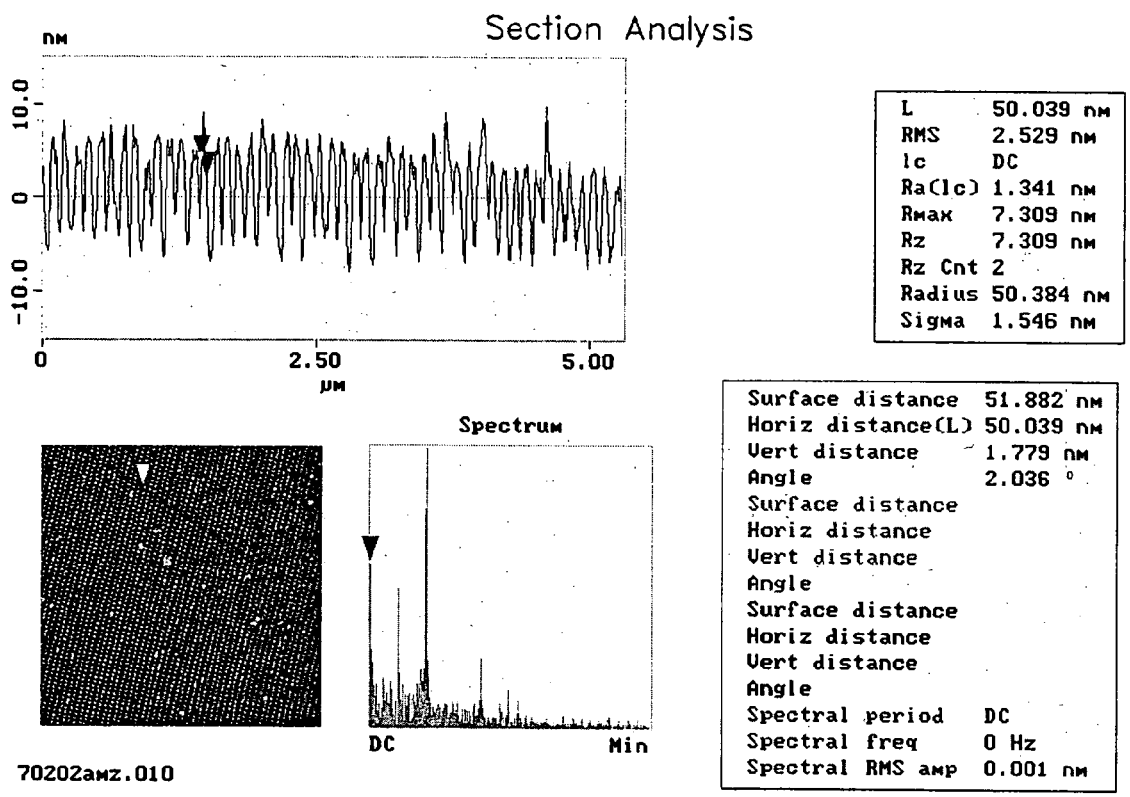
FIG. 8. Section analysis of the TMAFM images of the etched Au nanoarrays in FIG. 6A.
Figure 9:
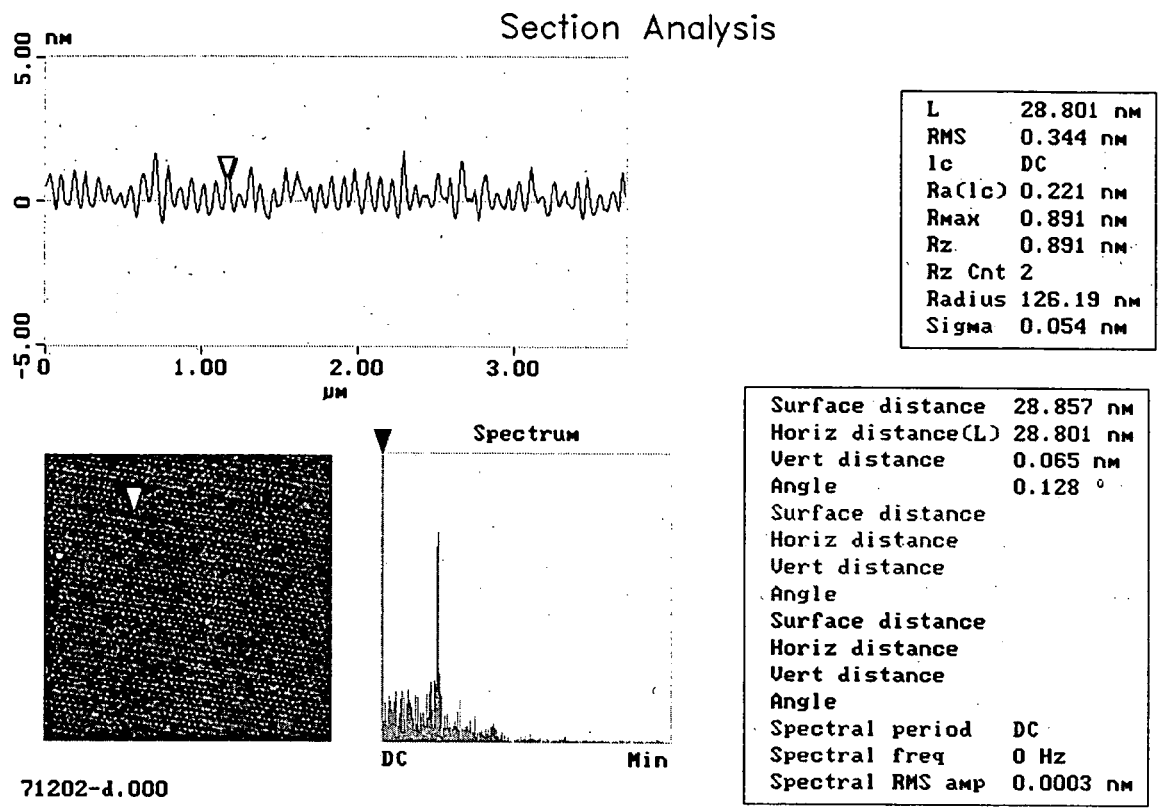
FIG. 9. Sectional analysis of the etched Au nanoarrays in FIG. 6C. The average diameter of the etched Au dots is 25±5 nm.

MHA patterned Au substrates were treated with a ferri/ferrocyanide etchant, a 1:1:1:1 (v:v:v:v) aqueous mixture of 0.1 M $Na_2S_2O_3$, 1.0 M KOH, 0.01 M $K_3Fe(CN)_6$ and 0.001 M $K_4Fe(CN)_6$, for ~20 min under constant stirring to completely remove the Au from areas not modified with MHA. After rinsing with Milli-Q $H_2O$ and drying with $N_2$, the etched Au nanopattern was characterized by tapping mode AFM (TMAFM) (Nanoscope IIIa, Digital Instruments, Santa Barbara, Calif.). FIG. 6A shows the TMAFM image of an etched Au dot array. In this type of array, the distance between dots is about 100 nm and the measured diameter of each etched Au dot is approximately 50 nm (see Figures for section analysis). The uniformity of the nanostructures was quite good, demonstrating the ability to fabricate high quality small-scale features via the DPN™ printing process. Indeed, a scanning electron microscopy (SEM) image of a portion of a 40,000 dot array shows the regularity of the feature size and interfeature distance. The actual dot diameter as measured by SEM is about 45 nm, FIG. 6B. The larger diameter value obtained from the AFM analysis of the nanopattern may be due to a number of factors including tip convolution. This strategy can be used to fabricate even smaller features, including deliberately controlling dot feature size below about 45 nm. The smallest diameter structures made to date via this method are about 25±5 nm, FIG. 6C (see FIGS. 8-9 for section analysis). The distance between them is about 80 nm. Note that these structures often have irregular shapes, which may be a consequence of nonuniform etching and the rough polycrystalline Au substrates, which reduces the packing density of the MHA SAM patterns by DPN™ printing (reference 7). The resist features in this case (~25 nm Au dots) are only approximately 50 MHA molecules in diameter. This estimate is based upon the known lattice parameters for an MHA SAM (reference 8) and the assumption that there is no loss of SAM during the etching process; in many cases, the monolayer resist remains on the solid features after the wet chemical etching process (references 6a, c, 9).

Figure 7:
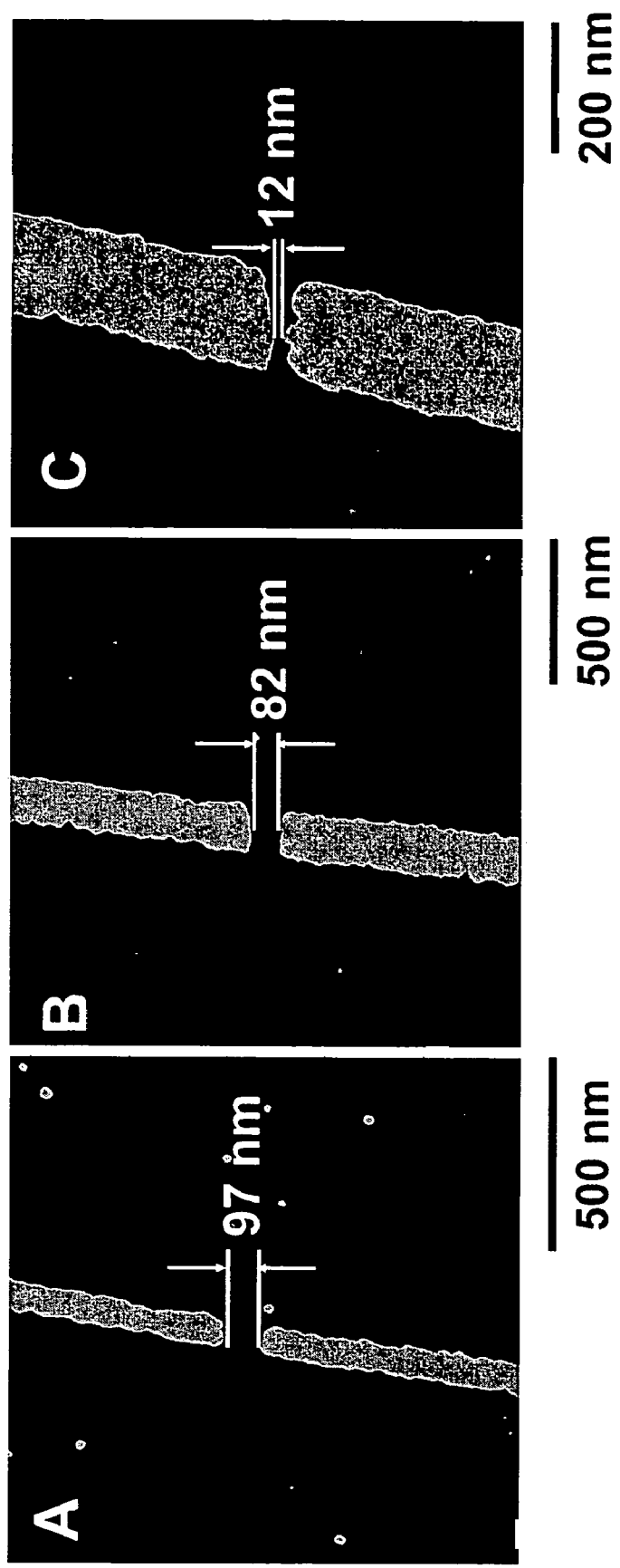
FIG. 7. TMAFM topographic images of etched Si/SiO$_x$/Ti/Au/MHA nanogaps.

Importantly, because DPN™ printing can be used to deliberately make a wide variety of features regardless of shape and size (up to the many micrometer length scale), the technique can be used to generate gaps as well as dot features. Sub-50 nanometer gaps can be attained in some cases via the more labor-intensive e-beam lithography, but sub-20 nanometer gaps are difficult to produce by any method. Indeed, although a variety of e-beam based techniques (reference 1) as well as electrochemical methods can be used with difficulty to produce such structures (reference 10), those skilled in the art would benefit from more straightforward methods for preparing such structures. At present, stamping methods do not provide the resolution or alignment registration capabilities necessary for fabricating such structures. DPN™ printing, however, allows one to pattern structures on this length scale, and herein, it is disclosed how one can use the technique to prepare gaps in the range of 12 to 100 nm, FIG. 7.

WORKING EXAMPLE 3

Figure 10:
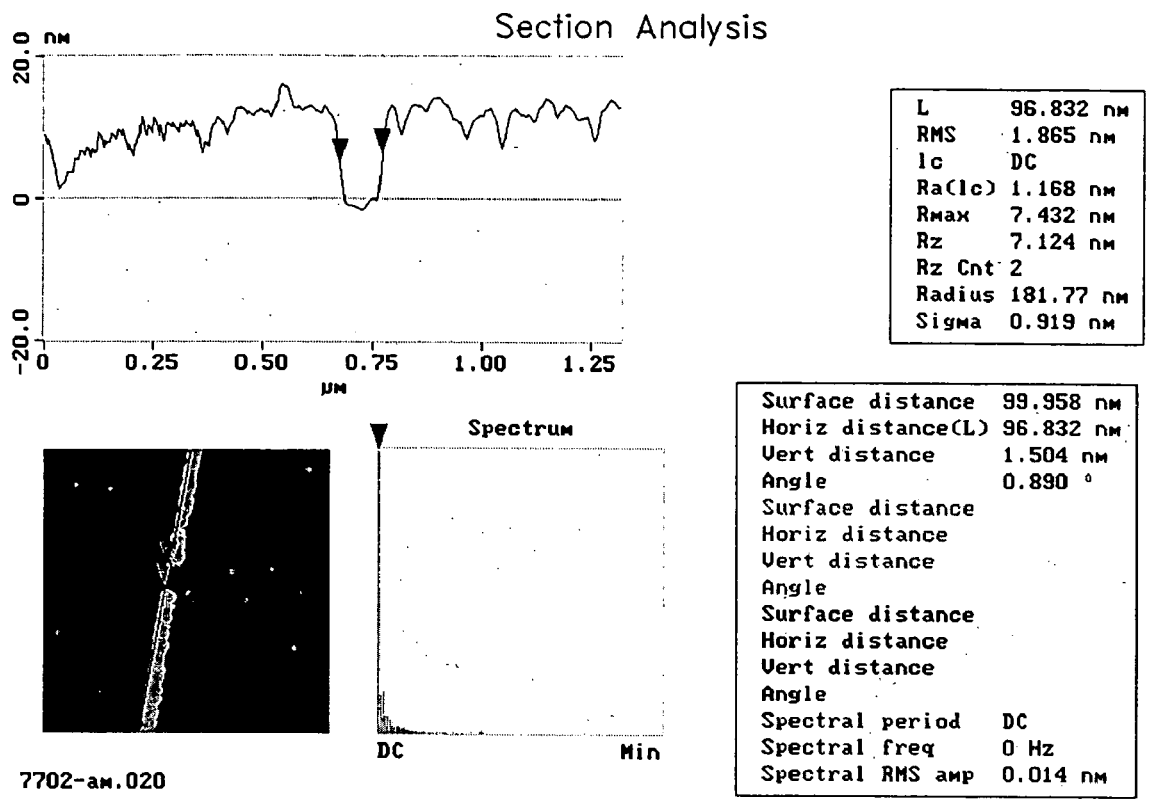
FIG. 10. Sectional analysis of the etched Au nanogap in FIG. 7A.
Figure 11:
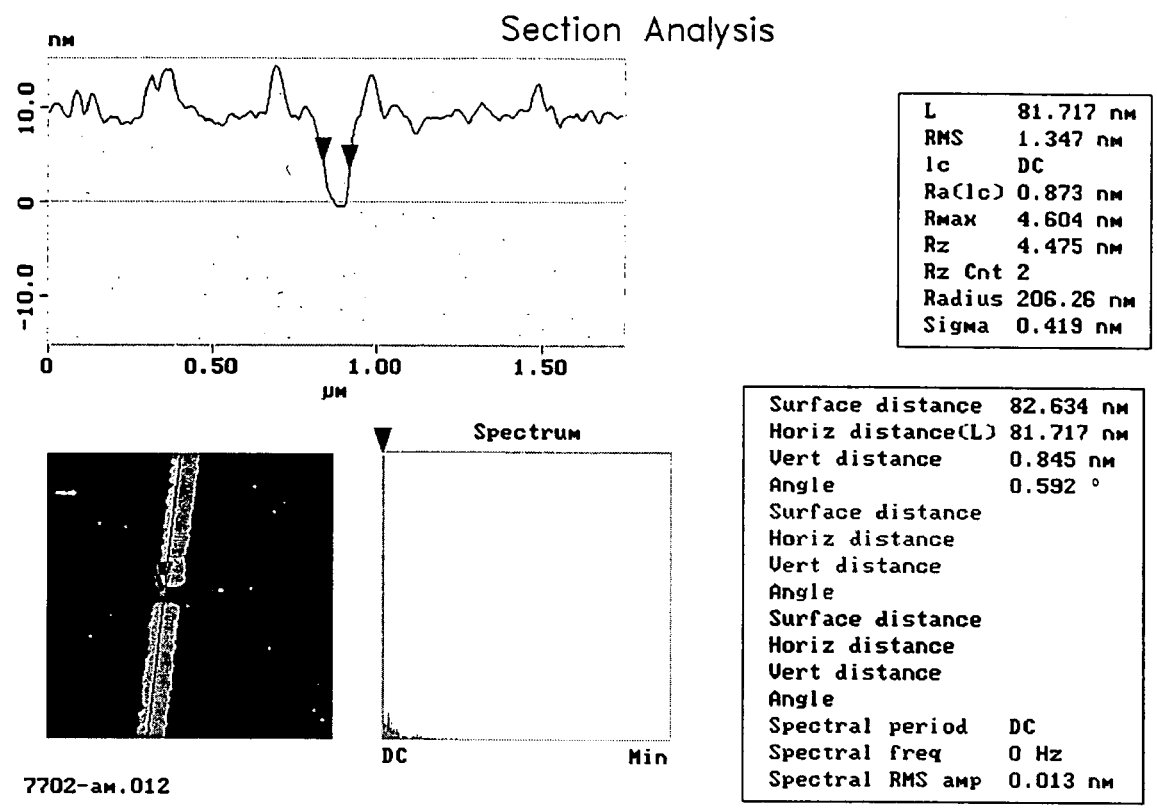
FIG. 11. Sectional analysis of the etched Au nanogap in FIG. 7B.
Figure 12:
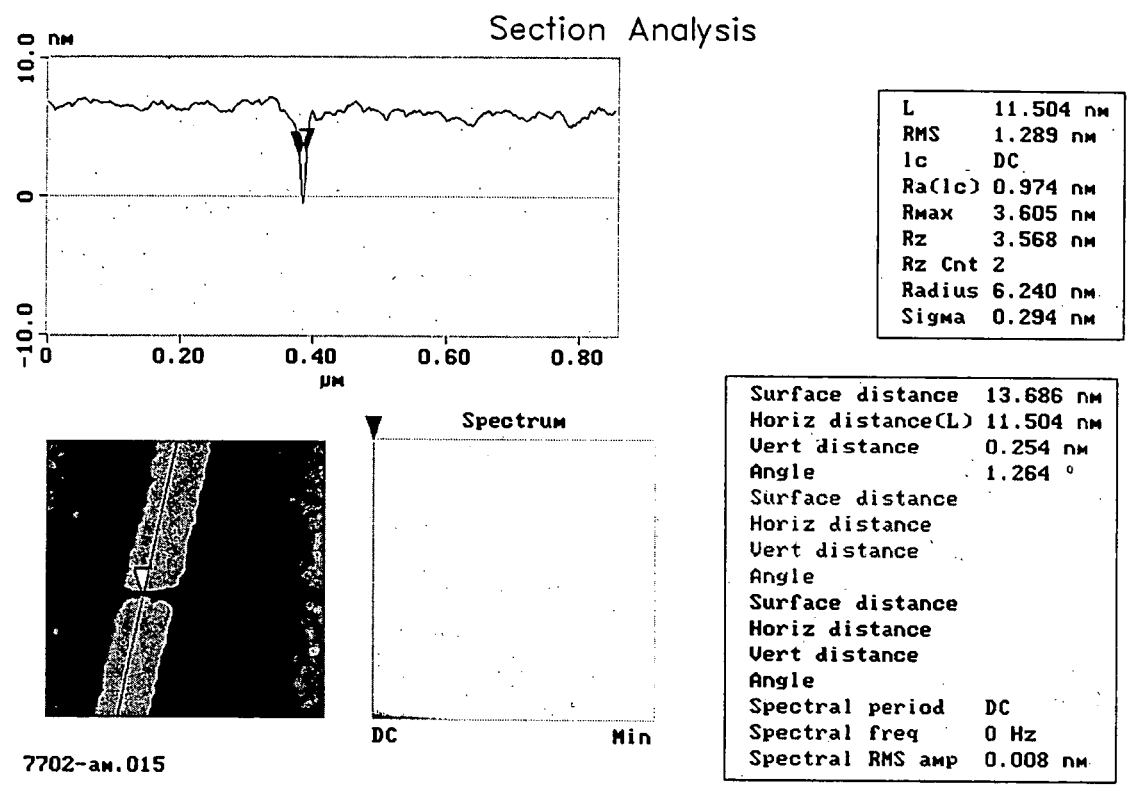
FIG. 12. Sectional analysis of the etched Au nanogap in FIG. 7C.
Figure 13:
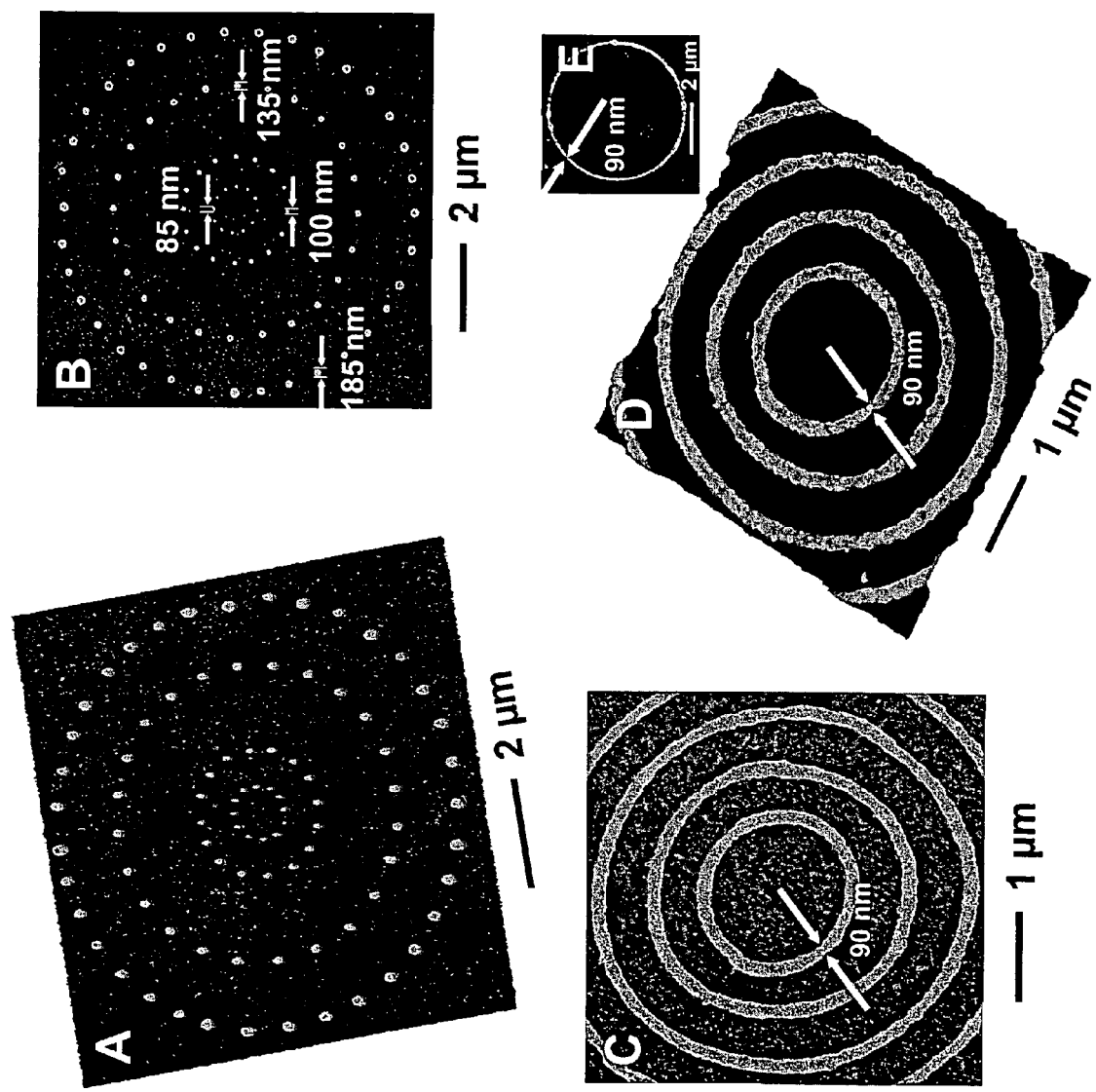
FIG. 13. TMAFM images (A, B, D, E) and SEM image (C) of etched Au nanostructures on a Si/SiO$_x$ substrate. A and B, and C and D are the same nanopatterns, respectively.
Figure 14:
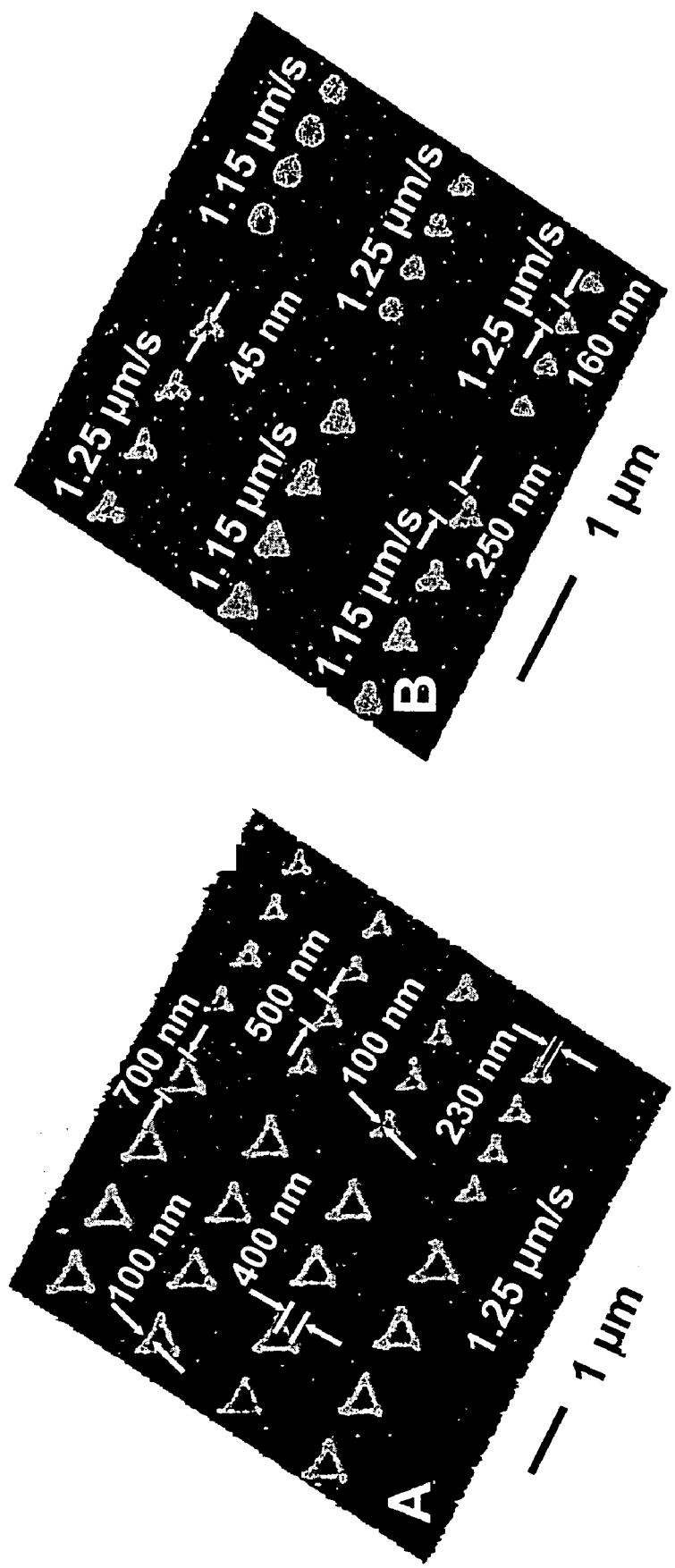
FIG. 14. TMAFM images of etched Au nanostructures of triangles on a Si/SiO$_x$ substrate. (A) 700 (left) and 500 nm (right) edge length hollow triangles generated at a writing speed of 1.25 μm/s. Etched line width=100 nm. (B) 250 (left) and 160 nm (right) edge length triangle generated at a writing speed of 1.25 (top left and low right corners) and 1.15 μm/s (the other part), respectively.

In a typical experiment, 20 µm long lines of MHA were generated by moving a MHA-coated tip on an Au surface at a rate 0.5 (FIG. 7A), 0.25 (FIG. 7B), and 0.25 (FIG. 7C) µm/s with a designed gap distance of 100 (FIG. 7A), 90 (FIG. 7B), and 20 nm (FIG. 7C), respectively. After etching the exposed areas of the Au film with a ferri/ferrocyanide etchant (reference 6a), TMAFM images show that the measured sizes of the obtained nanogaps are ~97 (FIG. 7A), 82 (FIG. 7B), and 12 (FIG. 7C) nm (see FIGS. 10-12 for section analysis), respectively. The obtained gap sizes are a little smaller than the designed gap sizes, possibly a consequence of MHA diffusion, which in some cases may not be fully accounted for in the software or experimental protocol, and which in some cases may not take into account differences in the ink diffusion as a function of tip coating. The widths of the etched lines are about 70 (FIG. 7A), 170 (FIG. 7B) and 165 (FIG. 7C) nm, respectively. These data show that one can conveniently control both line width and gap size using this protocol. See further FIGS. 10-12 for section analyses.

In summary, this work demonstrates how one skilled in the art can use DPN™ printing and chemical etching to fabricate arrays, including arrays of gold features with sub-50 nm dimensions. This type of methodology can, for example, open avenues for commercializing quantum phenomena associated with deliberately designed arrays of inorganic materials such as Au, especially in the cases of surface-enhancement in Raman spectroscopy (references 11), plasmon optical coupling (references 12), and nanoparticle-based biodiagnostics (reference 13). In addition, nanogaps are widely used for making electrical measurements on nanoscale matter (references 14) and even molecules (references 15). The electrical properties of these materials can be examined, and the ability to make metallic structures provides for a fast and convenient method for the fabrication of electrodes with nanogaps.

Nanoplotters can be used, as desired, to carry out the direct write nanolithography.

Reference 6A below describes additional embodiments for use in preparation of arrays of nanostructures functionalized with organic and biological molecules including peptides, proteins, and nucleic acids including, for example, DNA, RNA, and oligonucleotides. This reference, including the figures and experimental methods, is hereby incorporated by reference. The embodiments described therein are of particular interest for the high resolution embodiments comprising small feature sizes and small interfeature distances.

One skilled in the art can also refer to the following references for use in practicing the invention which are noted above. These references provide written description and enabling support for the following claims and are hereby incorporated by reference in their entirety.

LIST OF REFERENCES (A)

(1) see a review: Wallraff, G. M.; Hinsberg, W. D. *Chem. Rev.* 1999, 99, 1801, and references therein, (Electron beam lithography and photolithography).

(2) Microcontact printing: (a) Xia, Y.; Whitesides, G. M. *Angew. Chem. Int. Ed.* 1998, 37, 550; (b) Xia, Y.; Rogers, J. A.; Paul, K. E.; Whitesides, G. M. *Chem. Rev.* 1999, 99, 1823.

(3) Nano-imprint lithography: Chou, S. Y. *MRS Bull.* 2001, 26, 512.

(4) Scanning probe lithography: Liu, G. Y.; Xu, S.; Qian, Y. *Acc. Chem. Res.* 2000, 33, 457; and references therein.

(5) Dip-Pen Nanolithographic printing: (a) Piner, R. D.; Zhu, J.; Xu, F.; Hong, S.; Mirkin, C. A. *Science* 1999, 283, 661; (b) Hong, S.; Zhu, J.; Mirkin, C. A. *Science* 1999, 286, 523.

(6) Wet chemical etching including resists: (a) Zhang, H.; Li, Z.; Mirkin, C. A. *Adv. Mater.* 2002, 14, No. 20, October 16, pages 1472-1474; (b) Weinberger, D. A.; Hong, S.; Mirkin, C. A.; Wessels, B. W.; Higgins, T. B. *Adv. Mater.* 2000, 12, 1600; (c) Xia, Y.; Zhao, X. M.; Kim, E.; Whitesides, G. M. *Chem. Mater.* 1995, 7, 2332.

(7) (a) Ivanisevic, A.; McCumber, K. V.; Mirkin C. A. *J. Am. Chem. Soc.* 2002, 124, 11997; (b) Zhang, Y.; Salaita, K.; Lim, J. H.; Mirkin, C. A. *Nano Lett.* Submitted.

(8) Hong, S.; Zhu, J.; Mirkin, C. A. *Langmuir,* 1999, 15, 7897.

(9) (a) Geissler, M.; Schmid, H.; Bietsch, A.; Michel, B.; Delamarche, E. *Langmuir* 2002, 18, 2374; (b) Carvalho, A.; Geissler, M.; Schmid, H.; Michel, B.; Delamarche, E. *Langmuir,* 2002, 18, 2406.

(10) (a) He, H. X.; Boussaad, S.; Xu, B. Q.; Li, C. Z.; Tao, N. J. *J. Electroanal. Chem.* 2002, 522, 167; (b) Morpurgo, A. F.; Marcus, C. M.; Robinson, D. B. *Appl. Phys. Lett.* 1999, 74, 2084.

(11) (a) Felidj, N.; Aubard, J.; Levi, G.; Krenn, J. R.; Salerno, M.; Schider, G.; Lamprecht, B.; Leitner, A.; Aussenegg, F. R. *Phys. Rev. B* 2002, 65, 075419; (b) Gearheart, L. A.; Ploehn, H. J.; Murphy, C. J. *J. Phys. Chem. B* 2001, 105, 12609.

(12) (a) Krenn, J. R.; Dereux, A.; Weeber, J. C.; Bourillot, E.; Lacroute, Y.; Goudonnet, J. P.; Schider, G.; Gotschy, W.; Leitner, A.; Aussenegg, F. R.; Girard, C. *Phys. Rev. Lett.* 1999, 82, 2590; (b) Malinsky, M. D.; Kelly, K. L.; Schatz, R G. C.; Van Duyne, R. P. *J. Am. Chem. Soc.* 2001, 123, 1471.

(13) Bogunia-Kubik, K.; Sugisaka, M. *Biosystems* 2002, 65, 123.

(14) (a) He, H. X.; Zhu, J. S.; Tao, N. J.; Nagahara, L. A.; Amlani, I.; Tsui, R. *J. Am. Chem. Soc.* 2001, 123, 7730; (b) Bogozi, A.; Lam, 0.; He, H. X.; Li, C. Z.; Tao, N. J.; Nagahara, L. A.; Amlani, I.; Tsui, R. *J. Am. Chem. Soc.* 2001, 123, 4585.

(15) (a) Donhauser, Z. J.; Mantooth, B. A.; Kelly, K. F.; Bumm, L. A.; Monnell, J. D.; Stapleton, J. J.; Price, D. W.; Rawlett, A. M.; Allara, D. L.; Tour, J. M.; Weiss, P. S. *Science* 2001, 292, 2303; (b) Chen, J.; Reed, M. A.; Rawlett, A. M.; Tour, J. M. *Science* 1999, 286, 1550.

Part IV

Additional preliminary description is provided for one skilled in the art to practice the invention under the embodiments of part IV. In Part IV, an additional listing of references is provided (Listing B) different from the list A above for Part III. Part IV provides for DPN printing-based methods for preparing metals such as, for example, Au, Ag, and Pd nanostructures on a Si/SiO$_x$ surface, with deliberately designed shapes including, for example, dots, lines, triangles, and circles, and sizes ranging from sub-100 to several hundred nm.

In the emerging field of nano-science and technology, functionalized inorganic metallic nanostructures and nanoarrays have been widely studied because of their potential applications in electronics,[1] optics,[2] biodiagnostics,[3] and catalysis.[4] There are a variety of methods for fabricating such structures, all of which possess certain attributes and shortcomings. For example, high resolution lithographic methods, such as electron-beam lithography[5] and nanoimprint lithography,[6] can be used to fabricate metallic nanostructures/nanoarrays, but these methods do not allow one generally to pattern surfaces with soft materials. Microcontact printing (μCP)[7] allows one to directly deposit molecules onto a surface in massively parallel fashion, but it is a relatively low resolution technique when compared with e-beam lithography and nanoimprinting. Moreover, none of these methods generally allow one to make structures out of many materials (or inks) with nanoscale registration capabilities.

Scanning probe based lithographies[8] allow one to generate sub-100 nm structures on surfaces but often only in serial fashion. Dip-pen nanolithography (DPN),[9] a new scanning-probe-based tool for fabricating sub-100 nm to many micrometer structures on surfaces, is unique in this regard, since it is a direct-write method with high registration capabilities that has been transitioned from a serial to parallel writing tool through the use of cantilever arrays.[9c,10] Importantly because it is a direct-write method, one not only can fabricate single component nanostructures but also multi-component ones made from different inks. Thus far, capabilities have been demonstrated for small organic molecules[9a-c,11] dendrimers,[12] conducting polymers[13], biological molecules (DNA,[14] proteins,[15] and peptides,[15d,16]), nanoparticles,[17] sol gels,[18] and metal ions.[19] See additional references in Part I, for example,. These combined capabilities make DPN a powerful tool for fabricating both hard and multicomponent soft nanostructures with nanoscale precision.

In other references (see also Parts II and III),[20] a method is reported for fabricating arrays of Au nanostructures on a Si/SiO$_x$ surface based on DPN with subsequent wet chemical etching.[21] Sub-50 nm Au nanodot arrays and 12 nm Au nanogaps can be made using this approach (see also Part III).[22] The Au nanoarrays generated via this procedure also can be used as templates to assemble other structures on top of them, including oligonucleotides,[20] proteins[23] and Au nanoparticles.[20,23] In addition, by using the Au features as a resist, high quality sub-100 nm Si structures could be generated (see Part IV).[24] In particular, the Zhang et al. reference 23 is incorporated by reference herein in its entirety and can be relied upon in the practice of the present invention.

In this further part, the generality of this approach is further demonstrated including how it can be used to fabricate structures made from Ag and Pd, two metals that are of interest for a variety of optical[25] and catalytic[26] applications. In addition, one skilled in the art can prepare structures other than lines and dots in square and hexagonal lattices, including circles and triangles. Such capabilities are important for fabricating many types of structures that have applications in optics and electronics. Some of these applications include substrates for surface-enhanced Raman spectroscopy,[27] plasmon wires,[28] biodiagnostics,[3] and electrical measurements on nanoscale matter and even molecules.[29]

WORKING EXAMPLE 4

Experimental Section for Part IV

Chemicals. Ammonium hydroxide and hydrogen peroxide (30%) were purchased from Fisher Scientific. The FeCl$_3$-based etchant, TFP, was purchased from Transene, Inc. (Danvers, Mass.). All other chemicals were purchased from Aldrich chemical company (Milwaukee, Wis.) and were used without further purification. Milli-Q water (>18 MΩ cm) was used for all aqueous experiments.

Substrate preparation. An oxidized silicon wafer (500 nm of oxide) was cut into 1×1 cm$^2$ squares. After being ultrasonicated with acetone for 10 min and rinsed with Milli-Q water, the Si substrates were immersed into a boiling solution of ammonium hydroxide and hydrogen peroxide (V(NH$_4$OH):V(H$_2$O$_2$):V(H$_2$O)=1:1:5) for 1 h. The cleaned substrates were rinsed with Milli-Q water and dried with $N_2$, and then put into a thermal evaporator chamber. Under vacuum conditions (pressure<$1\times10^{-7}$ Mbar), the substrates were coated with a 1 nm Ti adhesion layer via thermal evaporation and subsequently coated with Au (10 nm), Ag (30 nm) and Pd (20 nm), respectively, to make Au, Ag and Pd thin films. These substrates were used immediately for DPN experiments.

Dip-pen nanolithography (DPN) and wet chemical etching. The metal substrates were patterned with 16-mercaptohexadecanoic acid (MHA) or 1-octadecanethiol (ODT) by DPN,[9,20,22-24] and all DPN experiments were carried out under ambient conditions (set point=0.5 nN, 22-24° C., 30-36% relative humidity) by using an AutoProbe CP AFM (TM Microscopes, Sunnyvale, Calif.) and commercial lithography software (DPNWrite™, DPN System-1, NanoInk Inc., Chicago, Ill.) with MHA or ODT-coated tips. MHA-coated tips were prepared by immersing $Si_3N_4$ cantilevers (k=0.05 N/m, TM Microscopes, Sunnyvale, Calif.) in an acetonitrile solution saturated with MHA for 5 s. They were subsequently dried with compressed difluoroethane (Dust-off, Ted Pella, Inc., Redding, Calif.). ODT-coated tips were prepared by thermal evaporation of ODT onto $Si_3N_4$ tips at 65° C. for 30 min.

The Au substrates, patterned with MHA or ODT, were immersed in a ferri/ferrocyanide etching solution (a 1:1:1:1 (v:v:v:v) aqueous mixture of 0.1 M $Na_2S_2O_3$, 1.0 M KOH, 0.01 M $K_3Fe(CN)_6$ and 0.001 M $K_4Fe(CN)_6$) for 20 min under constant stirring to remove the Au layer from the exposed regions of the Au substrate.[20,22,23] The Ag substrates, patterned with MHA, were treated with a ferri/ferrocyanide etching solution[30] (a 1:1:1 (v:v:v) aqueous mixture of 30 mM $Na_2S_2O_3$, 3 mM $K_3Fe(CN)_6$ and 0.3 mM $K_4Fe(CN)_6$) for 1-2 min to remove the exposed Ag layer. The Pd substrates, patterned with MHA or ODT, were immersed in a TFP etchant, which was diluted to a 5:1 ratio of $H_2O$:etchant for 10-30 s to remove the unprotected palladium.[31] After rinsing with Milli-Q $H_2O$, the etched substrates were immersed into a 0.5% (v/v) aqueous HF solution for 10-15 s to remove the 1 nm Ti layer. Then the substrates were rinsed with Milli-Q $H_2O$ and dried with $N_2$.

Tapping mode AFM (TMAFM) images. All etched metal nanostructures were imaged under ambient conditions in tapping mode using a Nanoscope IIIa (Digital Instruments, Santa Barbara, Calif.).

Results and Discussion for Part IV

1. Au, Ag and Pd Nanostructures in a Variety of Shapes and Sizes

The working examples are further described. Dip-pen nanolithography (DPN) printing can be used to generate nanostructures of arbitrary size and shape comprising a monolayer of organic molecules adsorbed to an underlying substrate (e.g. alkanethiols on gold).[9] The as-deposited nanostructures can be used as resists to prevent the underlying Au from being etched when the substrate is immersed into a ferri/ferrocyanide-based Au etchant. In other references, using monolayers of mercaptohexadecanoic acid (MHA) generated by DPN as etch resists, it was demonstrated to generate sub-50 nm Au dot arrays,[22] 12-nm gaps between Au lines[22] and arrays of sub-100 nm Au lines[20,23] on a Si/$SiO_x$ substrate. Herein, additional embodiments are described to include Ag and Pd, and show that nanostructures of a wide variety of shape can be fabricated with DPN using related approaches.

As proof-of-concept, corral structures made of successively increasing diameter dots (85-185 nm) were fabricated on Au-coated Si/$SiO_x$ with a Ti adhesion layer, FIGS. 13A and 13B. The diameter of each resulting gold nanostructure was controlled by adjusting the tip-substrate contact time (3.2 s:185 nm, 1.6 s:135 nm, 0.8 s:100 nm, and 0.4 s:85 nm, respectively) during the deposition of the MHA resist layers. Circular structures with sub-100 nm line widths also could be generated, by drawing a circular structure made of MHA (writing speed=0.31 µm/s) with subsequent wet etching (see Experimental Section), FIG. 13C-E. In general, the MHA features are typically a little larger than the resulting metal structures. The magnitude of the difference depends upon how small the desired features are. Typically, small structures (sub-100 nm) lead to relatively larger differences between the size of the MHA resist structure and the metallic nanostructure that is generated in the wet-chemical etching process. Although the present invention is not limited by theory, perhaps the edge-etching effects become more important for the smaller structures which have larger edge to bulk ratios. Similar effects have been observed with respect to adsorbate exchange; exchange occurs considerably faster at features edges as compared with their interiors.[32] Finally, according to the literature,[33] MHA is not an optimum resist layer for etching structures generated by micro-contact printing (µCP). Although the present invention is not limited by theory, the reason for this may be that generally DPN-generated structures are more like bulk-solution deposited SAMs[9] whereas µCP structures are often less dense and non-uniform. Therefore, it is preferential to use hydrophobic resist layers like octadecanethiol (ODT) in the case of resist layers fabricated by µCP.

Triangular structures also can be fabricated using the DPN-generated resist layers combined with wet-chemical etching. However, if one wants open triangular structures, writing speed is important and can be made relatively fast to avoid MHA diffusion into the interior of the structure, FIG. 14. For example open structures with a fixed 100 nm line-width but with variable edge lengths (250-700 nm) could be generated by moving the tip at a rate of 1.25 µm/s during the DPN experiment. However, if slower writing speeds were used, the resulting triangles often would be filled structures, presumably because the MHA diffuses too quickly under these conditions and fills the triangle etch resist structure, FIG. 14B (top right and lower left corners). In some cases, rounded structures were observed as well, again presumably because of rapid diffusion of the MHA resist under the conditions employed to generate the nanostructures. Also, for particularly small triangular structures, even the 1.25 µm/s writing rate resulted in the formation of filled rather than open triangles, FIG. 14B (lower right corner).

Figure 15:
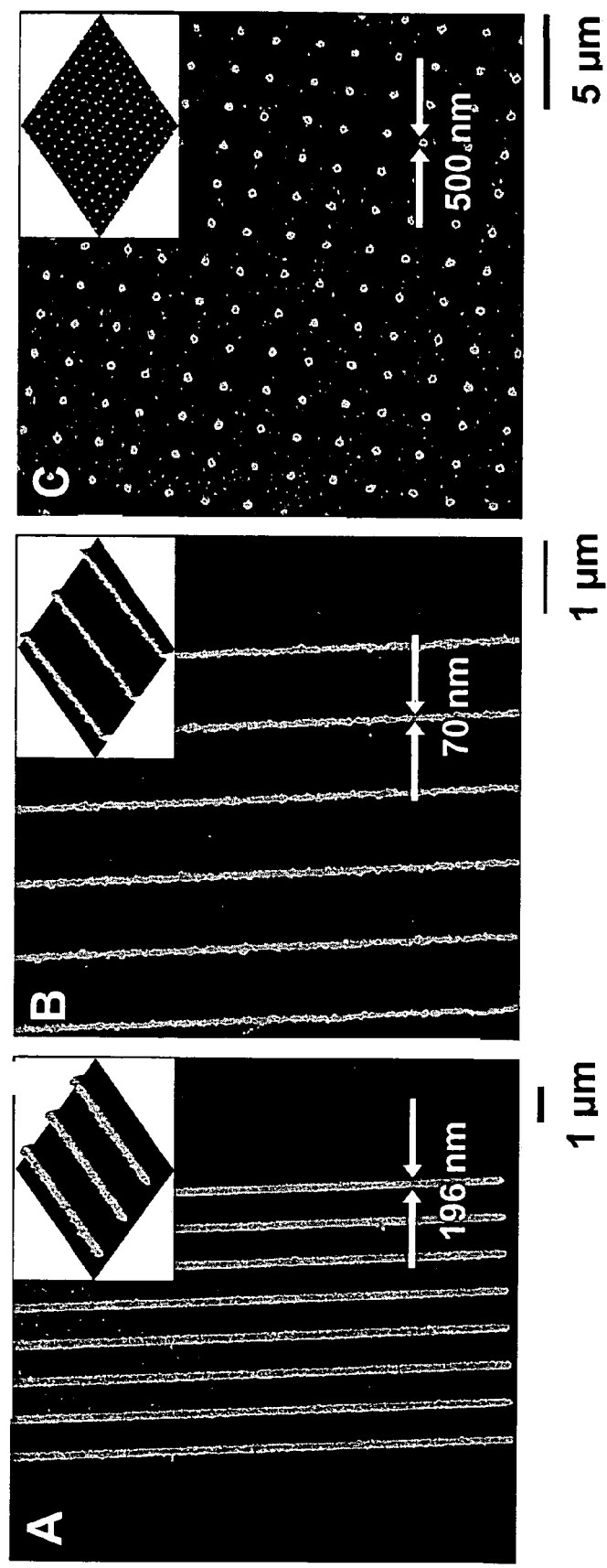
FIG. 15. TMAFM images of etched Ag nanostructures on a Si/SiO$_x$ substrate. (A, B) Line arrays, insert: high-resolution 3D image. The writing speed of the MHA-coated tip on the Ag substrate was 0.10 (A) and 0.20 μm/s (B). (C) Dot array, insert: 3D image. The contact time between the MHA-coated tip and the Ag substrate was 5 s.
Figure 16:
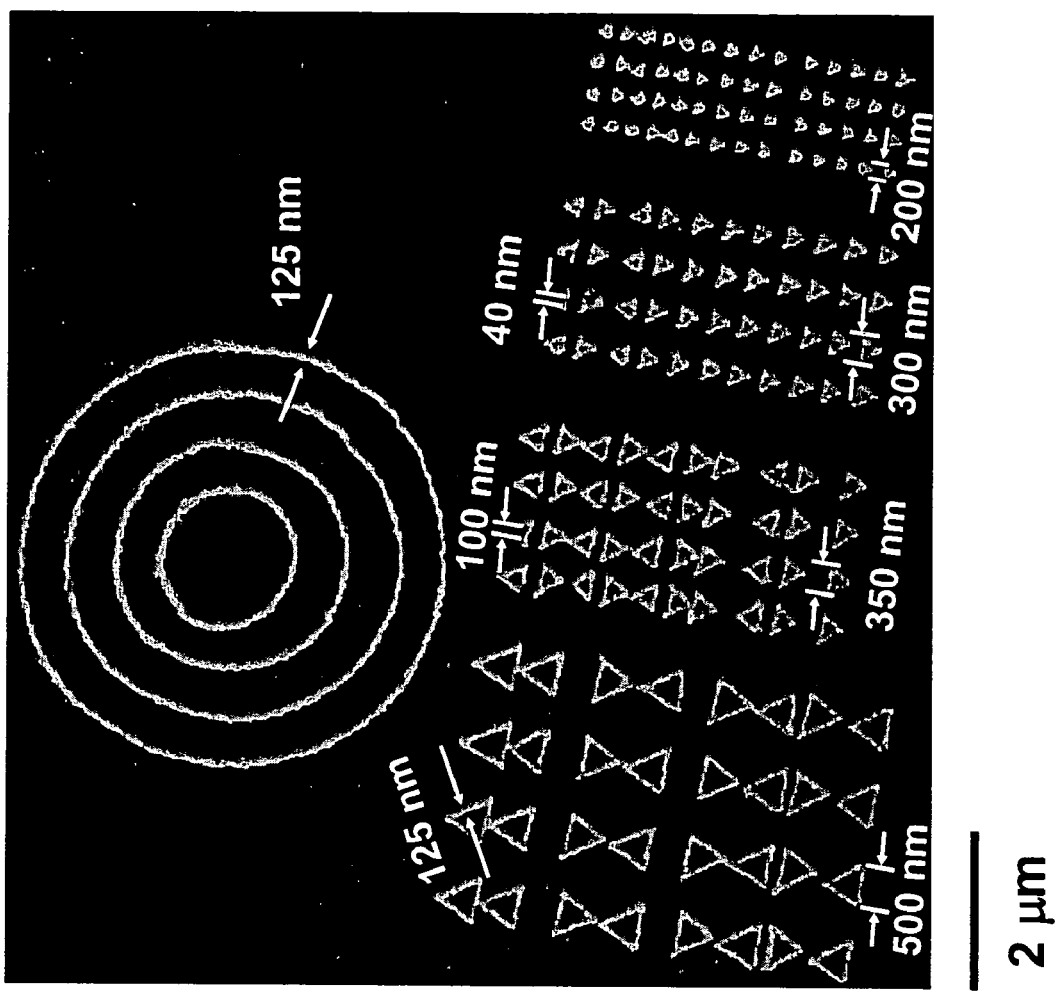
FIG. 16. TMAFM images of etched Ag nanostructures of triangles and circles on a Si/SiO$_x$ substrate. With a writing speed of a MHA-coated tip on a Ag substrate=0.13 μm/s, four Ag nanocircles and four kinds of Ag nanotriangles with 125 nm line width were obtained after etching the exposed Ti/Ag films. The edge lengths of Ag triangles are 500, 350, 300 and 200 nm, respectively. When the edge length of Ag triangles decreased to 200 nm, the shape of the triangle was irregular due to MHA diffusion. The interior hollow was decreased with decreasing edge length.

A related strategy can be used to generate nanostructures of Ag and Pd. Alkanethiols can form SAMs on Ag[34] and Pd[35] substrates. These SAMs patterned by µCP also can be used as etch resists, and they have been used by others to generate micron scale structures made of such metals[30,31,36] (170 nm Pd nanowires have been generated by µCP-patterned with an eicosanethiol SAM as an etch resist for Pd).[37] By using the DPN based approach to draw line and dot arrays of MHA structures on silver, wet-chemical etching was used to generate high quality sub-100 nm to 500 nm structures, FIG. 15. Feature size correlates well with writing speed when 196 and 70 nm wide lines were generated at writing speeds of 0.10 and 0.20 µm/s, respectively (FIGS. 15A and 15B). In general the sub-100 nm lines generated on Ag are less uniform than on Au,[20,23] primarily because the gold grains on the substrates studied are smaller (25-45 nm, RMS=0.895 nm for 3×3 µm$^2$) and more uniform than the silver grains (40-140 nm, RMS=1.413 nm for 3×3 µm$^2$). As with Ag dot arrays (500 nm diameter and 2 µm inter-feature distance (FIG. 15C), Ag triangles, and circles (FIG. 16) all could be fabricated using similar procedures and the appropriate resist structures drawn by DPN.

Figure 17:
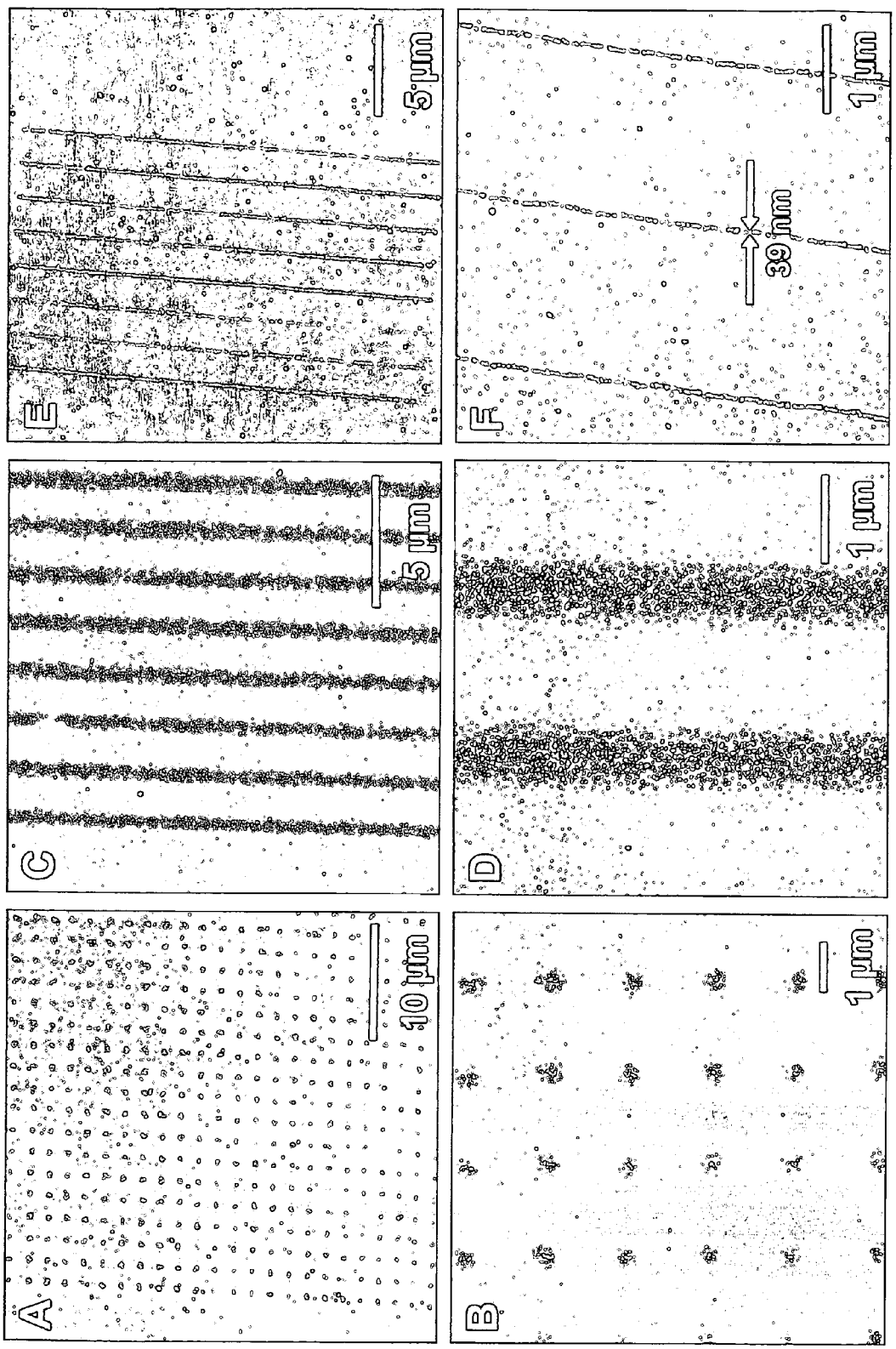
FIG. 17. TMAFM images of etched Pd nanostructures on a Si/SiO$_x$ substrate. (A, B) Dot arrays with MHA as a resist (2 s holding time of a MHA-coated tip on a Pd surface), and (C, D) line arrays with MHA as a resist (writing speed=0.13 μm/s). (E, F) Line arrays with ODT as a resist (writing speed=0.13 μm/s).

With Pd, two different resist layers were studied, MHA and ODT. When MHA was used as a resist, Pd nanostructures could be generated, but all of the features were non-uniform and discontinuous in structure, FIGS. 17A-D. Although the present invention is not limited by theory, the reason for this may be that the carboxylic acid terminal groups attract the FeCl$_3$ based etchant, resulting in partial etching of the resist-coated areas. For example, if one looks at the high resolution image of the array of 500 nm dots, one can see that each dot is made up of a series of discontinuous smaller structures, FIGS. 17A and 17B. The same is true for ~600 nm wide lines, FIGS. 17C and 17D. Consistent with this hypothesis, when ODT, which results in hydrophobic monolayers, is used as the resist layer, more uniform structures are formed, FIGS. 17E and 17F. With ODT as a resist layer, relatively uniform lines as narrow as 39 nm could be generated via wet chemical etching, FIGS. 17E and 17F. Note that because the alkanethiol monolayers formed on Pd are less stable in air[35] than those formed on Au and Ag, one should work quickly with these materials and minimize air exposure. Finally, because a negatively charged etchant in the case of Ag and Au (ferri/ferrocyanide) was used, a similar effect with MHA as the resist is not seen.

This part shows how one can use DPN printing to fabricate metallic (e.g., Au, Ag and Pd) nanopatterns on a Si/SiO$_x$ surface with control over feature size, inter-feature distance, and shape. Sub-100 nm to 500 nm structures can be easily generated on all of the substrates studied. Both mercaptohexadecanoic acid (MHA) and octadecanethiol (ODT) can be used as resist layers. In the case of Pd, ODT is the superior resist layer because it is more efficient at inhibiting access of the FeCl$_3$ etchant to the underlying metal surface. Control at the nanometer length scale with these materials allows one skilled in the art to construct all sorts of optically and electrically interesting nanostructures that rely on feature size and inter-feature distance. This is especially true in the case of Au and Ag for those interested in studying surface-plasmon coupling and plasmonic wires.[28]

The following references are incorporated by reference in their entirety.

LISTING OF REFERENCES (B)

(1) Park, S. J.; Taton, T. A.; Mirkin, C. A. *Science* 2002, 295, 1503.

(2) (a) Jin, R.; Cao, Y.; Mirkin, C. A.; Kelly, K. L.; Schatz, G. C.; Zheng, J. G. *Science* 2001, 294, 1901. (b) Cao, Y.; Jin, R.; Mirkin, C. A. *J. Am. Chem. Soc.* 2001, 123, 7961.

(3) (a) Elghanian, R.; Storhoff, J. J.; Mucic, R. C.; Letsinger, R. L.; Mirkin, C. A. *Science* 1997, 277, 1078. (b) Taton, T. A.; Mirkin, C. A.; Letsinger, R. L. *Science* 2000, 289, 1757. (c) Bogunia-Kubik, K.; Sugisaka, M. *Biosystems* 2002, 65, 123.

(4) Muller, W. T.; Klein, D. L.; Lee, T.; Clarke, J.; Mceuen, P. L.; Schultz, P. G. *Science* 1995, 268, 272. (b) Li, X. M.; Paraschiv, V.; Huskens, J.; Reinhoudt, D. N. *J. Am. Chem. Soc.* 2003, 125, 4279.

(5) see a review: Wallraff, G. M.; Hinsberg, W. D. *Chem. Rev.* 1999, 99, 1801 and references therein.

(6) Chou, S. Y. *MRS Bull.* 2001, 26, 512.

(7) (a) Xia, Y.; Whitesides, G. M. *Angew. Chem. Int. Ed.* 1998, 37, 550. (b) Xia, Y.; Rogers, J. A.; Paul, K. E.; Whitesides, G. M. *Chem. Rev.* 1999, 99, 1823.

(8) Liu, G. Y.; Xu, S.; Qian, Y. L. *Acc. Chem. Res.* 2000, 33, 457.

(9) (a) Piner, R. D.; Zhu, J.; Xu, F.; Hong, S.; Mirkin, C. A. *Science* 1999, 283, 661. (b) Hong, S.; Zhu, J.; Mirkin, C. A. *Science* 1999, 286, 523. (c) Hong, S.; Mirkin, C. A. *Science* 2000, 288, 1808. (d) Ginger, D. S.; Zhang, H.; Mirkin, C. A. *Angew. Chem. Int. Ed.* in press.

(10) (a) Service, R. F. *Science* 2002, 298, 2322. (b) Zhang, M.; Bullen, D.; Chung, S. W.; Hong, S.; Ryu, K. S.; Fan, Z. F.; Mirkin, C. A.; Liu, C. *Nanotechnology* 2002, 13, 212.

(11) (a) Cheung, C. L.; Carnarero, J. A.; Woods, B. W.; Lin, T.; Johnson, J. E.; De Yoreo, J. J.; *J. Am. Chem. Soc.* 2003, 125, 6848. (b) Wang, X. F.; KRyu, K. S.; Bullen, D. A.; Zou, J.; Zhang, H.; Mirkin, C. A.; Liu C. *Langmuir* 2003, 19, 8951. (c) Pena, D. J.; Raphael, M. P.; Byers J. F. *Langmuir* 2003, 19, 9028. (d) Jung, H.; Kulkarni, R. Collier C. P. *J. Am. Chem. Soc.*, 2003, 125, 12096.

(12) McKendy, R.; Huck, W. T. S.; Weeks, B.; Florini, M.; Abell, C.; Rayment, T. *Nano Lett.* 2002, 2, 713.

(13) (a) Maynor, B. W.; Filocamo, S. F.; Grinstaff, M. W.; Liu, J. *J. Am. Chem. Soc.* 2002, 124, 522. (b) Lim, J. H.; Mirkin, C. A. *Adv. Mater.* 2002, 14, 1474. (c) Noy, A.; Miller, A. E.; Klare, J. E.; Weeks, B. L.; Woods, B. W.; De Yoreo, J. J. *Nano Lett.* 2002, 2, 109.

(14) Demers, L. M.; Ginger, D. S.; Park, S. J.; Li, Z.; Chung, S. W.; Mirkin, C. A. *Science* 2002, 296, 1836.

(15) (a) Wilson, D. L.; Martin, R.; Hong, S.; Cronin-Golomb, M.; Mirkin, C. A.; Kaplan, D. L. *Proc. Natl. Acad. Sci. U.S.A.* 2001, 98, 13660. (b) Lee, K. B.; Lim, J. H.; Mirkin, C. A. *J. Am. Chem. Soc.* 2003, 125, 5588. (c) Lim, J. H.; Ginger, D. S.; Lee, K. B.; Heo, J.; Nam, J. M.; Mirkin, C. A. *Angew. Chem. Int. Ed.* 2003, 42, 2309. (d) Agarwal, G.; Naik, R. R.; Stone, M. O. *J. Am. Chem. Soc.* 2003, 125, 7408.

(16) Agarwal, G.; Sowards, L. A.; Naik, R. R.; Stone, M. O. *J. Am. Chem. Soc.* 2003, 125, 580.

(17) Ben Ali, M.; Ondarcuhu, T.; Brust, M.; Joachim, C. *Langmuir* 2002, 18, 872.

(18) Su, M.; Liu, X. G.; Li, S. Y.; Dravid, V. P.; Mirkin, C. A. *J. Am. Chem. Soc.* 2002, 124, 1560.

(19) (a) Li, Y.; Maynor, B. W.; Liu, J. *J. Am. Chem. Soc.* 2001, 123, 2105. (b) Maynor, B. W.; Li, Y.; Liu, J. *Langmuir* 2001, 17, 2575. (c) Porter, L. A.; Choi, H. C.; Schmeltzer, J. M.; Ribbe, A. E.; Elliott, L. C. C.; Buriak, J. M. *Nano Lett.* 2002, 2, 1369.

(20) Zhang, H.; Li, Z.; Mirkin, C. A. *Adv. Mater.* 2002, 14, 1472.

(21) Xia, Y.; Zhao, X. M.; Kim, E.; Whitesides, G. M. *Chem. Mater.* 1995, 7, 2332.

(22) Zhang, H.; Chung, S. W.; Mirkin, C. A. *Nano Lett.* 2003, 3, 43.

(23) Zhang, H.; Lee, K. B.; Li, Z.; Mirkin, C. A. *Nanotechnology* 2003, 14, 1113.

(24) Weinberger, D. A.; Hong, S.; Mirkin, C. A.; Wessels, B. W.; Higgins, T. B. *Adv. Mater.* 2000, 12, 1600.

(25) (1) Haes, A. J.; Van Duyne, R. P. *J. Am. Chem. Soc.* 2002, 124, 10596. (2) Haynes, C. L.; Van Duyne, R. P. *J. Phys. Chem. B* 2001, 105, 5599. (3) Jin, R.; Cao, Y.; Mirkin, C. A.; Kelly, K. L.; Schatz, G. C.; Zheng, J. G. *Science* 2001, 294, 1901. (4) Xia, Y.; Yang, P.; Sun, Y.; Wu, Y. Y.; Mayers, B.; Gates, B.; Yin, Y. D.; Kim, F.; Yan, Y. Q. *Adv. Mater.* 2003, 15, 353.

(26) (1) Yeung, L. K.; Crooks, R. M. *Nano Lett.* 2001, 1, 14. (2) Dominguez-Quintero, O.; Martinez, S.; Henriquez, Y.; D'Omelas, L.; Krentzien, H.; Osuna, J. *J. Mol. Catal. A* 2003, 197, 185. (3) Sarkany, A.; Revay, Z. *Appl. Catal. A* 2003, 243, 347.

(27) (a) Felidj, N.; Aubard, J.; Levi, G.; Krenn, J. R.; Salerno, M.; Schider, G.; Lamprecht, B.; Leitner, A.; Aussenegg, F. R. *Phys. Rev. B* 2002, 65, 075419. (b) Gearheart, L. A.; Ploehn, H. J.; Murphy, C. J. *J. Phys. Chem. B* 2001, 105, 12609.

(28) (a) Krenn, J. R.; Dereux, A.; Weeber, J. C.; Bourillot, E.; Lacroute, Y.; Goudonnet, J. P.; Schider, G.; Gotschy, W.; Leitner, A.; Aussenegg, F. R.; Girard, C. *Phys. Rev. Lett.* 1999, 82, 2590. (b) Malinsky, M. D.; Kelly, K. L.; Schatz, G. C.; Van Duyne, R. P. *J. Am. Chem. Soc.* 2001, 123, 1471.

(29) (a) He, H. X.; Zhu, J. S.; Tao, N. J.; Nagahara, L. A.; Amlani, I.; Tsui, R. *J. Am. Chem. Soc.* 2001, 123, 7730. (b) Bogozi, A.; Lam, O.; He, H. X.; Li, C. Z.; Tao, N. J.; Nagahara, L. A.; Amlani, I.; Tsui, R. *J. Am. Chem. Soc.* 2001, 123, 4585. (c) Donhauser, Z. J.; Mantooth, B. A.; Kelly, K. F.; Bumm, L. A.; Monnell, J. D.; Stapleton, J. J.; Price, D. W.; Rawlett, A. M.; Allara, D. L.; Tour, J. M.; Weiss, P. S. *Science* 2001, 292, 2303. (d) Chen, J.; Reed, M. A.; Rawlett, A. M.; Tour, J. M. *Science* 1999, 286, 1550.

(30) Xia, Y.; Kim, E.; Whitesides, G. M. *J. Electrochem. Soc.* 1996, 143, 1070.

(31) Wolfe, D. B.; Love, J. C.; Paul, K. E.; Chabinyc, M. L.; Whitesides, G. M. *Appl. Phys. Lett.* 2002, 80, 2222.

(32) Ivanisevic, A.; McCumber, K. V.; Mirkin, C. A. *J. Am. Chem. Soc.* 2002, 124, 11997.

(33) Kumar, A.; Biebuyck, H. A.; Whitesides, G. M. *Langmuir* 1994, 10, 1498.

(34) (a) Laibinis, P. E.; Whitesides, G. M. *J. Am. Chem. Soc.* 1992, 114, 1990. (b) Laibinis, P. E.; Whitesides, G. M.; Allara, D. L.; Tao, Y. T.; Parikh, A. N.; Nuzzo, R. G. *J. Am. Chem. Soc.* 1991, 113, 7152.

(35) Love, J. C.; Wolfe, D. B.; Haasch, R.; Chabinyc, M. L.; Paul, K. E.; Whitesides, G. M.; Nuzzo, R. G. *J. Am. Chem. Soc.* 2003, 125, 2597.

(36) Love, J. C.; Wolfe, D. B.; Chabinyc, M. L.; Paul, K. E.; Whitesides, G. M. *J. Am. Chem. Soc.* 2002, 124, 1576.

(37) Carvalho, A.; Geissler, M.; Schmid, H.; Michel, B.; Delamarche, E. *Langmuir* 2002, 18, 2406.

Part V

In further embodiments, the invention also provides biofunctionalized nanoarrays of inorganic structures prepared by DPN printing. A DPN-based strategy for fabricating and functionalizing Au nanostructures on a semiconductor substrate is described. The generation of arrays of nanoscale features functionalized with inorganic nanoparticles and proteins (e.g., rabbit IgG) is described. In the case of rabbit IgG, the bioactivity of the array was demonstrated by monitoring its reaction with fluorophore-labeled anti-rabbit IgG. The methodology described herein can be used for making raised optically active and bioactive nanostructures that can be useful in stamping methodologies or biosensing applications. Peptides and proteins which can be used are further described in, for example, U.S. Patent Publication 2003/0068446 to Mirkin et al. (Apr. 10, 2003) cited above.

Methods for fabricating nanostructures are important for developing and capitalizing upon the emerging field of nanoscience and nanotechnology. In particular, methods are needed that offer the capability of working with both hard and soft matter on the sub-100 mm to many micrometer length scale. Several methods, such as e-beam lithography [1], ion beam lithography [2] and nanoimprint lithography [3] offer one the ability to build hard structures on this length scale, but they do not allow one to deposit molecule-based nanostructures directly on a surface. Microcontact printing (µCP) [4] allows one to directly deposit molecules onto a surface in massively parallel fashion, but it does not allow one to generate structures made of different inks with nanoscale registration capabilities. Dip-pen nanolithography (DPN) printing [5] has emerged as a tool that allows one to make multicomponent nanostructures on a surface with near-perfect registration capabilities. Although it does not offer the massively parallel capabilities of photolithography [1] and some of the stamping methods [4], it has been transformed into a parallel writing tool through the use of cantilever arrays consisting of multiple pens [5c, 6]. This makes DPN an important tool that can be used to fabricate both hard and soft structures with nanoscale precision.

Inorganic nanostructures functionalized with biomolecules are used in biodiagnostics [7] and in other areas, including materials synthesis [8], optics [9], and electronics [10]. Nanostructures functionalized with oligonucleotides [7, 11] and proteins [12] have been shown to be particularly useful in the development of high sensitivity and selectivity detection systems for DNA, small molecules, and protein structures.

In other manuscripts [13], a method for fabricating arrays of Au nanostructures on a $SiO_x$/Si surface based on DPN and wet chemical etching [14] was described. Herein, etched Au nanopatterns, created via this methodology, are shown which can be used as templates to adsorb and/or assemble Au nanoparticles and proteins from solution to form functionalized inorganic/biological nanostructures. These structures can be used for their optical and biological sensing capabilities.

WORKING EXAMPLE

Figure 18:
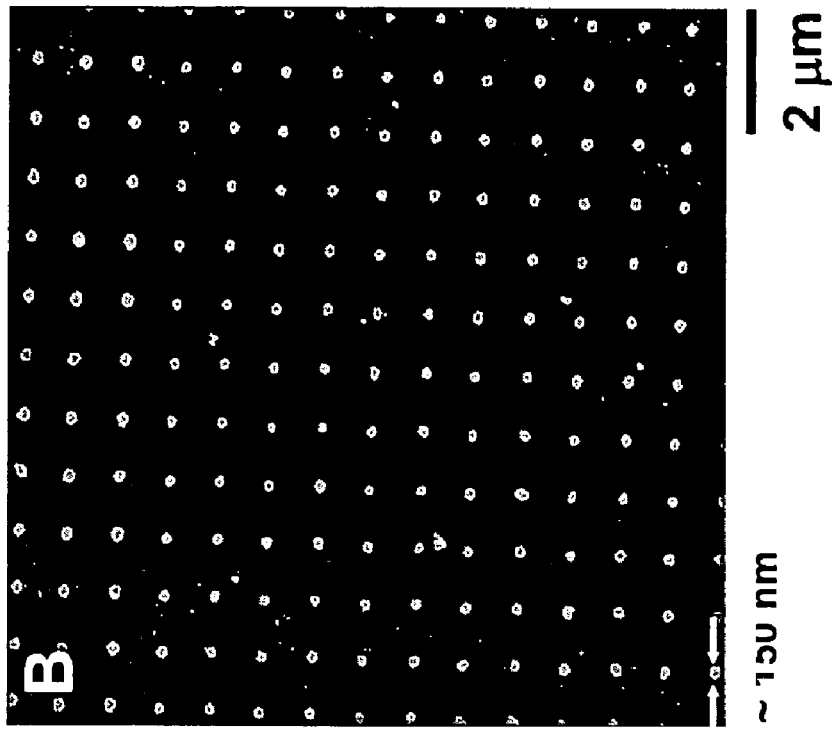
FIG. 18. TMAFM topographic images of the etched MHA/Au/Ti/SiO$_x$/Si nanostructures, lines (A) and dots (B), based on DPN of MHA on an Au surface.
Figure 18:
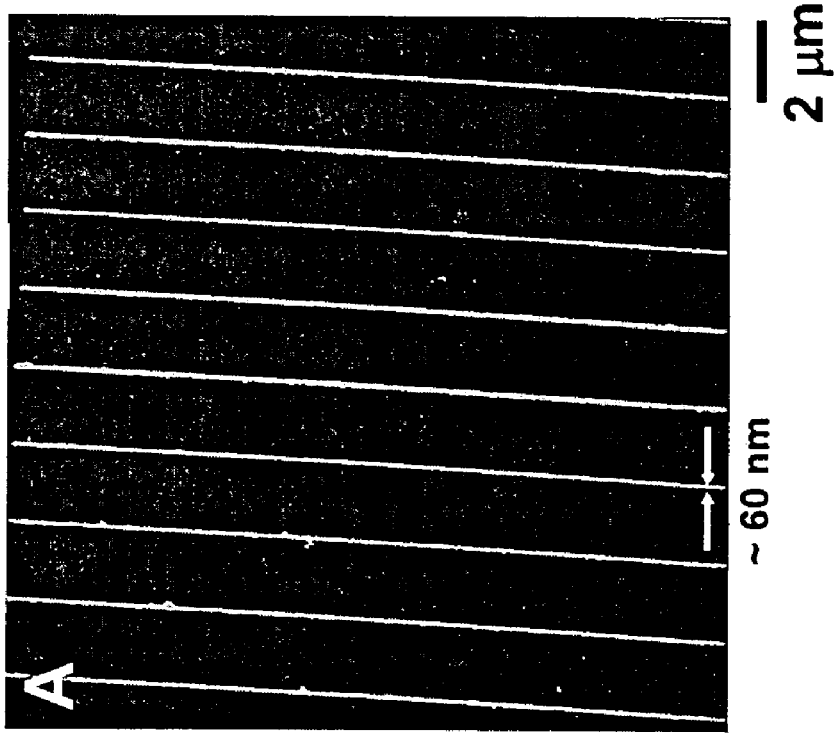
Figure 19:
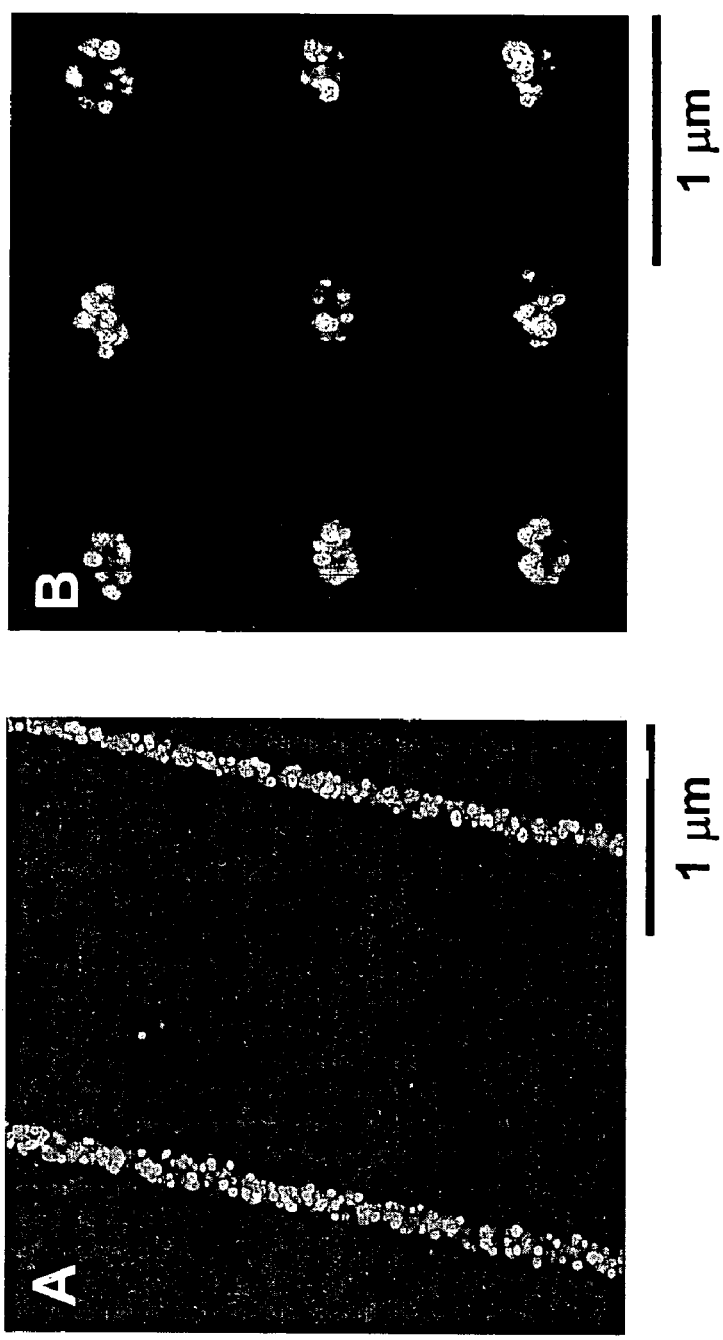
FIG. 19. TMAFM topographic images of Au-nanoparticle adsorbed on NH$_2$—SAM-modified nanopatterns of lines (A) and dots (B).
Figure 19:
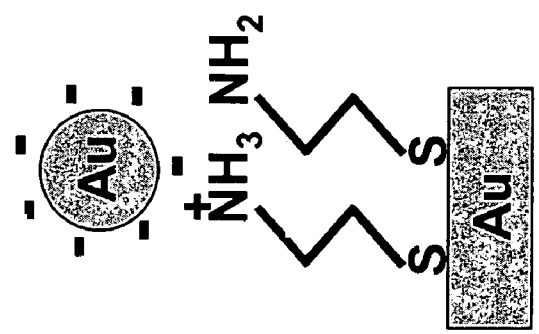
Figure 20:
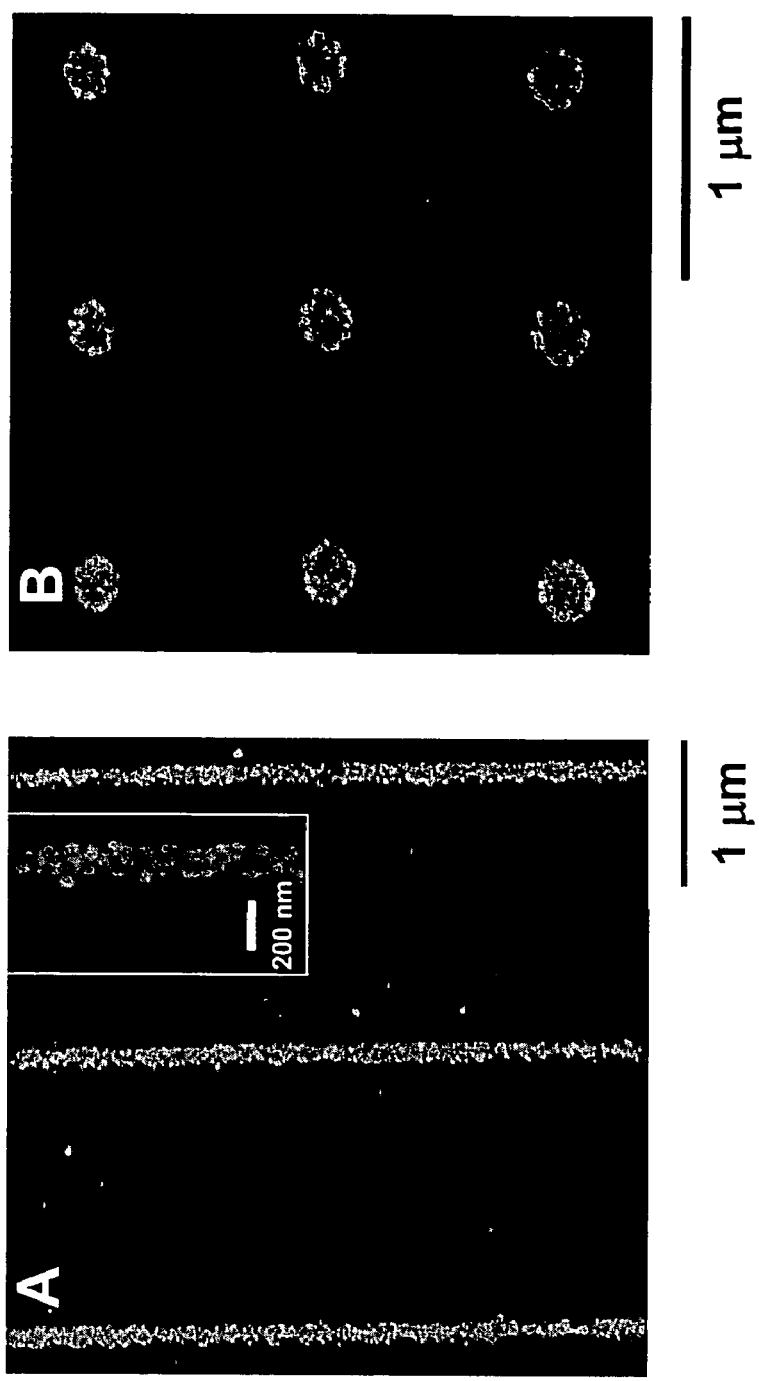
FIG. 20. TMAFM topographic images of Au-nanoparticle adsorbed on HS-SAM-modified nanopatterns of lines (A, high-resolution image inserted) and dots (B).
Figure 20:
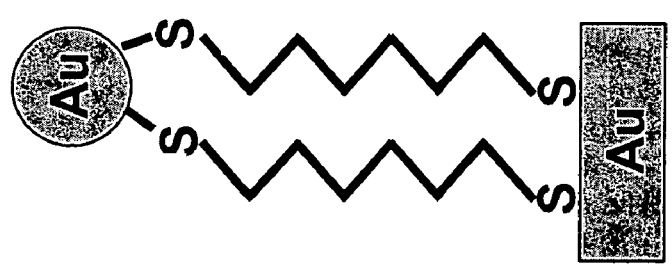
Figure 21:
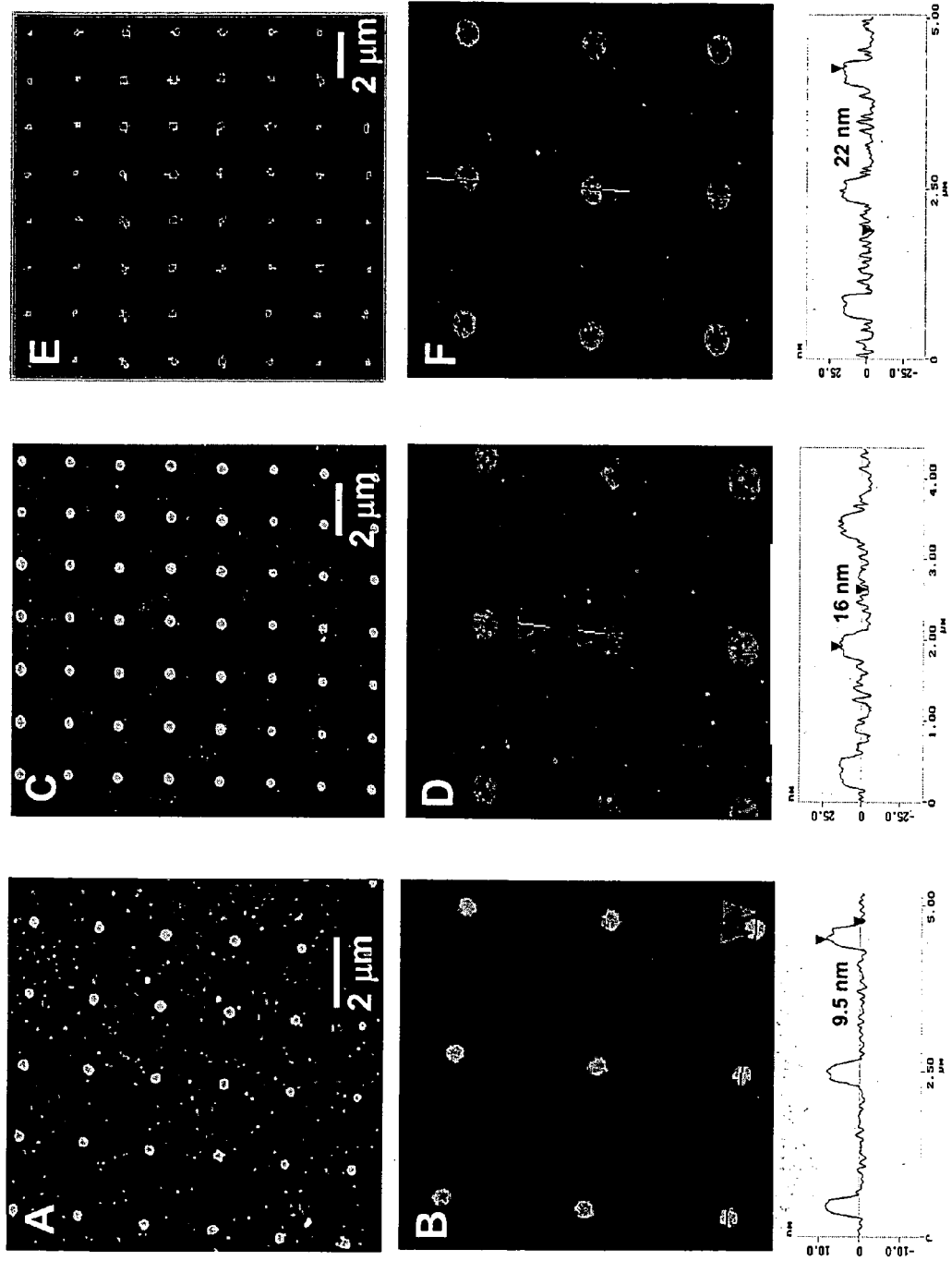
FIG. 21. TMAFM topographic image of etched MHA/Au/Ti/SiO$_x$/Si (A, SiO$_x$ passivated by OTS; B: high-resolution image and section analysis), and rabbit IgG adsorbed on MHA SAM on the etched dot nanoarrays (C, D: high-resolution image and section analysis). Fluorescence image (E) and high-resolution TMAFM image and section analysis (F) of fluorophore (TRITC)-labeled anti-rabbit IgG adsorbed on IgG nanoarrays.

In a typical experiment, a substrate suitable for patterning experiments was prepared by thermally evaporating 8-10 nm of Au on a Ti-coated (1 nm) oxidized silicon (about 500 nm of oxide) substrate (pressure<$1 \times 10^{-7}$ MBar). These fresh Au substrates were then patterned with MHA by DPN according to literature procedures [5, 13]. A MHA-coated tip was prepared by immersing a commercial $Si_3N_4$ tip (spring constant=0.05 N/m, TM Microscopes, Sunnyvale, Calif.) into a 5 mM MHA acetonitrile solution for about 15 s and then drying it with compressed difluoroethane (Dust-off, Ted Pella, Inc., Redding, Calif.). The DPN experiments were carried out under ambient conditions (set point=0.5 nN, 22-24° C., 30-36% relative humidity) by using an AutoProbe CP AFM (TM Microscopes, Sunnyvale, Calif.) and commercial lithography software (DPNWrite™, DPN System$^{-1}$, NanoInk Inc., Chicago, Ill.) with a MHA-coated tip. Each DPN dot feature was generated by holding a MHA-coated tip in contact with an Au surface for 0.25 s (FIGS. 18B, 19B and 20B) and 3.5 s (FIG. 21), and each line was generated by moving a MHA-coated tip on an Au surface at a rate of 1 µm/s (FIGS. 18A, 19A and 20A).

Figure 22:
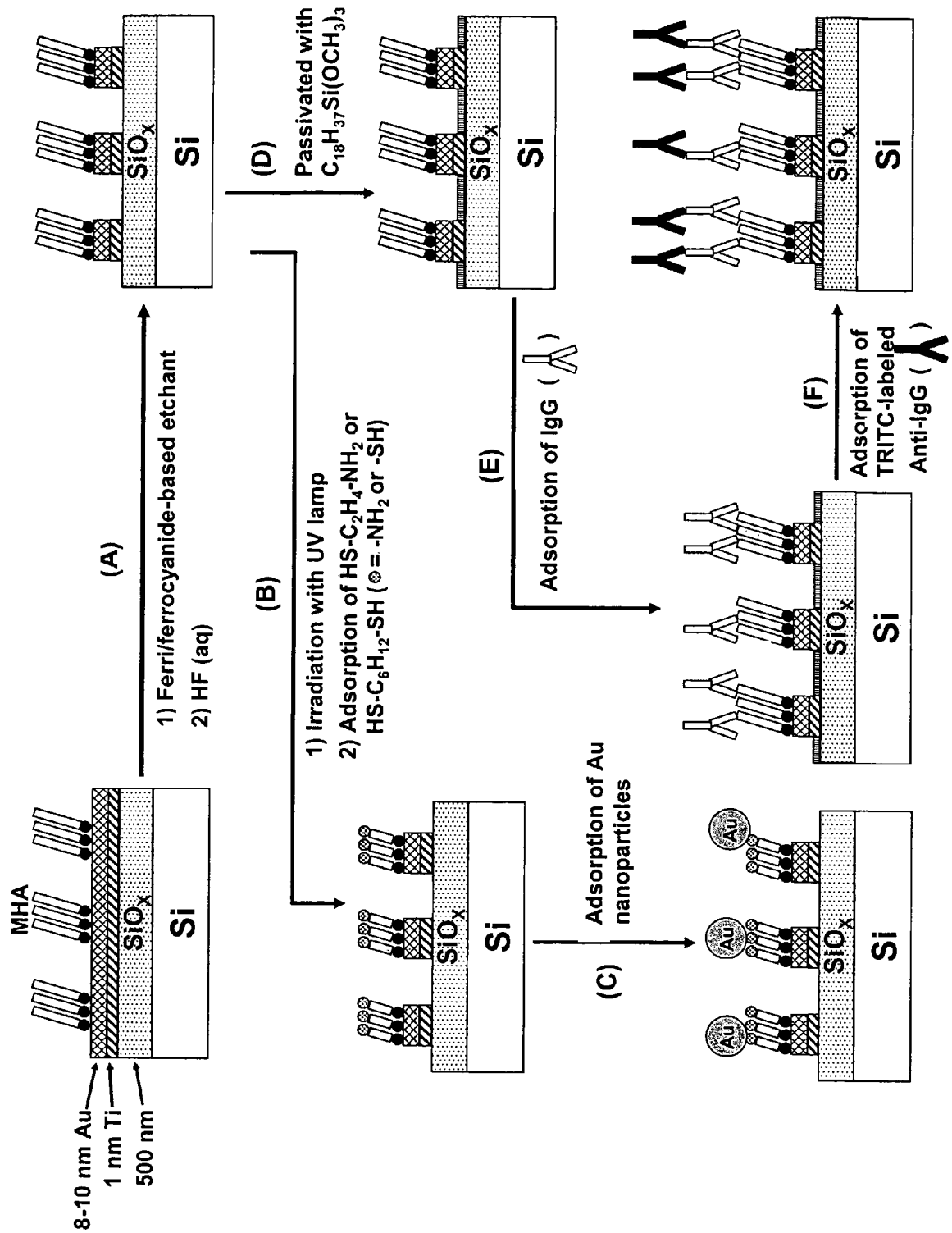
FIG. 22. Overview of reaction scheme, steps A-F.

The ferri/ferrocyanide etchant used in this experiment, was prepared by mixing 0.1 M $Na_2S_2O_3$, 1.0 M KOH, 0.01 M $K_3Fe(CN)_6$ and 0.001 M $K_4Fe(CN)_6$ in a 1:1:1:1 (v:v:v:v) ratio. After being patterned with MHA, the Au substrates were immersed in the ferri/ferrocyanide etching solution for about 20 min under constant stirring to remove the exposed Au areas. Then they were treated with 0.5% aqueous HF (obtained by diluting 48% HF (Aldrich)) for 15-30 s to remove the Ti layers [13], step A in FIG. 22. After rinsing with Milli-Q H$_2$O and drying with N$_2$, the MHA-modified Au nanopatterns of lines and dots were characterized by tapping mode AFM (TMAFM) (Nanoscope IIIa, Digital Instruments, Santa Barbara, Calif.), FIG. 18. The distances between the lines (FIG. 18A) and dots (FIG. 18B) are 2 and 1 µm, respectively. The width of the Au lines (FIG. 18A) and the diameter of the Au dots (FIG. 18B) are about 60 and 150 nm, consistent with literature values for similar experiments [13a].

To remove the monolayer "etch resist", the etched substrate was irradiated with a UV lamp (365 nm, 21.7 mW/cm$^2$, B-100AP, Fisher Scientific, Pittsburgh, Pa.) for about 10 h. It is known that UV-irradiation of an alkylthiol coated Au substrate under ambient conditions results in photo-oxidation of the surface-bound monolayer and its desorption from the surface, if immersed in the appropriate solvent [15]. After removing the oxidized MHA SAM by rinsing with water, the fresh Au nanostructures can be functionalized with other thiol-containing molecules, step B in FIG. 22. Two kinds of thiol functionalized molecules, 2-aminoethanethiol (HS—C$_2$H$_4$—NH$_2$) (AET) and 1,6-hexanedithiol (HS—C$_6$H$_{12}$—SH) (HDT) (Aldrich), were used to modify these fresh Au nanopatterns. After immersing the Au nanopatterns in a 1.0 mM ethanolic solution of AET or HDT for 24 h, amino (NH$_2$) or thiol (HS)-terminated SAMs formed on the Au nanofeatures. These structures can be used to assemble additional nanostructures by electrostatic or covalent interactions to form Au-nanoparticle arrays, step C in FIG. 22. For example, after immersing the array of AET-modified nanostructures into a solution of citrate-stabilized gold nanoparticles (~15 nm, ~15 nM) [8b, 16] for ~10 h, with subsequent rinsing with Milli-Q water, a monolayer of Au particles localized on each of the nanofeatures within the array, FIG. 19. The TMAFM measured height of the individual Au nanoparticles was ~15 nm and in excellent agreement with the TEM-measured diameter of Au nanoparticles that comprise the colloid. This observation is also consistent with the conclusion that the MHA monolayers on each of the nanofeatures has been removed and replaced with AET. Magnesium oleate capped Au particles (~15 nm, ~10 nM) [17], were used to modify the SH-rich surface of HDT-SAM modified nanofeatures, FIG. 20. In both cases, collections of individual Au nanoparticles on the Au nanofeatures are observed with very little nonspecific binding to the underlying silicon oxide substrate.

Protein arrays of elevated Au nanofeatures also can be fabricated via modification of the aforementioned approach. To inhibit nonspecific adsorption of the protein on the exposed SiO$_x$ layer of the etched substrate, an array of MHA-coated nanofeatures was initially immersed into a 0.5-2% (w/w) n-octadecyltrimethoxysilane (OTS)/toluene solution for 1.5 h [18], step D in FIG. 22. OTS is known to chemisorb to silicon oxide [18]. After rinsing with toluene and drying with N$_2$, the MHA-modified Au patterns were characterized by TMAFM, FIGS. 21A-B. The height and diameter of each dot within the array are about 9.5 and 340 nm, respectively. The resulting set of nanostructures then can be used as a template to adsorb proteins to form a protein nanoarray. As proof-of-concept, an etched array of dot features was immersed into a 10 mM PBS buffer solution containing 10 µg/ml of rabbit IgG (pH about 7) for 45 min [19], step E in FIG. 22. The substrate was then rinsed with 10 mM PBS buffer, 0.05% Tween-20 solution and Milli-Q water, and immediately characterized by TMAFM. Rabbit IgG and the broad class of IgG proteins in general are known to have a high affinity for COOH-terminated SAMs at pH 7 and a relatively weak affinity for hydrophobic surfaces coated with alkanesilane as compared to the carboxylic acid-terminated surfaces [20]. TMAFM images, FIG. 21C-D, show an increase in height of 6.5 nm, which is consistent with the formation of an IgG monolayer on the dot arrays [19]. In order to test the bioactivity of the IgG array, the sample was immediately immersed into a 10 mM PBS buffer solution of fluorophore (TRITC)-labeled anti-rabbit IgG (10 µg/ml) (pH about 7) for 1 h, step F in FIG. 22. After rinsing the substrate with 10 mM PBS buffer, 0.05% Tween-20 solution and Milli-Q water, confocal fluorescence microscopic image shows that the TRITC-labeled anti-rabbit IgG specifically binds to the IgG-immobilized nanofeatures, FIG. 21E. The TMAFM image shows that the height of this nanopattern increases by 6 nm, consistent with the adsorption of a monolayer of the anti-rabbit IgG [19], FIG. 21F.

Evidence for MHA on the etching patterns arises from a number of sources. For example, evidence can be found in the further experiments, for example, proteins adsorption, photochemically removing of the MHA and assembling DNA and other thiol compounds to adsorb Au nanoparticles). Also some literatures is consistent with the conclusion that thiol resists still remained, see, for example, (a) Geissler, M.; Schmid, H.; Bietsch, A.; Michel, B.; Delamarche, E. *Langmuir* 2002, 18, 2374. (b) Carvalho, A.; Geissler, M.; Schmid, H.; Michel, B.; Delamarche, E. *Langmuir,* 2002, 18, 2406. (c) Xia, Y.; Zhao, X. M.; Kim, E.; Whitesides, G. M. *Chem. Mater.* 1995, 7, 2332.

In summary, the invention provides a straightforward method for creating arrays of inorganic nanostructures that can be selectively modified with adsorbates that provide additional and desirable functionality. Importantly, using this strategy, one can use adsorbates like HDT and cysteamine, which are not easily transported via DPN, as modification agents for the structures fabricated in the DPN process.

LIST OF REFERENCES (C)

[1] see a review: Wallraff G M and Hinsberg W D 1999 *Chem. Rev.* 99 1801 and references therein

[2] (a) Albrecht M, Rettner C T, Moser A, Best M E and Terris B D 2002 *Appl. Phys. Lett.* 81 2875 (b) Kim Y S, Hong W, Woo H J, Choi H W, Kim G D, Lee J H and Lee S 2002 *Jpn. J. Appl. Phys.* 41 4141

[3] (a) Chou S Y 2001 *MRS Bull.* 26 512 (b) Behl M, Seekamp J, Zankovych S, Torres C M S, Zentel R and Ahopelto J 2002 *Adv. Mater.* 14 588

[4] (a) Xia Y and Whitesides G M 1998 *Angew. Chem. Int. Ed.* 37 551 (b) Xia Y, Rogers J A, Paul K E and Whitesides G M 1999 *Chem. Rev.* 99 1823

[5] (a) Piner R D, Zhu J, Xu F, Hong S and Mirkin C A 1999 *Science* 283 661 (b) Hong S, Zhu J and Mirkin C A 1999 *Science* 286 523 (c) Hong S and Mirkin C A 2000 *Science* 288 1808

[6] Service R F 2002 *Science* 298 2322

[7] (a) Elghanian R, Storhoff J J, Mucic R C, Letsinger R L and Mirkin C A 1997 *Science* 277 1078 (b) Taton T A, Mirkin C A and Letsinger R L 2000 *Science* 289 1757

[8] (a) Mirkin C A, Letsinger R L, Mucic R C and Storhoff J J 1996 *Nature* 382 607 (b) Li Z, Jin R, Mirkin C A and Letsinger R L 2002 *Nucleic Acids Res.* 30 1558

[9] (a) Jin R, Cao Y, Mirkin C A, Kelly K L, Schatz G C and Zheng J G 2001 *Science* 294 1901 (b) Cao Y, Jin R and Mirkin C A 2001 *J. Am. Chem. Soc.* 123 7961

[9] Park S J, Taton T A and Mirkin C A 2002 *Science* 295 1503

[11] Cao Y C, Jin R and Mirkin C A 2002 *Science* 297 1536

[12] Nam J M, Park S J and Mirkin C A 2002 *J. Am. Chem. Soc.* 124 3820
[13] (a) Zhang H, Li Z and Mirkin C A 2002 *Adv. Mater.* 14 1472 (b) Zhang H, Chung S W and Mirkin C A 2003 *Nano Lett.* 3 43
[14] (a) Weinberger D A, Hong S, Mirkin C A, Wessels B W and Higgins T B 2000 *Adv. Mater.* 12 1600 (b) Xia Y, Zhao X M, Kim E and Whitesides G M 1995 *Chem. Mater.* 7 2332
[15] (a) Huang J and Hemminger J C 1993 *J. Am. Chem. Soc.* 115 3342 (b) Huang J, Dahlgren D A and Hemminger J C 1994 *Langmuir* 10 626 (c) Tarlov M J, Burgess Jr. D R F and Gillen G 1993 *J. Am. Chem. Soc.* 115 5305 (d) Gillen G, Bennett J, Tarlov M J and Burgess Jr D R F 1994 *Anal. Chem.* 66 2170 (e) Hutt D A and Leggett G J 1996 *J. Phys. Chem.* 100 6657
[16] Synthesis of 15-nm citrate-stabilized gold nanoparticles, see for example: Storhoff J J, Elghanian R, Mucic R C, Mirkin C A and Letsinger R L 1998 *J. Am. Chem. Soc.* 120 1959
[17] Synthesis of 15-nm magnesium oleate-capped gold nanoparticles, see: (a) He H X, Zhang H, Li Q G, Zhu T, Li S F Y and Liu Z F 2000 *Langmuir* 16 3846 (b) Hirai H and Aizawa H 1993 *J Colloid Interface Sci.* 161 471
[18] Noy A, Vezenov D V, Rozsnyai L F and Lieber C M 1997 *J. Am. Chem. Soc.* 119 2006
[19] Lee K B, Park S J, Mirkin C A, Smith J C and Mrksich M 2002 *Science* 295 1702
[20] (a) Wadu-Mesthrige K, Amro N A, Garno J C, Xu, S and Liu G Y 2001 *Biophys. J.* 80 1891(b) Wadu-Mesthrige K, Amro N A and Liu G Y 2000 *Scanning* 22 380

Part VI.

Additional embodiments of the invention are described herein of particular interest for the high resolution aspects of the present invention involving small feature sizes and small interfeature sizes. The present invention also provides Dip-Pen Nanolithography-based methodology for preparing arrays of nanostructures functionalized with biomolecules and nucleic acid types of materials including oligonucleotides. Nucleic acid materials are described for example in U.S. patent application Ser. No. 10/307,515 filed Dec. 2, 2002 to Mirkin et al.

Arrays of nanostructures composed of metals functionalized with organic and biological molecules are being used extensively in the development of new biodiagnostic methods,[1] as the components of novel nanoelectronic and optical devices,[2] and as platforms to understand important fundamental phenomena such as plasmon optical coupling[3] and surface-enhancement in Raman spectroscopy.[4] Herein, it is shown how one can use the high-resolution lithographic technique, Dip-Pen Nanolithography (DPN) printing,[5] combined with wet etching techniques to generate arrays of gold nanostructures functionalized with oligonucleotides. The process provides control over feature size, shape, interfeature distance, and the type of biomolecules immobilized on the nanofeatures.

WORKING EXAMPLE

To generate the desired Au nanostructure arrays, an oxidized silicon wafer (about 500 nm of oxide) was coated with a Ti adhesion layer (3-4 nm) via thermal evaporation, which was subsequently coated with about 9 nm of Au.[6] DPN was then used to pattern these substrates with 16-mercaptohexadecanoic acid (MHA) via literature procedures,[5] FIG. 26A. DPN experiments were carried out with a Park Scientific CP AFM (Thermomicroscopes, Sunnyvale, Calif.) under ambient conditions (set point=0.5 nN, 22-24° C., 30-36% relative humidity) with a MHA-coated tip. The $Si_3N_4$ tip (spring constant=0.05 N/m, Thermomicroscopes, Sunnyvale, Calif.) was coated by immersing it in a 5 mM MHA acetonitrile solution for about 15 s and then drying it with compressed difluoroethane. Each DPN dot feature was generated by holding a MHA-coated tip in contact with an Au surface for 0.25 s, and each line was generated by moving a MHA-coated tip on an Au surface at a rate of 1 µm/s.

Figure 23:
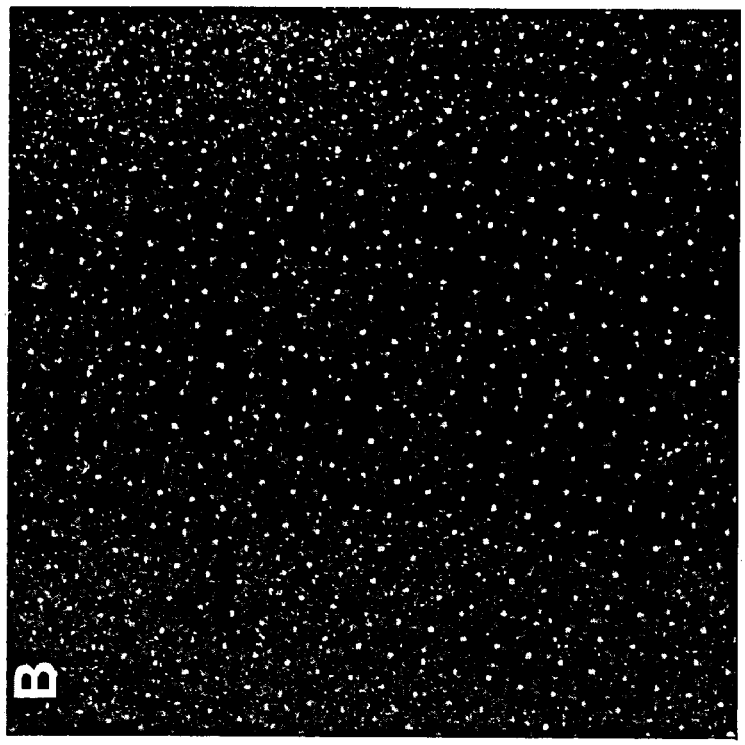
FIG. 23. Etched Si/SiO$_x$/Ti/Au/MHA nanostructures, lines (A) and dots (B), after DPN of MHA on an Au surface.
Figure 23:
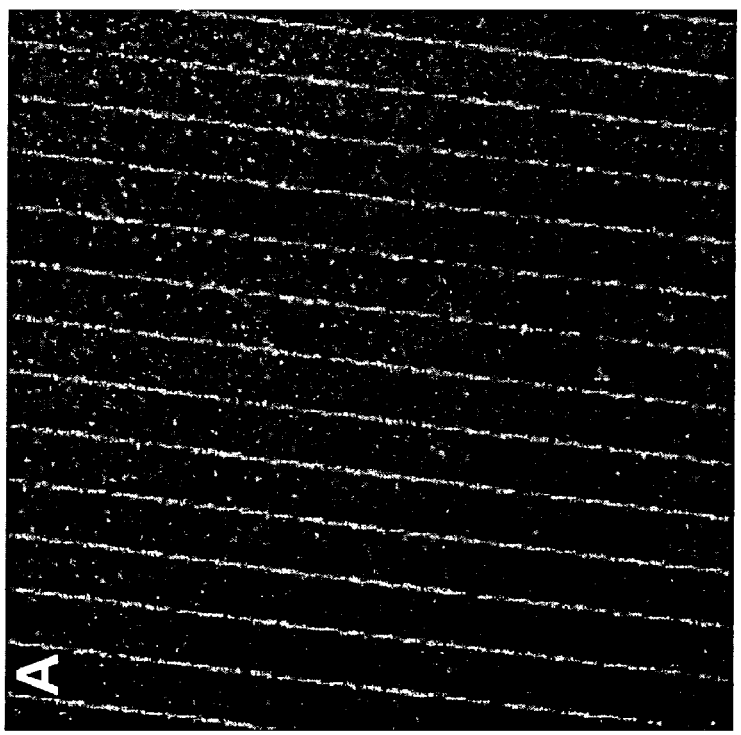
Figure 26:
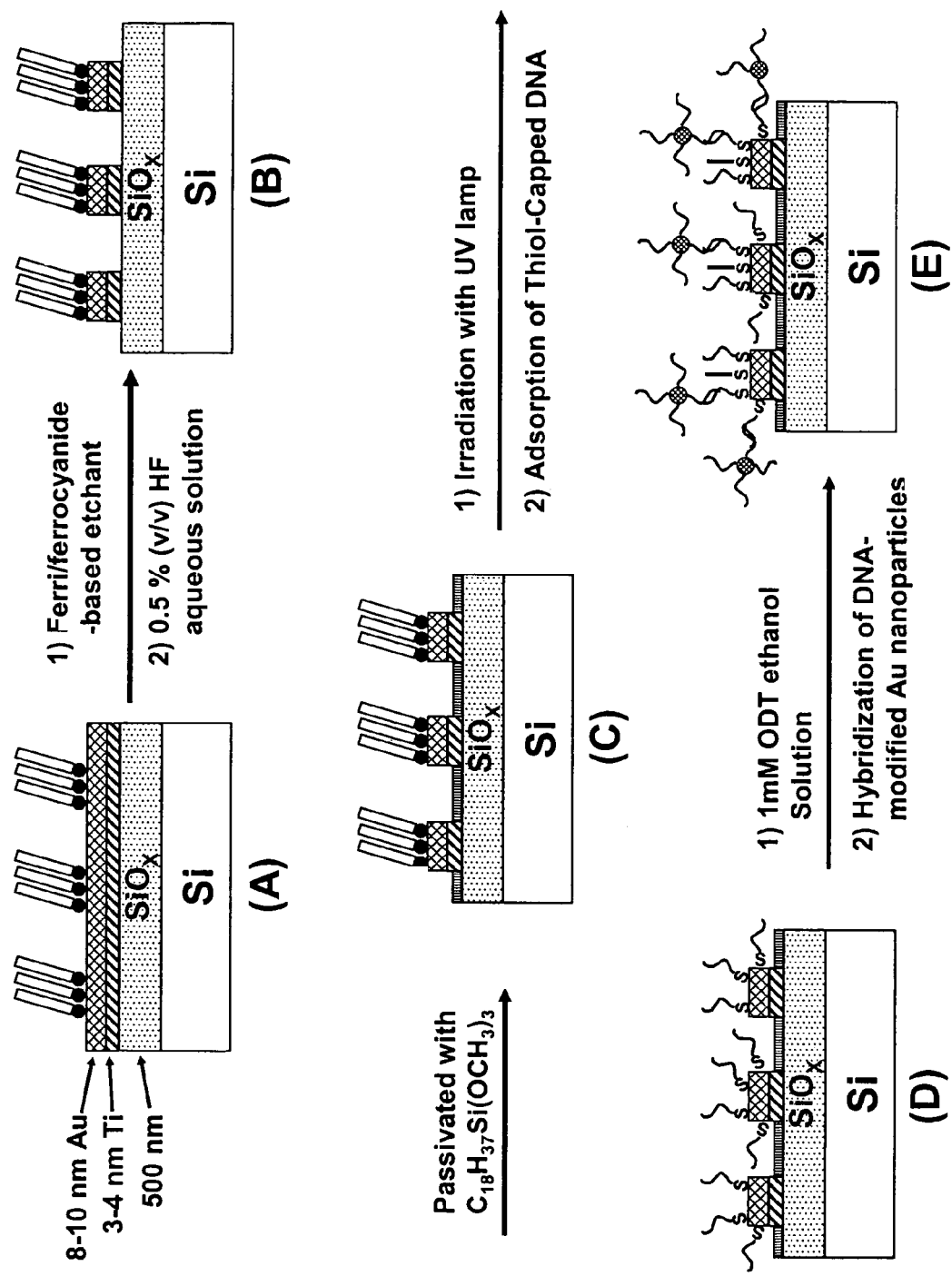
FIG. 26. Overview of Reaction Scheme, steps A-E.

The Au substrates, patterned with MHA, were treated with a ferri/ferrocyanide etchant (a 1:1:1:1 (v:v:v:v) aqueous mixture of 0.1 M $Na_2S_2O_3$, 1.0 M KOH, 0.01 M $K_3Fe(CN)_6$ and 0.001 M $K_4Fe(CN)_6$) for about 20 min under constant stirring, and then with 0.5% (v/v) aqueous HF for 15-30 s to remove the Au and Ti layers from exposed regions of the Au surface,[6] FIG. 26B. After rinsing with Milli-Q $H_2O$ and drying with $N_2$, the exposed $SiO_x$ layer on the etched substrate was passivated by immersing the substrate into 0.5-2% (w/w) n-octadecyltrimethoxysilane (OTS) toluene solution for 1.5 h to form an OTS modified surface.[7] This modification procedure is used to decrease the nonspecific adsorption of oligonucleotide-modified Au nanoparticles (vide infra), FIG. 26C. After rinsing with toluene and drying with $N_2$, the MHA-modified Au nanopatterns of lines and dots were characterized by tapping mode AFM (TMAFM) (Nanoscope IIIa, Digital Instruments, Santa Barbara, Calif.), FIG. 23. The distances between the lines (FIG. 23A) and dots (FIG. 23B) are 2 and 1 µm, respectively. The width of the lines and the diameter of the Au dots are about 71 and 150 nm, respectively. The features within the nanopatterns are remarkably regular in size and shape, showing that the MHA self-assembled monolayer (SAM) effectively prevents the underlying Au substrate from being etched under the stated conditions. Similar results were also obtained with 1-octadecanethiol (ODT), the more commonly used etching resist.[6]

Since the nanostructures are coated with MHA, it is difficult to do further gold thiol coordination chemistry on the individual Au features that make up the array. However, by irradiating the array with a UV lamp (21.7 mW/cm², B-100AP, Fisher Scientific, Pittsburgh, Pa.) for about 10 h with subsequent rinsing with Milli-Q $H_2O$, the oxidized monolayer of MHA can be removed to generate Au nanostructures that can be easily modified with other thiol-containing molecules. The photooxidation of alkanethiol SAMs on Au has been reported for macroscale architectures.[8] The freshly prepared Au nanopatterns were then functionalized with oligonucleotides by immersing them into a 1.0 µM solution of a disulfide-functionalized oligonucleotide in 1.0 M $NaH_2PO_4$ for about 10 h[9] The DNA-modified Au patterns (FIG. 26D) were then immersed in a 1.0 mM ODT ethanol solution for 20 s to remove nonspecifically bound DNA and to increase DNA hybridization efficiency.[9] ODT is known to decrease the nonspecific adsorption of DNA-modified Au nanoparticles.[10]

Figure 24:
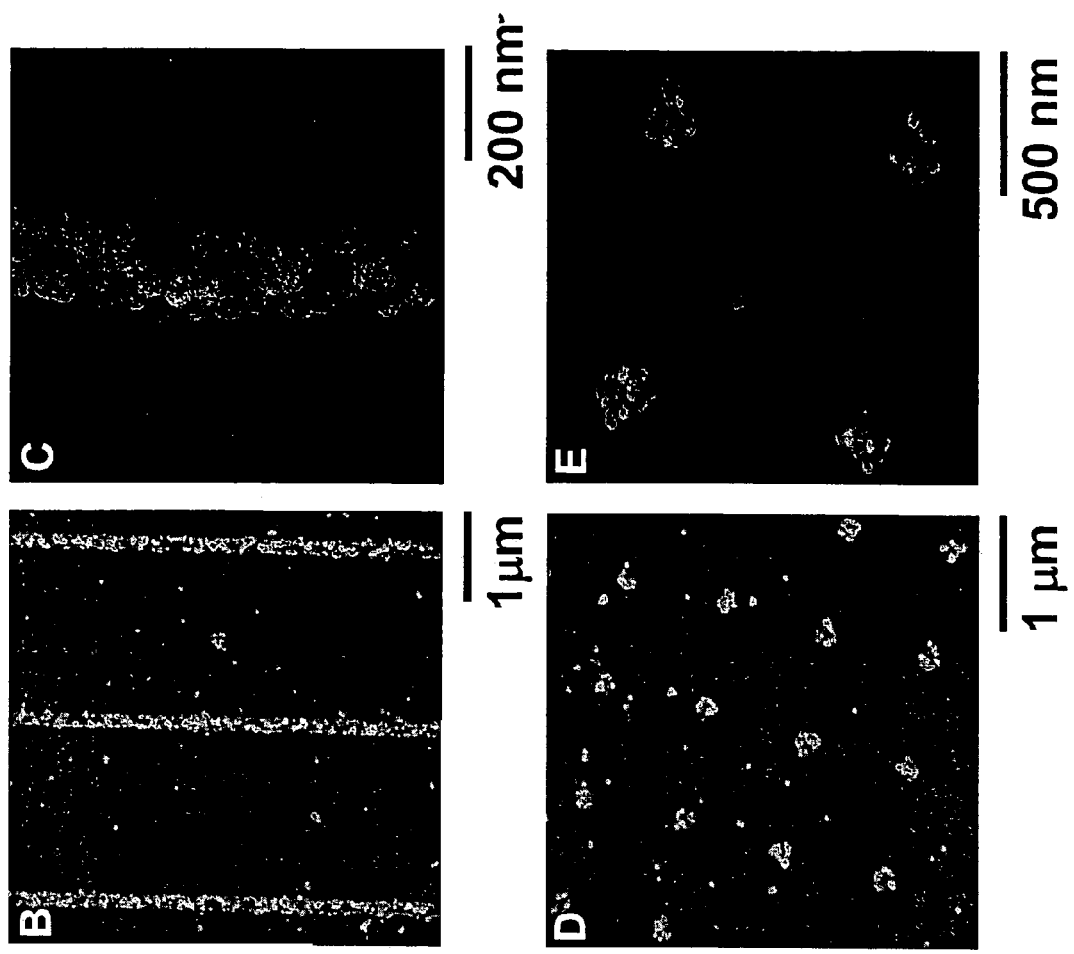
FIG. 24. (A) Illustration of three-strand DNA hybridization scheme (SEQ ID NOS 1-3, respectively in order of appearance). (B) TMAFM image of line features after hybridization with DNA (b)-modified nanoparticles. (C) High-resolution image of one of the lines in B. (D) TMAFM image of dot features after hybridization with DNA (b)-modified nanoparticles. (E) High-resolution image of 4 dots of the features in D.
Figure 24:
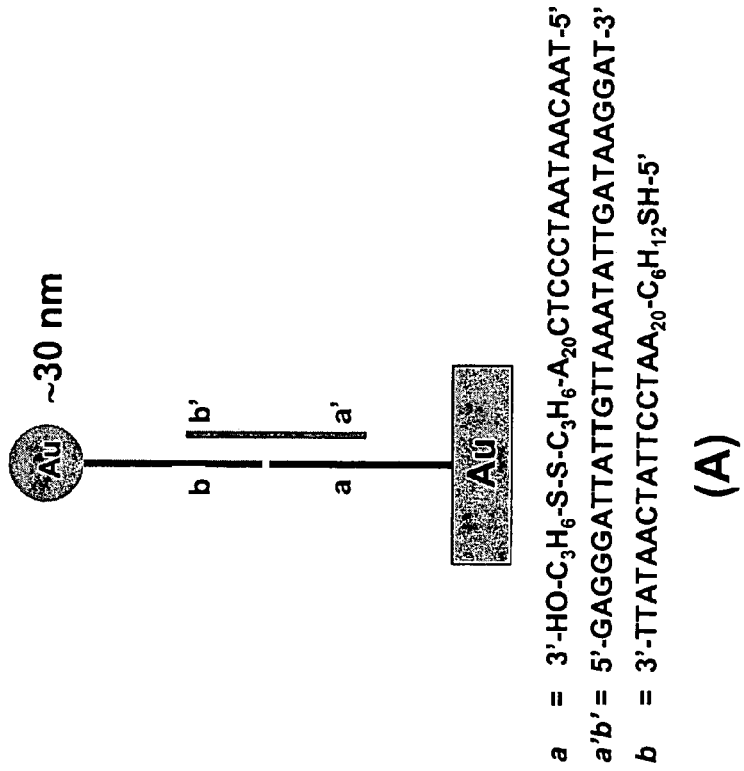

Two kinds of alkanethiol-modified DNA, a and b',[11] were used to functionalize the Au nanopatterns. In order to demonstrate that the oligonucleotides were, in fact, adsorbed onto the Au patterns and not on the other areas of the array, their hybridization properties were studied with about 30 nm Au particles functionalized with a complementary strand of DNA (b)[11] through different strategies, FIG. 26E. In the first example, the arrays modified with DNA (a) were first treated with a linker strand (DNA (a'b'),[11] 0.3 µM, in a PBS buffer (0.3 M NaCl, 0.01 M phosphate, pH=7)) for 2.5 h,[10] which had part of its sequence complementary to the DNA (a) on the Au nanopatterns and the other portion complementary to the DNA (b) modified-Au particles, FIG. 24A. After rinsing with PBS buffer, the substrates were immersed in a 0.25 nM solution of DNA (b)-modified Au nanoparticles in a PBS buffer for 4 h. Then the substrates were rinsed with PBS buffer and 0.3 M aqueous ammonium acetate solution (pH=7) to remove nonspecifically bound particles.[10] TMAFM images of the arrays show that the particles hybridize to the oligonucleotide-functionalized Au nanofeatures but not the areas surrounding these features, FIGS. 24B-E. Very little nonspecific binding of the particles on the OTS SAM is observed. A control experiment was done without the linker DNA (a'b'). In this a case, DNA (b)-modified Au nanoparticles did not adsorb onto the DNA (a)-modified Au nanopatterns (data not shown here). High-resolution images of the dots and lines clearly show the individual particles on the nanofeatures, FIGS. 24C and 2E. The measured height of the nanoparticles is ~30 nm, which is in excellent agreement with the diameter of the Au nanoparticles used.

Figure 25:
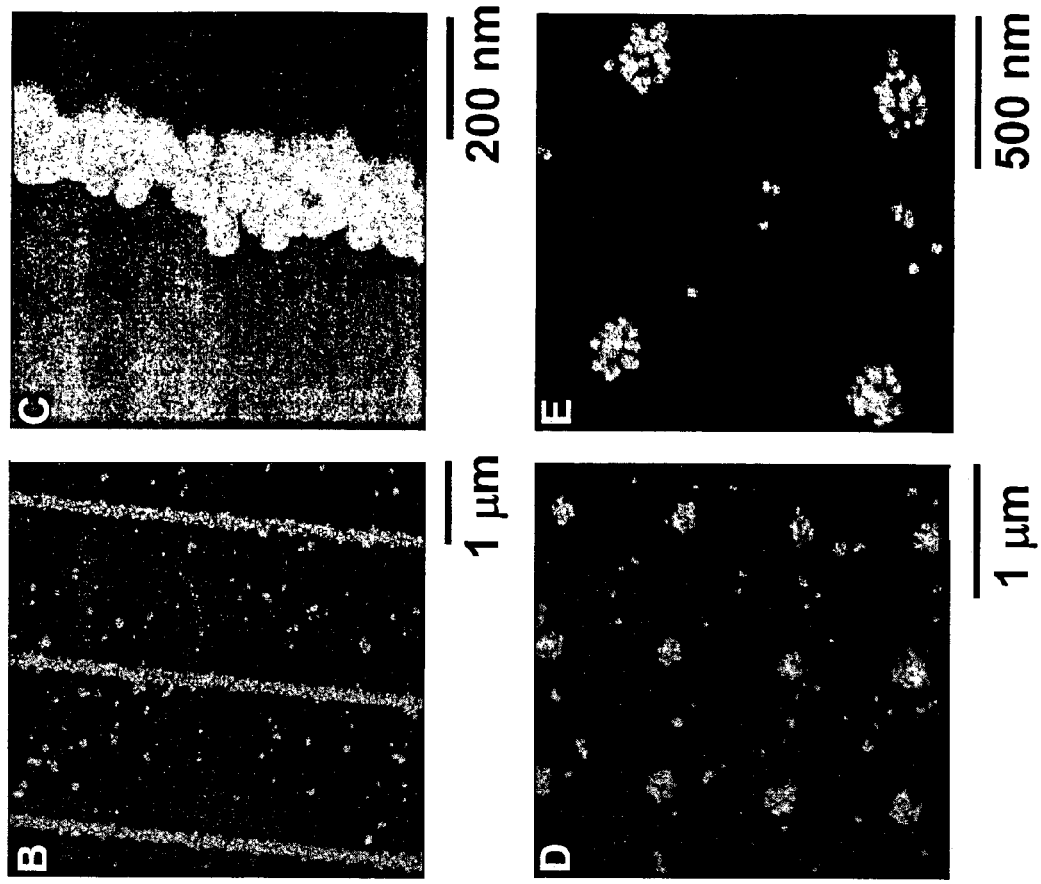
FIG. 25. (A) Illustration of two-strand DNA hybridization scheme (SEQ ID NOS 4 and 3, respectively in order of appearance). (B) TMAFM image of line features after hybridization with DNA (b)-modified nanoparticles. (C) High-resolution image of one of the lines in B. (D) TMAFM image of dot features after hybridization with DNA (b)-modified nanoparticles. (E) High-resolution image of 4 dots of the features in D.

Oligonucleotide-functionalized Au nanoparticles also could be directly hybridized to the nanofeatures via a two-strand system, FIG. 25A. In a typical experiment, the substrates with the Au nanopatterns functionalized with DNA (b') were immersed in a 0.25 nM solution of 30 nm Au particles modified with DNA (b) in a PBS buffer solution for 4 h.[10] The substrate was rinsed with PBS buffer and then 0.3 M ammonium acetate aqueous solution (pH=7) to remove nonspecifically bound particles.[10] Again, TMAFM images show that the particles cleanly hybridize with the raised Au nanopatterns (height of nanoparticles=30 nm), FIG. 25B-E.

This invention demonstrates how one can use DPN printing to fabricate functionalized arrays of inorganic nanopatterns. Importantly, through the photooxidation of the SAM resists, chemically active nanostructures can be generated. These structures can be modified with alkanethiol-capped oligonucleotides which retain their hybridization properties on the surfaces of the nanopatterns and react with complementary DNA or particles modified with complementary DNA. This type of procedure can be used for generating hybrid soft/hard structures composed of metal nanofeatures interfaced with adsorbates that exhibit a high chemical affinity for them. Such structures can be also used as stamping plates.

LIST OF REFERENCES AND NOTES (D)

[1] a) R. Elghanian, J. J. Storhoff, R. C. Mucic, R. L. Letsinger, C. A. Mirkin, *Science* 1997, 277, 1078. b) T. A. Taton, C. A. Mirkin, R. L. Letsinger, Science 2000, 289, 1757.

[2] a) D. B. Janes, T. Lee, J. Liu, M. Batistuta, N. P. Chen, B. L. Walsh, R. P. Andres, E. H. Chen, M. R. Melloch, J. M. Woodall, R. Reifenberger, *J. Electron. Mater.* 2000, 29, 565. b) E. Braun, Y. Eichen, U. Sivan, G. Ben-Yoseph, *Nature* 1998, 391, 775.

[3] a) J. R. Krenn, A. Dereux, J. C. Weeber, E. Bourillot, Y. Lacroute, J. P. Goudonnet, G. Schider, W. Gotschy, A. Leitner, F. R. Aussenegg, C. Girard, *Phys. Rev. Lett.* 1999, 82, 2590. b) M. D. Malinsky, K. L. Kelly, G. C. Schatz, R. P. Van Duyne, *J. Am. Chem. Soc.* 2001, 123, 1471.

[4] a) N. Felidj, J. Aubard, G. Levi, J. R. Krenn, M. Salerno, G. Schider, B. Lamprecht, A. Leitner, F. R. Aussenegg, *Phys. Rev. B,* 2002, 65, 075419. b) L. A. Gearheart, H. J. Ploehn, C. J. Murphy, *J. Phys. Chem. B* 2001, 105, 12609.

[5] (a) R. D. Piner, J. Zhu, F. Xu, S. Hong, C. A. Mirkin, *Science* 1999, 283, 661. (b) S. Hong, J. Zhu, C. A. Mirkin, *Science* 1999, 286, 523.

[6] D. A. Weinberger, S. Hong, C. A. Mirkin, B. W. Wessels, T. B. Higgins, *Adv. Mater.* 2000, 12, 1600.

[7] D. V. Vezenov, A. Noy, L. F. Rozsnyai, C. M. Lieber, *J. Am. Chem. Soc.* 1997, 119, 2006.

[8] a) J. Huang, J. C. Hemminger, *J. Am. Chem. Soc.* 1993, 115, 3342. b) J. Huang, D. A. Dahlgren, J. C. Hemminger, *Langmuir* 1994, 10, 626. c) M. J. Tarlov, D. R. F. Burgess, Jr., G. Gillen, *J. Am. Chem. Soc.* 1993, 115, 5305. d) G. Gillen, J. Bennett, M. J. Tarlov, D. R. F. Burgess, Jr., *Anal. Chem.* 1994, 66, 2170. e) D. A. Hutt, G. J. Leggett, *J. Phys. Chem.* 1996, 100, 6657.

[9] T. M. Herne, M. J. Tarlov, *J. Am. Chem. Soc.* 1997, 119, 8916, and references therein.

[10] L. M. Demers, S. J. Park, T. A. Taton, Z. Li, C. A. Mirkin, *Angew. Chem., Int. Ed.* 2001, 40, 3071.

[11] DNA (a) sequence: 3'—HO—$C_3H_6$—S—S—$C_3H_6$-$A_{20}$-CTC-CCT-AAT-AAC-AAT-5' (SEQ ID NO: 1); DNA (b') sequence: 5'-HO—$C_6H_{12}$—S—S—$C_6H_{12}$—O—P(O)(OH)—(O—$C_2H_4$)$_6$—OP(O) (OH)—O-AAT-ATT-GAT-AAG-GAT-3' (SEQ ID NO: 4); DNA (b) sequence: 3'-TTA-TAA-CTA-TTC-CTA-$A_{20}$-$C_6H_{12}$SH-5' (SEQ ID NO: 3); DNA (a'b') sequence: 5'-GAG-GGA-TTA-TTG-TTA-AAT-ATT-GAT-AAG-GAT-3' (SEQ ID NO: 2).

What is claimed is:

1. A method of nanolithography comprising:
   providing a substrate and a nanoscopic or SPM tip;
   using the tip to apply a patterning compound from said tip to the substrate so as to produce a desired pattern which is a chemical etching resist; and
   chemically etching the substrate.

2. The method according to claim 1, wherein the substrate comprises a metal surface.

3. The method according to claim 1, wherein the substrate comprises a semiconductor.

4. The method according to claim 1, wherein the tip is a scanning probe microscope tip.

5. The method according to claim 1, wherein the tip is an atomic force microscope tip.

6. The method according to claim 1, wherein the tip is a hollow tip.

7. The method according to claim 1, wherein the tip is a non-hollow tip.

8. The method according to claim 1, wherein the patterning compound is supplied to the tip in a continuous manner.

9. The method according to claim 1, wherein the patterning compound is supplied to the tip in a non-continuous manner.

10. The method according to claim 1, wherein the patterning compound can chemisorb or covalently bond to the substrate.

11. The method according to claim 1, wherein the patterning compound is a sulfur-containing compound.

12. The method according to claim 1, wherein the desired pattern comprises a self assembled monolayer.

13. The method according to claim 1, wherein the desired pattern is an array.

14. The method according to claim 1, wherein the desired pattern comprises dots or lines.

15. The method according to claim 1, wherein the pattern after etching comprises a nanogap.

16. The method according to claim 1, wherein the pattern after etching comprises electrodes with a nanogap.

17. The method according to claim 1, wherein the pattern after etching is characterized by features of about 50 nm or less.

18. The method according to claim 1, wherein the pattern after etching is characterized by interfeature gaps of about 100 nm or less.

19. The method according to claim 1, wherein the substrate comprises a metal surface, wherein the tip is a scanning probe microscope tip, and the desired pattern comprises a self-assembled monolayer.

20. The method according to claim 1, wherein the substrate comprises a semiconductor, wherein the tip is an atomic force microscope tip, wherein the etching step is a wet chemical etching step, and wherein the patterning compound can chemisorb or covalently bond to the substrate.

21. A method of nanolithography comprising:
providing a substrate and a nanoscopic or SPM tip;
using the tip to apply a patterning compound to from said tip the substrate so as to produce a desired pattern which is a chemical etching resist; and
chemically etching the substrate,
wherein the pattern after etching is characterized by features of about 50 nm or less.

22. The method according to claim 21, wherein the substrate comprises a metal surface.

23. The method according to claim 21, wherein the substrate comprises a metal surface and silicon.

24. The method according to claim 21, wherein the tip is a scanning probe microscope tip.

25. The method according to claim 21, wherein the tip is an atomic force microscope tip.

26. The method according to claim 21, wherein the tip is a non-hollow tip.

27. The method according to claim 21, wherein after chemically etching the substrate, the etching resist is removed photochemically.

28. The method according to claim 21, wherein the patterning compound is supplied to the tip in a continuous manner.

29. The method according to claim 21, wherein the patterning compound is supplied to the tip in a non-continuous manner.

30. The method according to claim 21, wherein the patterning compound can chemisorb or covalently bond to the substrate.

31. The method according to claim 21, wherein the patterning compound is a sulfur-containing compound.

32. The method according to claim 21, wherein the desired pattern is a monolayer.

33. The method according to claim 21, wherein the desired pattern is an array.

34. The method according to claim 21, wherein the desired pattern comprises dots, lines, circles, or triangles, or combinations thereof.

35. The method according to claim 21, wherein the pattern after etching compnses a nanogap.

36. The method according to claim 21, further providing the step of providing the pattern with biomolecules or nanoparticles disposed on the pattern.

37. The method according to claim 21, wherein the pattern after etching is characterized by features of about 25 nm to about 50 nm.

38. The method according to claim 21, wherein the pattern after etching is characterized by interfeature gaps of about 100 nm or less.

39. The method according to claim 21, wherein the etching step is a wet chemical etching step, wherein the tip is a scanning probe microscope tip, and the desired pattern comprises a self-assembled monolayer.

40. The method according to claim 21, wherein the substrate comprises a metal surface, wherein the tip is an atomic force microscope tip, and wherein the patterning compound can chemisorb or covalently bond to the substrate.

41. A method of nanolithography comprising:
providing a substrate and a nanoscopic or SPM tip;
using the tip to apply a patterning compound from said tip to the substrate so as to produce a desired pattern which is a chemical etching resist; and
chemically etching the substrate,
wherein the pattern after etching is characterized by interfeature gaps of about 100 nm or less.

42. The method according to claim 41, wherein the substrate comprises a metal surface.

43. The method according to claim 41, wherein the substrate comprises a metal surface and a semiconductor.

44. The method according to claim 41, wherein the tip is a scanning probe microscope tip.

45. The method according to claim 41, wherein the tip is an atomic force microscope tip.

46. The method according to claim 41, wherein a plurality of tips is used to apply a plurality of patterning compounds.

47. The method according to claim 41, wherein the tip is a non-hollow tip.

48. The method according to claim 41, wherein the patterning compound is supplied to the tip in a continuous manner.

49. The method according to claim 41, wherein the patterning compound is supplied to the tip in a non-continuous manner.

50. The method according to claim 41, wherein the patterning compound can chemisorb to the substrate.

51. The method according to claim 41, wherein after chemically etching the substrate, the etching resist is removed photochemically.

52. The method according to claim 41, wherein the desired pattern compnses a self assembled monolayer.

53. The method according to claim 41, wherein the desired pattern is an array comprising metal features, semiconductor features, or combinations thereof.

54. The method according to claim 41, wherein the desired pattern comprises dots, lines, circles, triangles, or combinations thereof.

55. The method according to claim 41, wherein the pattern after etching comprises a nanogap between lines.

56. The method according to claim 41, wherein the pattern after etching comprises a nanogap of about 20 nm or less.

57. The method according to claim 41, wherein the pattern after etching is characterized by features of about 50 nm or less.

58. The method according to claim 41, wherein the pattern after etching is characterized by interfeature gaps of about 12 nm to about 100 nm.

59. The method according to claim 41, wherein the substrate comprises a semiconductor, wherein the tip is a scanning probe microscope tip, and the desired pattern comprises a self-assembled monolayer.

60. The method according to claim 41, wherein the substrate comprises a metal surface, wherein the tip is an atomic force microscope tip, and wherein the patterning compound can chemisorb or covalently bond to the substrate.

61. A method for direct write nanolithography consisting essentially of:
providing a substrate and a plurality of computer controlled scanning probe microscope tips;
using the tips under computer control to apply a patterning compound from said tips to the substrate so as to produce a desired pattern, wherein the patterning compound is a chemical etching resist,
chemically etching the substrate, etching away substrate not patterned by the resist,
wherein the pattern after etching is characterized by interfeature gaps of about 100 nm or less, or by features of about 50 nm or less.

62. The method according to claim 61, wherein the pattern after etching is characterized by interfeature gaps of about 100 nm or less and by features of about 50 nm or less.

63. The method according to claim 61, wherein the scanning probe microscopic tip is an atomic force microscopic tip.

64. The method according to claim 61, wherein the patterning compound is chemisorbed to or covalently bonded to the substrate after application.

65. The method according to claim 61, wherein the desired pattern comprises a self-assembled monolayer.

66. The method according to claim 61, wherein the pattern after etching is characterized by interfeature gaps of about 100 nm or less and by features of about 50 nm or less, the scanning probe microscopic tip is an atomic force microscopic tip, the patterning compound is chemisorbed to or covalently bonded to the substrate after application, and the desired pattern comprises a self-assembled monolayer.

* * * * *